(12) United States Patent
Zeng et al.

(10) Patent No.: US 9,401,356 B2
(45) Date of Patent: Jul. 26, 2016

(54) POWER CIRCUIT, CONTROL METHOD, POWER SYSTEM, AND PACKAGE STRUCTURE OF POWER CIRCUIT

(71) Applicant: Delta Electronics (Shanghai) Co., Ltd., Shanghai (CN)

(72) Inventors: Jian-Hong Zeng, Shanghai (CN); Fang Luo, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 91 days.

(21) Appl. No.: 14/571,305

(22) Filed: Dec. 16, 2014

(65) Prior Publication Data

US 2015/0171750 A1 Jun. 18, 2015

(30) Foreign Application Priority Data

Dec. 16, 2013 (CN) .......................... 2013 1 0694494

(51) Int. Cl.
*H02M 3/158* (2006.01)
*H01L 27/06* (2006.01)
*H02M 1/08* (2006.01)
*H02M 1/36* (2007.01)
*H03K 17/10* (2006.01)
(Continued)

(52) U.S. Cl.
CPC .......... *H01L 27/0605* (2013.01); *H01L 27/085* (2013.01); *H02M 1/08* (2013.01); *H02M 1/36* (2013.01); *H03K 17/107* (2013.01); *H03K 17/567* (2013.01); *H03K 17/74* (2013.01); *H01L 29/808* (2013.01); *H02M 3/156* (2013.01); *H02M 3/1588* (2013.01); *H02M 7/5387* (2013.01); *H02M 2001/0058* (2013.01); *H03K 2017/6875* (2013.01); *Y02B 70/1466* (2013.01); *Y02B 70/1491* (2013.01)

(58) Field of Classification Search
CPC ....... H02M 3/10; H02M 3/135; H02M 3/145; H02M 3/155; H02M 3/158; H02M 3/156; H02M 3/157; G05F 1/462; G05F 1/56; G05F 1/59; G05F 1/595
USPC .......... 323/265, 268, 270, 271, 282, 283, 351
See application file for complete search history.

(56) References Cited

U.S. PATENT DOCUMENTS 6,462,520 B1 * 10/2002 Mangtani ............... H02M 3/158
323/271
7,944,721 B2 * 5/2011 Yang ................... H02M 3/1584
323/271

(Continued)

*Primary Examiner* — Adolf Berhane
(74) *Attorney, Agent, or Firm* — CKC & Partners Co., Ltd.

(57) ABSTRACT

A power circuit, control method, power system, and package structure of power circuit are disclosed. The power circuit includes a quasi-cascade power unit. The quasi-cascade power unit includes a normally-on switch, normally-off switch, control unit, first switch unit and second switch unit. The normally-off switch is electrically connected to the normally-on switch in series. The first end and the third end of the control unit are electrically connected to the control end of the normally-off switch and the control end of the normally-on switch, respectively. The first end and the second end of the first switch unit are electrically connected to the control end of the normally-on switch and the second end of the normally-off switch, respectively. The first end and the control end of the second switch unit are electrically connected to the second end of the control unit and the second end of the normally-on switch, respectively.

59 Claims, 48 Drawing Sheets

(51) Int. Cl.
*H03K 17/567* (2006.01)
*H03K 17/74* (2006.01)
*H01L 27/085* (2006.01)
*H02M 3/156* (2006.01)
*H02M 7/5387* (2007.01)
*H02M 1/00* (2006.01)
*H03K 17/687* (2006.01)
*H01L 29/808* (2006.01)

(56) References Cited

U.S. PATENT DOCUMENTS

| | | | |
|---|---|---|---|
| 9,112,428 B2* | 8/2015 | Bailey | H02M 7/538 |
| 2007/0216469 A1* | 9/2007 | Sakamoto | H03K 17/063 |
| | | | 327/519 |
| 2015/0326212 A1* | 11/2015 | Boisseau | H02M 1/36 |
| | | | 363/37 |
| 2016/0062428 A1* | 3/2016 | Zeng | G06F 1/26 |
| | | | 713/300 |

\* cited by examiner

POWER CIRCUIT, CONTROL METHOD, POWER SYSTEM, AND PACKAGE STRUCTURE OF POWER CIRCUIT

This application claims priority to China Application Serial Number 201310694494.3, filed Dec. 16, 2013, which is herein incorporated by reference.

BACKGROUND

1. Technical Field

The present disclosure relates to a power circuit, a control method, a power system, and a package structure of a power circuit. More particularly, the present disclosure relates to a power circuit, a power system, and a package structure of a power circuit which have a quasi-cascade structure.

2. Description of Related Art

High efficiency and high power density are always the industry's requirements for the power conversion devices. High efficiency means the reduction of the power consumption, and it efficiently uses the energy to facilitate the energy saving, carbon reduction, and the environment protection. High power density means small size, light weight, reduced space requirements, and thereby it further reduces the costs.

As one of the important components of the switch-mode power supply, the characteristics of the active power component play a very critical rule to the performance of the power source. With the succeeding progress of the semiconductor industry, and since the properties of the Si materials active power component have been close to the theoretical limit, the power characteristics thereby are elevated to a very high level. The active power components use wide bandgap materials, such as Silicon Carbide (SiC) and Gallium Nitride (GaN), are receiving more attention because an opportunity to have smaller internal impedances, smaller switching losses, and higher operating temperatures which promote the efficiency and power density.

Usually SiC components and GaN components include two types: the normally-on type (that is, when the gate voltage=0, the component is on; when the gate voltage <0, the component is off) and the normally-off type (that is, when the gate voltage=0, the component is off; when the gate voltage >0, the component is on). However, an obvious problem of the normally-on type components is how to resolve the starting problem.

As shown in FIG. 1A, a switch component of a buck circuit 10 is a normally-on switch. For example, when the normally-on switch (e.g., the transistor Q1 and the transistor Q2) is on when the gate voltage=0, and the normally-on switch is off when the gate voltage is negative. Because the gate voltage of the transistor Q1 and that of the transistor Q2 are 0 voltage during an initial state of the circuit (that is, when the circuit is not yet connected to a power source; the input power supply Vin=0), the transistor Q1 and the transistor Q2 are at the on state. When the circuit is powered, that is, when the input power source Vin is not equal to 0 voltage; the transistor Q1 and the transistor Q2 will be damaged.

As shown in FIG. 1B, that is, a normally-off switch (e.g., the transistor Qin) is coupled to an input power source Vin of the buck circuit 11. Before the circuit is powered, a gate voltage of the transistor Qin is 0 voltage, the transistor Qin is at an off state. When the input power source Vin is on, the normally-off switch Qin is responsible for blocking, to thereby ensure the circuit safety. Once a control signal of the normally-on switch starts to function normally, the transistor Qin constantly is turned on, and thus a safe enabling is achieved. However, the imperfection is that, a voltage stress of the transistor Qin is the same as that of the transistor Q1 and that of the transistor Q2, and are all equal to the input power source Vin. In addition, usually the transistor Qin is a Silicon Metal-Oxide-Semiconductor (Si MOS) transistor, and in situations where the voltage level equals to the that of the GaN power components, the loss caused by the on-resistance of the transistor Qin may not be ignored, therefore it is difficult to achieve popular usage.

As shown in FIG. 1C, the buck circuit 12 is with a cascade structure, which is more commonly used in the applications of the GaN components, especially in a state that the voltage is higher, such as 600 volt. A structure constructed by high voltage components and low voltage components connected in series may have better control properties, which is alike to the normally-off Si components.

However, since the GaN components and the Si components both operate under a high frequency, the control loss is the sum of the GaN components and Si components, that is, the control loss is increased. Furthermore, the Si components are added in the form of series connection and work under a high frequency, and thus directly lead to the increase of distributed inductance so that it results in more electromagnetic interferences. Moreover, the GaN components decide the shutdown control according to the shutdown current, hence the larger the shutdown current, the faster the shutdown control; oppositely, the smaller the shutdown current, the slower the shutdown control, therefore making the GaN components is unable to perform at its optimal characteristics. Besides, the GaN components themselves have no reverse recovery, but the diode connecting in series with the Si components has severe reverse recovery, thus it eliminated the advantage of the GaN components and makes the GaN components not suitable for the situation of large reverse recovery.

In summary, it is indeed an important issue in this technical field that how to improve the ability of the GaN components to resolve the problems of the increasing of the control loss, the loop inductance, the reverse recovery, and the restricted characteristics of the GaN components, to therefore promote the power density or the conversion efficiency of the power conversion device.

SUMMARY

According to an exemplary embodiment of the present disclosure, a power circuit is disclosed. The power circuit includes a first quasi-cascade power unit. The first quasi-cascade power unit includes a normally-on switch, a normally-off switch, a control unit, a first switch unit, and a second switch unit. The normally-on switch includes a first end, a second end and a control end. The normally-off switch is coupled to the normally-on switch in series, and includes a first end, a second end and a control end. The control unit includes a first end, a second end, a third end and a fourth end, wherein the first end of the control unit is coupled to the control end of the normally-off switch and the third end of the control unit is coupled to the control end of the normally-on switch. The first switch unit includes a first end and a second end, wherein the first end of the first switch unit is coupled to the control end of the normally-on switch and the second end of the first switch unit is coupled to the second end of the normally-off switch. The second switch unit includes a first end and a control end, wherein the control end of the second switch unit is coupled to the second end of the control unit, and the first end of the second switch unit is coupled to the second end of the normally-on switch.

According to another exemplary embodiment of the present disclosure, a control method is disclosed. The control method is applied to a quasi-cascade power unit, and the quasi-cascade power unit includes a control unit, a normally-on switch and a normally-off switch, wherein the normally-on switch and the normally-off switch are coupled in series and the control unit is coupled to the normally-on switch and the normally-off switch. The control method includes: during a first period, making the normally-off switch turn off and making the normally-on switch turn on; during a second period, making the normally-off switch and the normally-on switch turn off; during a third period, making the normally-off switch turn on and making the normally-on switch work in a high-frequency switching state; during a fourth period, making the normally-off switch and the normally-on switch turn off; and during a fifth period, making the normally-off switch turn off and making the normally-on switch turn on.

According to another exemplary embodiment of the present disclosure, a power system is disclosed. The power system includes a conversion unit and a voltage adjusting unit. The conversion unit includes an input end and an output end, wherein the input end of the conversion unit is coupled to an input power source. The voltage adjusting unit includes an input end and an output end, wherein the input end of the voltage adjusting unit is coupled to the output end of the conversion unit, and the output end of the voltage adjusting unit is coupled to a load. The conversion unit includes a first quasi-cascade power unit. The first quasi-cascade power unit includes a first normally-on switch and a first normally-off switch, wherein the first normally-on switch includes a first end, a second end and a control end and the first normally-off switch is coupled to the normally-on switch in series, and the first normally-off switch includes a first end, a second end and a control end. A control unit includes a first end, a second end, a third end and a fourth end, and the first end, the second end, the third end and the fourth end are for controlling the first normally-on switch and the first normally-off switch. The first end of the control unit is coupled to the control end of the normally-off switch, and the third end of the control unit is coupled to the control end of the normally-on switch.

According to another exemplary embodiment of the present disclosure, a package structure of a power circuit is disclosed. The package structure includes a first normally-off switch, a second normally-off switch and a normally-on switch. The first normally-off switch includes a first end, a second end and a control end, wherein the first end of the normally-off switch forms a first pin. The second normally-off switch includes a first end, a second end and a control end, wherein the second end of the second normally-off switch is electrically connected to the first end of the first normally-off switch, the control end of the second normally-off switch is coupled to the control end of the first normally-off switch to form a second pin, and the first end of the second normally-off switch forms a third pin. The normally-on switch may be integrated with the first normally-off switch and the second normally-off switch, and the normally-on switch includes a first end, a second end and a control end. The control end of the normally-on switch is coupled to the first end of the second normally-off switch, the second end of the normally-on switch is coupled to the second end of the second normally-off switch to form a fourth pin, and the first end of the normally-on switch forms a fifth pin. The first pin, the second pin and the third pin may be respectively for receiving a control signal, and the fourth pin and the fifth pin may be coupled to an external circuit.

According to another exemplary embodiment of the present disclosure, a package structure of a power circuit is disclosed. The package structure includes an integrated circuit chip, a first normally-on switch, a second normally-on switch and a capacitor. The normally-on switch includes a first end, a second end and a control end, wherein the control end of the first normally-on switch forms a first pin. The second normally-on switch includes a first end, a second end and a control end, wherein the first end of the second normally-on switch is coupled to the second end of the first normally-on switch to form a second pin, and the control end of the second normally-on switch forms a third pin. The capacitor includes a first end and a second end, wherein the first end of the capacitor is coupled to the first end of the first normally-on switch to form a fourth pin, and the second end of the capacitor is coupled to the second end of the second normally-on switch to form a fifth pin. The first normally-on switch and the second normally-on switch may be adjacent to each other and may be integrated into the integrated circuit chip. The first pin and third pin are for receiving a first control signal and a second control signal, respectively, and the second pin, the fourth pin and the fifth pin may be coupled to an external circuit.

BRIEF DESCRIPTION OF THE DRAWINGS

The disclosure may be more fully understood by reading the following detailed description of the embodiment, with reference made to the accompanying drawings as follows.

DETAILED DESCRIPTION

Figure 1A:
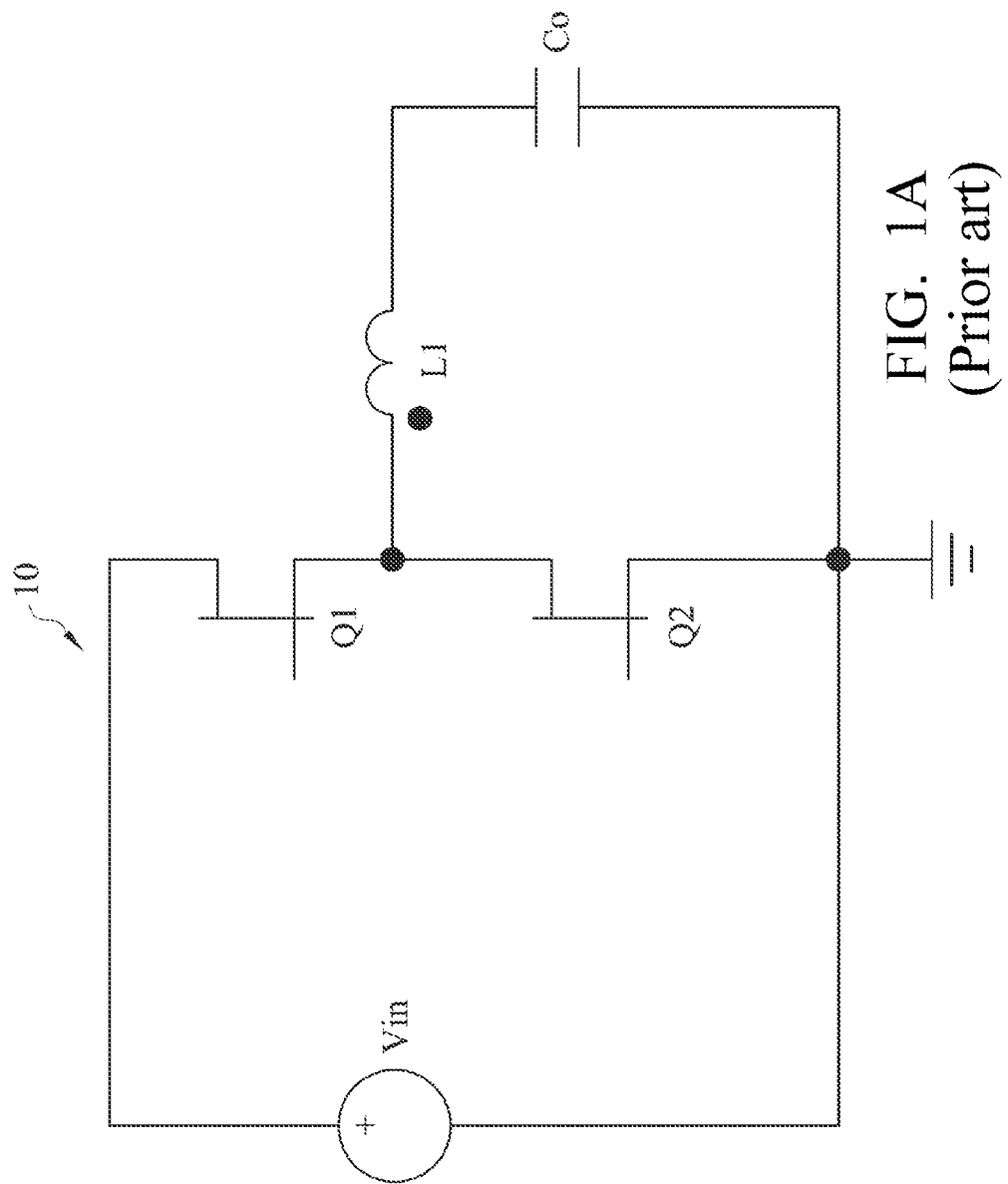
FIG. 1A-FIG. 1C are diagrams illustrating a conventional buck circuit.
Figure 1B:
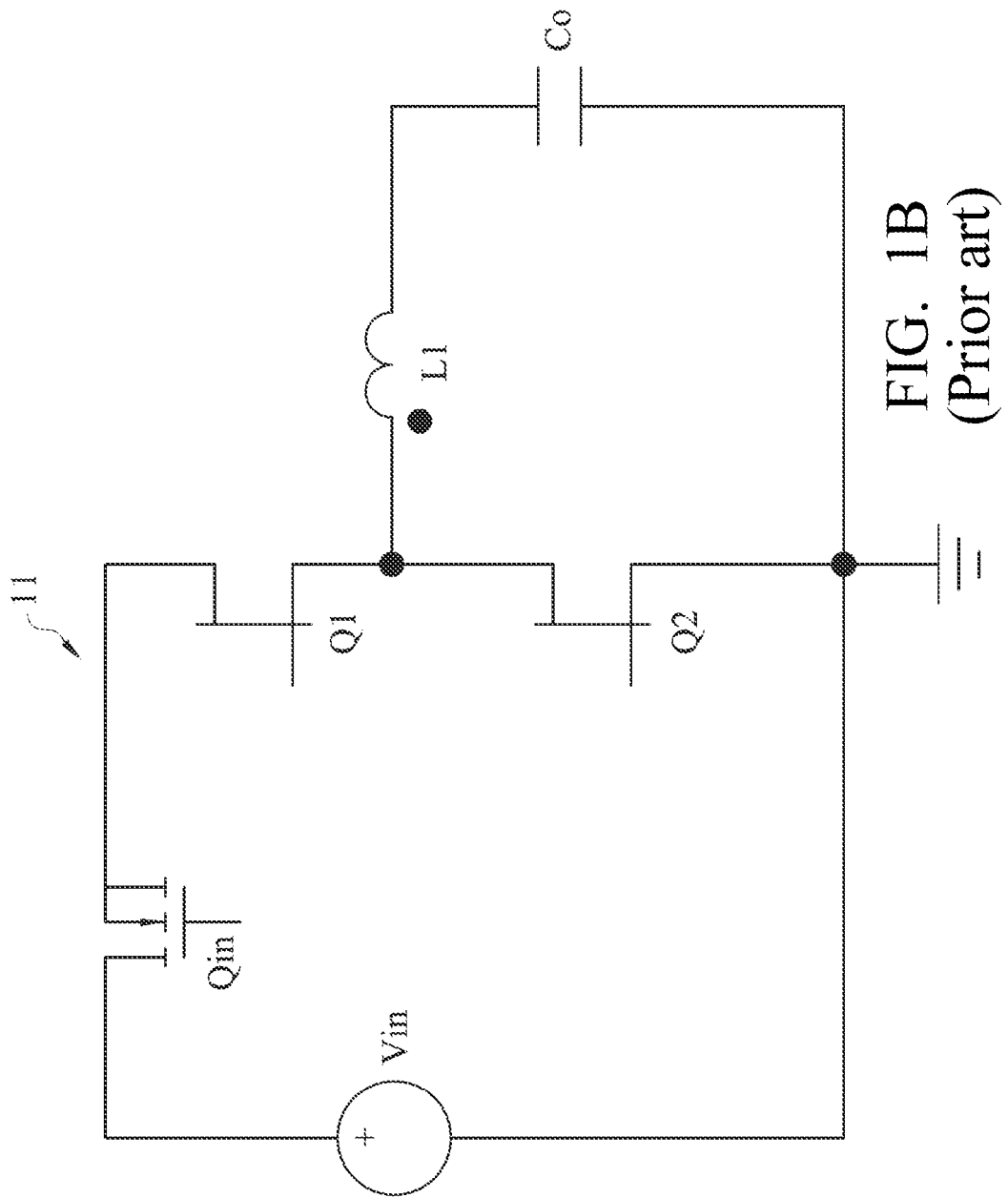
Figure 1C:
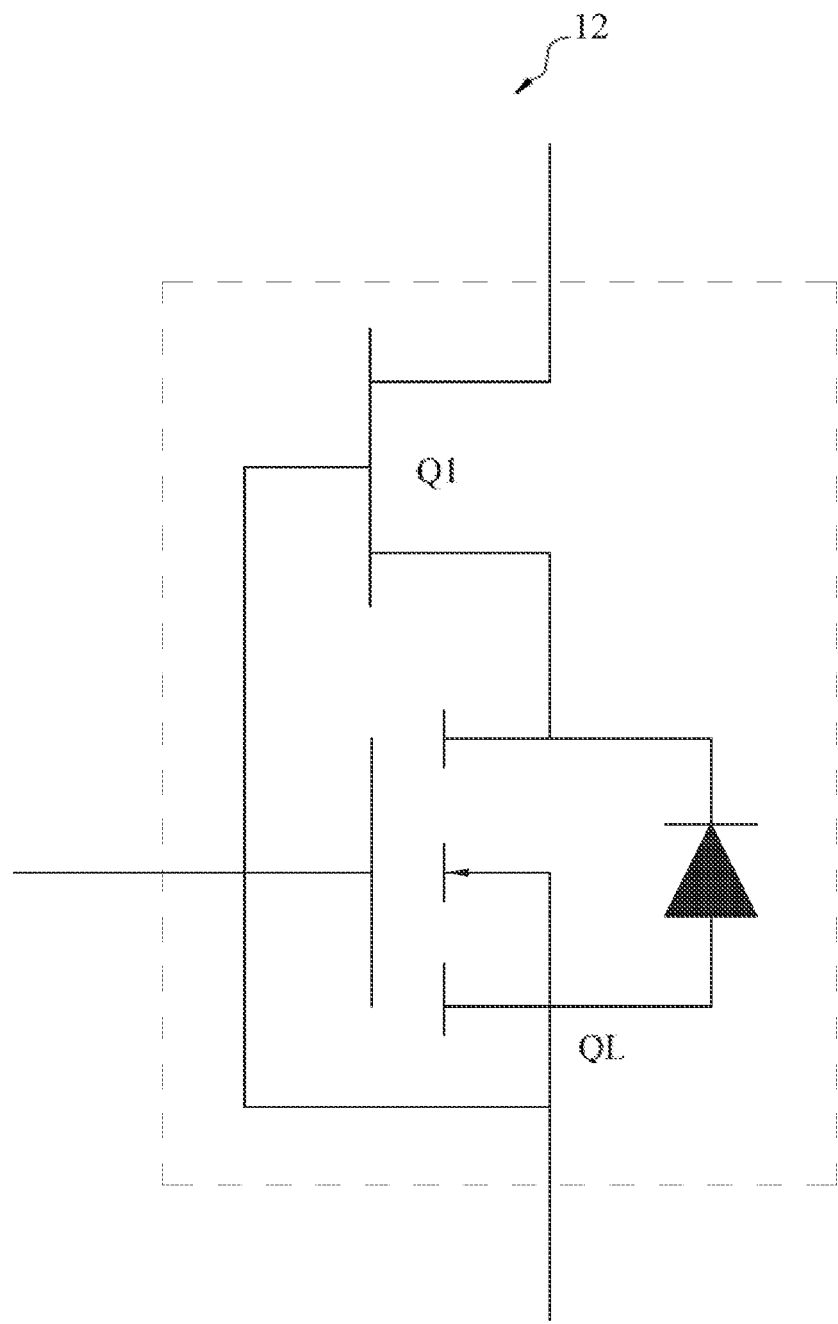

Reference will now be made in detail to the present embodiments of the disclosure, examples of which are illustrated in the accompanying drawings. Wherever possible, the same reference numbers are used in the drawings and the description to refer to the same or like parts.

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections. In the following exemplary embodiments and the accompanying drawings, the components that are not related to the present disclosure have been omitted from the drawings, and are drawn in the size ratio between the elements in the drawings are only use for the understanding, and not meant to limit the actual embodiments of the present disclosure in scale.

The terms "first", "second", . . . etc., in the article do not refer to any specific order, nor intended to limit the present disclosure, it is only used for distinguishing the differences between components or operations with the same technological descriptions.

Features, aspects and advantages of the present disclosure will become better understood with reference to the description and appended claims.

It is to be understood that both the foregoing general description and the following detailed description are by examples, and are intended to provide further explanation of the disclosure as claimed.

Figure 2A:
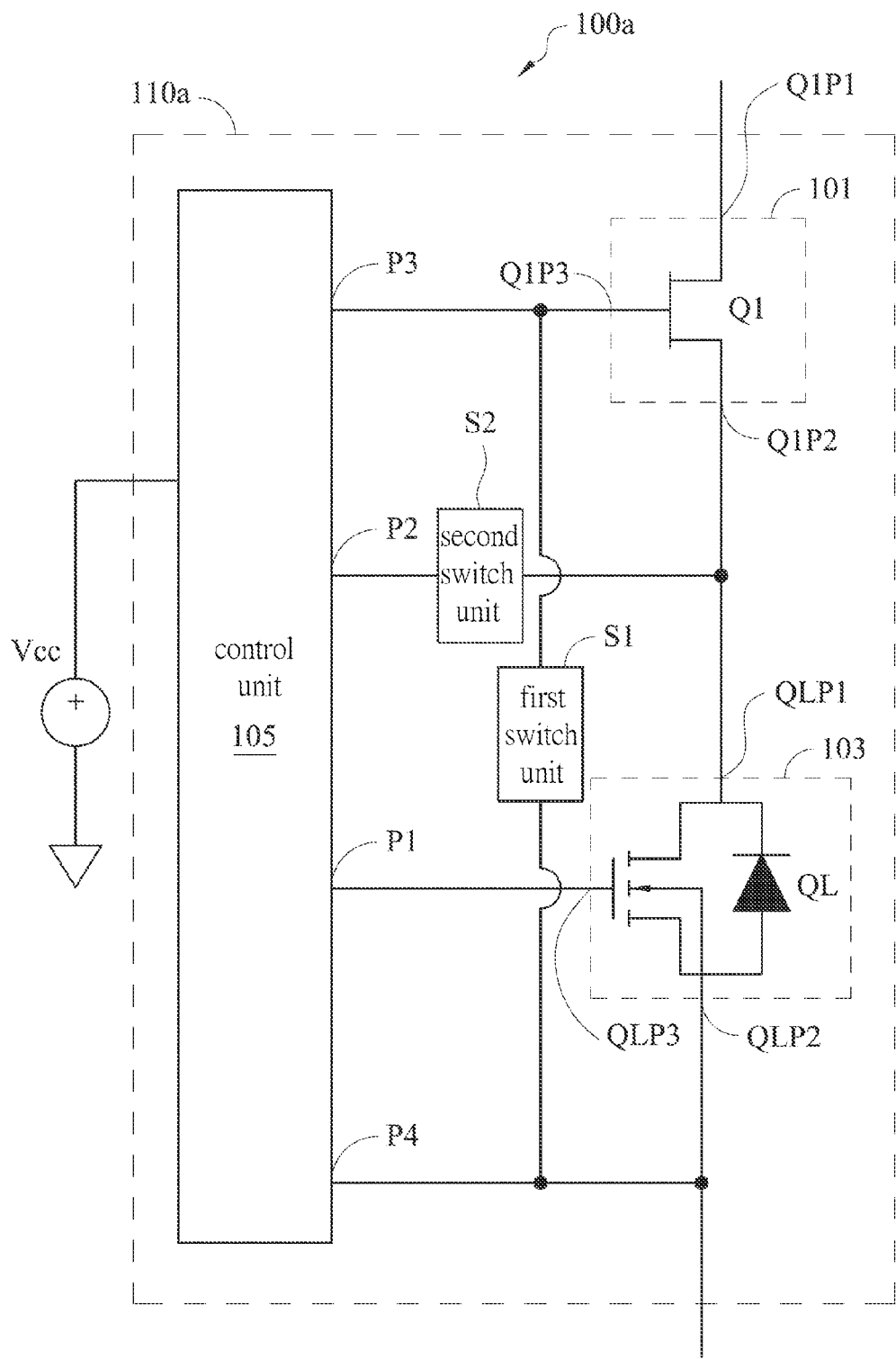
FIG. 2A is a diagram illustrating a power circuit according to an exemplary embodiment of the present disclosure.

Referring to FIG. 2A, FIG. 2A is a diagram illustrating a power circuit 100a according to an exemplary embodiment of the present disclosure.

As shown in FIG. 2A, the power circuit 100a includes a quasi-cascade power unit 110a. The quasi-cascade power unit 110a includes a normally-on switch 101, a normally-off switch 103, a control unit 105, a first switch unit S1 and a second switch unit S2.

In this exemplary embodiment, the normally-on switch 101 includes a first end Q1P1, a second end Q1P2, and a control end Q1P3. The normally-off switch 103 includes a first end QLP1, a second end QLP2, and a control end QLP3, and the normally-off switch 103 is coupled to the normally-on switch 101 in series, and the second end Q1P2 of the normally-on switch 101 is coupled to the first end QLP1 of the normally-off switch 103.

In addition, the control unit 105 includes a first end P1, a second end P2, a third end P3 and a fourth end P4. The third end P3 of the control unit 105 is coupled to the control end Q1P3 of the normally-on switch 101 and the first end P1 of the control unit 105 is coupled to the control end QLP3 of the normally-off switch 103. The fourth end P4 of the control unit 105 is coupled to the second end QLP2 of the normally-off switch 103.

The first switch unit S1 and the second switch unit S2 include a first end and a second end, respectively. The first end of the first switch unit S1 is coupled to the control end Q1P3 of the normally-on switch 101, and the second end of the first switch unit S1 is coupled to the second end QLP2 of the normally-off switch 103. The second end of the second switch unit S2 coupled to the control unit 105, and the first end of the second switch unit S2 is coupled to the second end Q1P2 of the normally-on switch 101. The control end of the second switch unit S2 is used for receiving a control signal transmitted from the control unit 105.

Moreover, the normally-off switch 103 may be a transistor QL, wherein the transistor QL may be a Metal-Oxide-Semiconductor Field-Effect Transistor (MOSFET) or an Isolated Gate Bipolar Transistor (IGBT). In other words, the first end QLP1 of the normally-off switch 103 may be the drain electrode of the transistor QL. The second end QLP2 of the normally-off switch 103 may be the source electrode of the transistor QL. The control end QLP3 normally-off switch 103 may be the gate electrode of the transistor QL.

In addition, the normally-on switch 101 may be a transistor Q1, wherein the transistor Q1 may be a SiC Junction Field-Effect Transistor (SiC JFET) or a GaN Junction Field-Effect Transistor (GaN JFET). That is, the first end Q1P1 of the normally-on switch 101 may be the drain electrode of the transistor Q1. The second end Q1P2 of the normally-on switch 101 may be the source electrode of the transistor Q1. The control end Q1P3 of the normally-on switch 101 may be the gate electrode of the transistor Q1.

When there is no control signal, the normally-on switch 101 is at "on" state. At this time, if the normally-on switch 101 is the only switch in the circuit, it may result in making the power circuit 100a lose control. Hence, when there is the control signal, the normally-off switch 103 are usually used for ensuring the circuit safety of the power circuit 100a. Besides, when the control signal is activate, the normally-on switch 101 may be automatically switched between the "on" state and the "off" state according to the requirements.

Therefore, one aspect of an embodiment of the present disclosure is: utilizing a relative-low-voltage normally-off switch 103 to assist the reliable turn-off of a relative-high-voltage normally-on switch 101 when there is no control signal, and when the control signal is activated, the normally-on switch 101 is in a high-frequency switching operation and the normally-off switch 103 is at "on" state.

As shown in FIG. 2A, the normally-on switch 101 and the normally-off switch 103 are coupled in series. The control unit 105 outputs the control signal for controlling the normally-on switch 101 and of the normally-off switch 103. The voltage source Vcc, which is coupled to the control unit 105, is used as the voltage source of the control unit 105. The normally-on switch 101 is a high voltage component, such as a SiC JFET or a GaN JFET with a withstand voltage of 600 voltage; the normally-off switch 103 is a low voltage component, such as a MOSFET or an IGBT with a withstand voltage of 40 voltages. It is to be understood that the aforementioned transistors may be P-type transistors or N-type transistors and the present disclosure is not limited in this regard For instance, the normally-on switch 101 may be a SiC transistor. The control end Q1P3 is the gate electrode of the transistor, and the second end Q1P2 is the source electrode of the transistor. A signal from the gate electrode to the source electrode is set as the cross voltage VGS1. When the VGS1 is 0 voltage or when it is a positive voltage, the transistor is in an on state; oppositely, when the cross voltage VGS1 is a negative voltage, the transistor is in an "off" state. A signal from the gate electrode to the source electrode of the normally-off switch 103 is set to be the cross voltage VGSL, and the control unit 105 outputs a control signal for controlling the cross voltage VGSL and the cross voltage VGS1.

Furthermore, when the normally-off switch 103 has a first withstand voltage and the normally-on switch 101 has a second withstand voltage. The first withstand voltage of the normally-off switch 103 may be lower than 50% of the second withstand voltage of the normally-on switch 101. It is to be understood that the circuit structure, which constructed by the normally-on switch 101 coupling with the normally-off switch 103 in series, may be considered as the quasi-cascade structure. In the operations, when the normally-on switch 101 is expected to bear a high voltage (e.g., 400 V) blocking for a longer time, the normally-off switch 103 is turned off. When the quasi-cascade structure requires executing the switching operations, that is, the normally-off switch 103 is expected to keep in the "on" state, the normally-on switch 101 will be turned on or be turned off according to the high frequency control signal, but the present disclosure is not limited in this regard.

It should be noticed that by using the quasi-cascade structure, the low frequency (e.g., DC or less than 100 Hz DC) operating components (e.g., the normally-off switch 103) may be used to assist the high frequency (e.g., higher than 10 KHZ) operating components (e.g., the normally-on switch 101) to be safely activated and to be protected.

In this exemplary embodiment, the normally-on switch 101 may be a GaN JFET or a SiC JFET, and the normally-off switch 103 may be a MOSFET or an IGBT. It is to be noted that the aforementioned descriptions is for the illustrative purpose only and not meant to be a limitation of the present disclosure.

Since the power circuits illustrated in FIG. 2B-FIG. 2K are similar to the power circuit illustrated in FIG. 2A, for the sake of the brevity, only the features of each of the exemplary embodiments that are different to the exemplary embodiment illustrated in FIG. 2A will be described, and the same components and operations of the power circuit illustrated in FIG. 2B-FIG. 2K are omitted.

Figure 2B:
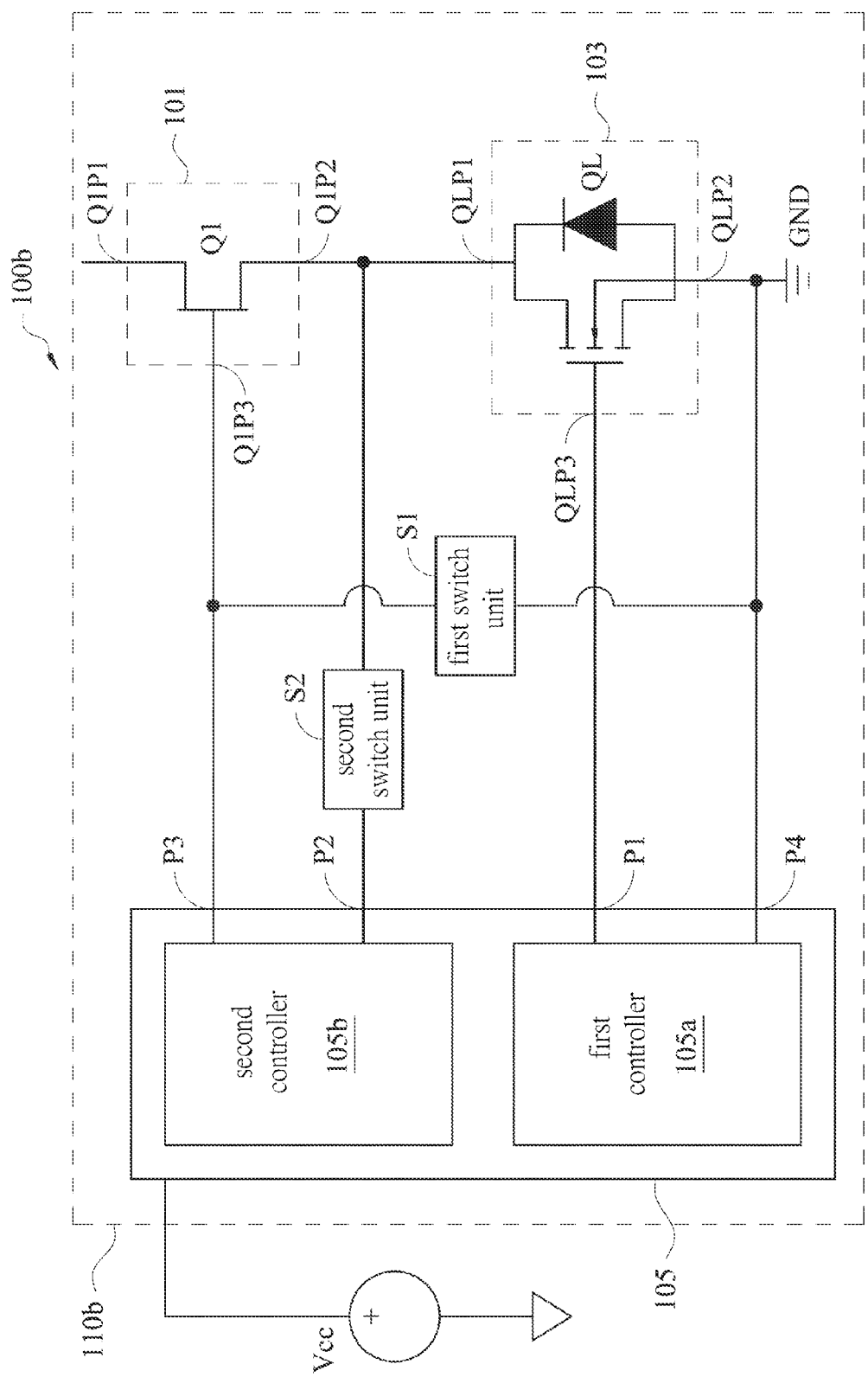
FIG. 2B is a diagram illustrating a power circuit according to a second exemplary embodiment of the present disclosure.

FIG. 2B is a diagram illustrating a power circuit 100b according to a second exemplary embodiment of the present disclosure. As shown in FIG. 2B, the power circuit 100b includes a quasi-cascade power unit 110b. The quasi-cascade power unit 110b includes a normally-on switch 101, a normally-off switch 103, a control unit 105, a first switch unit S1, and a second switch unit S2.

In this exemplary embodiment, as shown in FIG. 2B, the control unit 105 includes a first controller 105a and a second controller 105b. The first controller 105a includes a first end and a second end, and the second controller 105b includes a first end and a second end. The first end of the first controller 105a is the first end P1 of the control unit 105, the second end of the first controller 105a is the fourth end P4 of the control unit 105, the first end of the second controller 105b is the third end P3 of the control unit 105, and the second end of the second controller 105b is the second end P2 of the control unit 105.

The first controller 105a may output an On/Off signal EN via the first end P1 for controlling the normally-off switch 103, and the second controller 105b may output a switching signal for controlling the normally-on switch 101 via the third end P3. In this exemplary embodiment, when the normally-off switch 103 receives the signal and is turned on, the normally-on switch 101 receives a high-frequency switching signal and works in a high-frequency switching state.

For instance, when there is no control signal, the transistor Q1 keeps in the "on" state. When the first switch unit S1 is on and the second switch unit S2 is off, the second controller 105b will be not able to control the voltage from the gate electrode to the source electrode of the transistor Q1, that is, the second controller 105b will may not control the normally-on switch 101. Besides, when the first switch unit S1 is off and the second switch unit S2 is on, the first controller 105a outputs a control voltage for keeping the transistor QL in the "on" state, and the second controller 105b outputs a high-frequency switching signal to the transistor Q1 for making the transistor Q1 work in the high-frequency switching state.

Figure 2C:
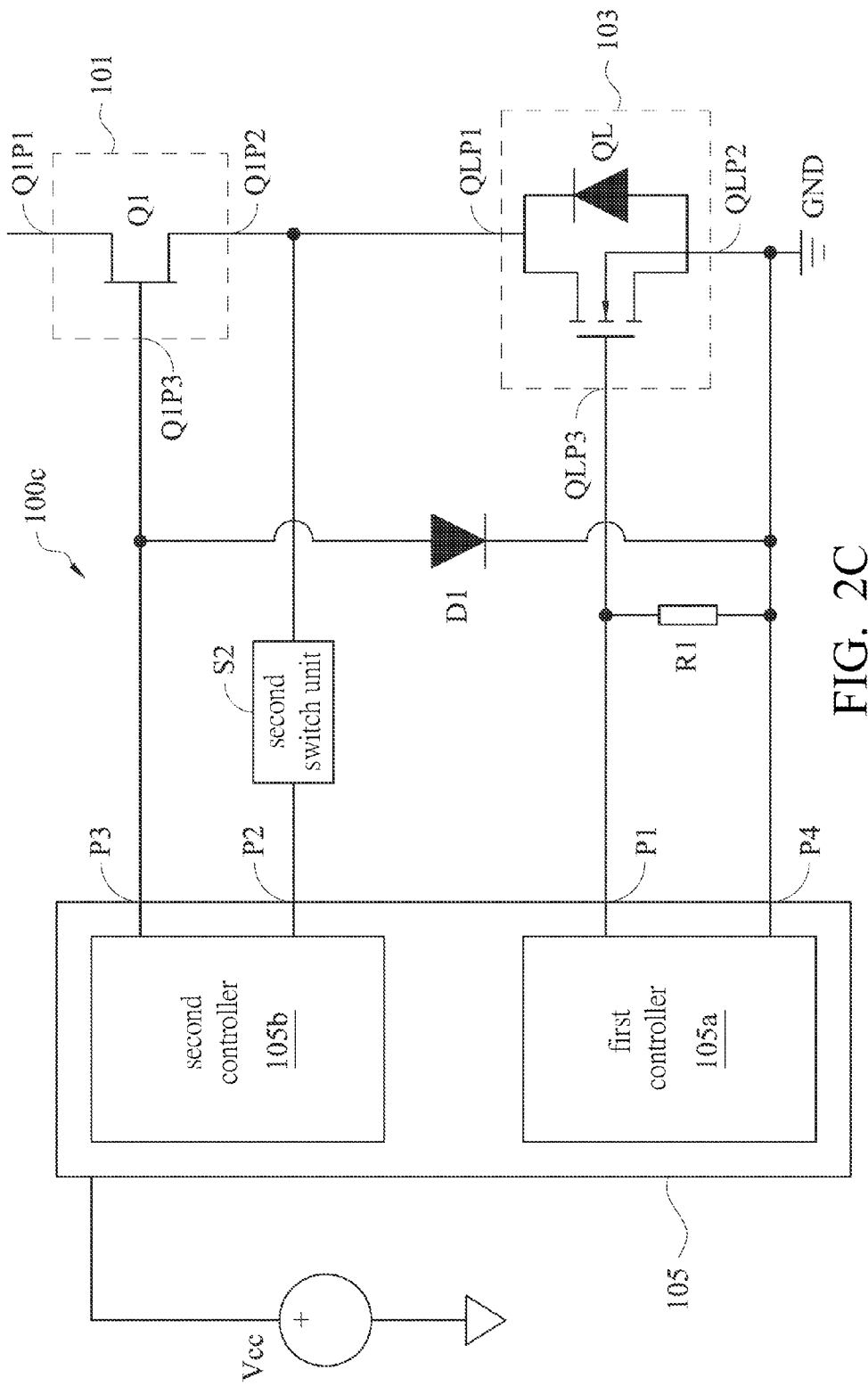
FIG. 2C is a diagram illustrating a power circuit according to a third exemplary embodiment of the present disclosure.

FIG. 2C is a diagram illustrating a power circuit 100c according to a third exemplary embodiment of the present disclosure. As shown in FIG. 2C, comparing to FIG. 2B, the power circuit 100c further includes a resistor R1, wherein the resistor R1 is coupled to the control end QLP3 and the second end QLP2 of the normally-off switch 103.

For instance, the resistor R1 is connected between the gate and the source of the transistor QL to ensure the transistor QL to keep in the "off" state before the voltage source Vcc starts to provide the power supply voltage. In addition, due to the fact that the choosing of the resistor R1 should consider both the effect and the loss, the resistance value of the resistor R1 may be between 100 ohms and 1000000 (1M) ohms.

Furthermore, the first switch unit S1 may include an active switching component, or it may further include a passive switch component. For instance, as shown in FIG. 2C, the first switch unit S1 may be a diode D1, wherein the first end of the first switch unit S1 is the anode of the diode D1 and the second end of the first switch unit S1 is the cathode of the diode D1; under such a situation, the first switch unit S1 may not be under the control of the control unit 105. In another exemplary embodiment, the first switch unit S1 may include an active switch component, and the control end of the said active switching component receives an On/Off signal EN outputted from the first end P1 of the control unit 105.

Figure 2D:
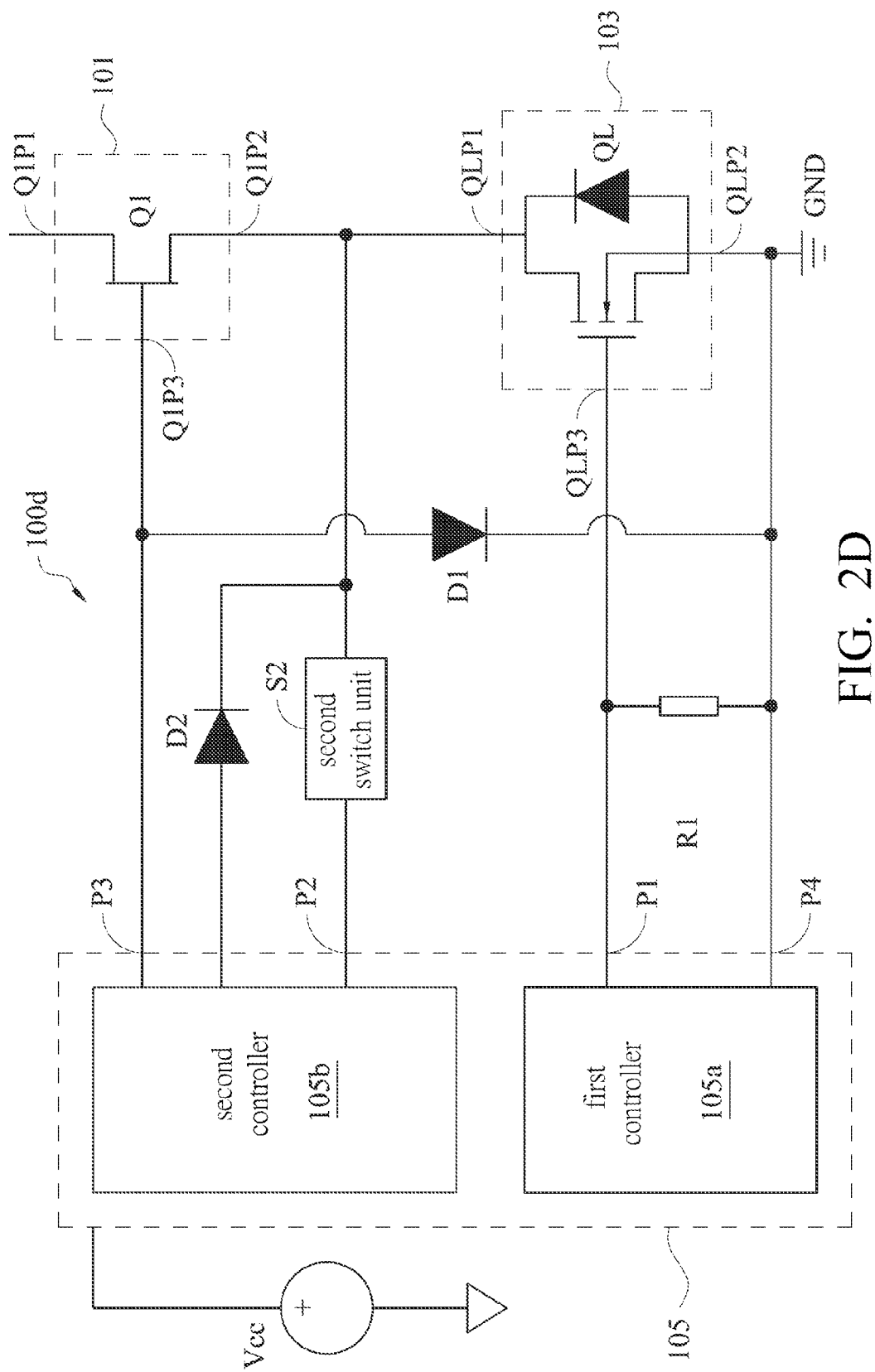
FIG. 2D is a diagram illustrating a power circuit according to a fourth exemplary embodiment of the present disclosure.

FIG. 2D is a diagram illustrating a power circuit 100d according to a fourth exemplary embodiment of the present disclosure. As shown in FIG. 2D, comparing to FIG. 2C, the difference is that the power circuit 100d further includes a diode D2. The anode of the diode D2 is coupled to one end of the control unit 105, and the cathode of the diode D2 is coupled to the second end Q1P2 of the normally-on switch 101. In this way, the diode D2, which may couples the control unit 105 and the second end Q1P2 of the transistor Q1, makes the second switch unit S2 no longer be controlled by the control signal outputted from the control unit 105.

Figure 2E:
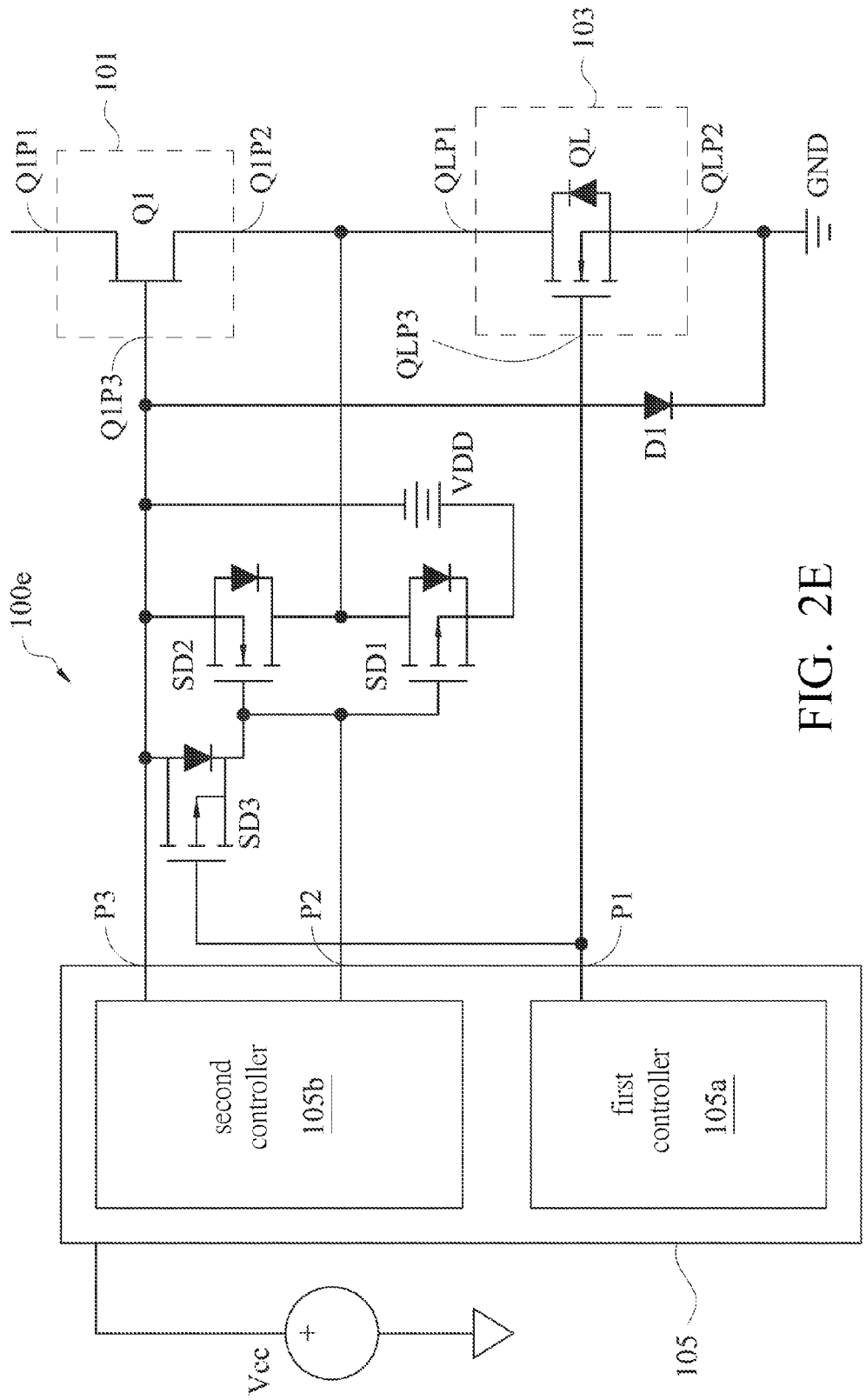
FIG. 2E is a diagram illustrating a power circuit according to a fifth exemplary embodiment of the present disclosure.

FIG. 2E is a diagram illustrating a power circuit 100e according to a fifth exemplary embodiment of the present disclosure. As shown in FIG. 2E, the second switch unit S2 of the power circuit 100e includes a first normally-off switch SD1, a second normally-off switch SD2, a third normally-off switch SD3, and a voltage source VDD.

For instance, the first normally-off switch SD1 and the third normally-off switch SD3 may be P-type MOSFET (P MOSFET) and the second normally-off switch SD2 may be N-type MOSFET (N MOSFET). Under such a situation, each of the first normally-off switch SD1, the second normally-off switch SD2 and the third normally-off switch SD3 includes a source electrode, a drain electrode and a gate electrode. The gate electrode of the third normally-off switch SD3 receives an On/Off signal EN from a first end P1 of the control unit 105, and the gate electrode of the first normally-off switch SD1 and the gate electrode of the second normally-off switch SD2 receive a driving signal from the second end P2 of the control unit. In addition, the negative electrode of the voltage source VDD is coupled to the third end P3 of the control unit 105, and the positive electrode of the voltage source VDD is coupled to the source electrode of the first normally-off switch SD1.

Furthermore, in this exemplary embodiment, the first normally-off switch SD1 and the second normally-off switch SD2 forms a totem-pole control circuit and the totem-pole control circuit is coupled to the normally-on switch 101. The third normally-off switch SD3 is used to control the operating states of the first normally-off switch SD1 and/or that of the second normally-off switch SD2.

For instance, when the gate electrode of the third normally-off switch SD3 receives a low-voltage-level signal, the third normally-off switch SD3 turns on, and it thereby controls the second normally-off switch SD2 and makes the second normally-off switch SD2 in the "off" state. In this way, the normally-on switch 101 would not be turned on by the state variations of the control unit 105 and the "on" state of the second normally-off switch SD2, and thus the normally-on switch 101 is kept in "off" state.

Moreover, the normally-on switch 101 may be kept in the "off" state by turning on the first normally-off switch SD1 and the voltage source VDD. Otherwise, when the voltage source VDD does not provide the voltage, it makes the normally-on switch 101 turn off by enlarging the cross voltage between the first end QLP1 and the second end QLP2 of the normally-off switch 103 through the operating principles of the series circuit structure. Moreover, for ensuring the achievement of the aforementioned situation, the second normally-off switch SD2 may be achieved by N-type component.

Furthermore, when the gate electrode of the third normally-off switch SD3 receives a high-voltage-level signal, the third normally-off switch SD3 will be in the off state, and the third normally-off switch SD3 may lose the ability of controlling other components. Under such a situation, the control unit 105 may selectively control the normally-on switch 101 to be in the "on" state or the "off" state via the first normally-off switch SD1 and the second normally-off switch SD2.

Figure 2F:
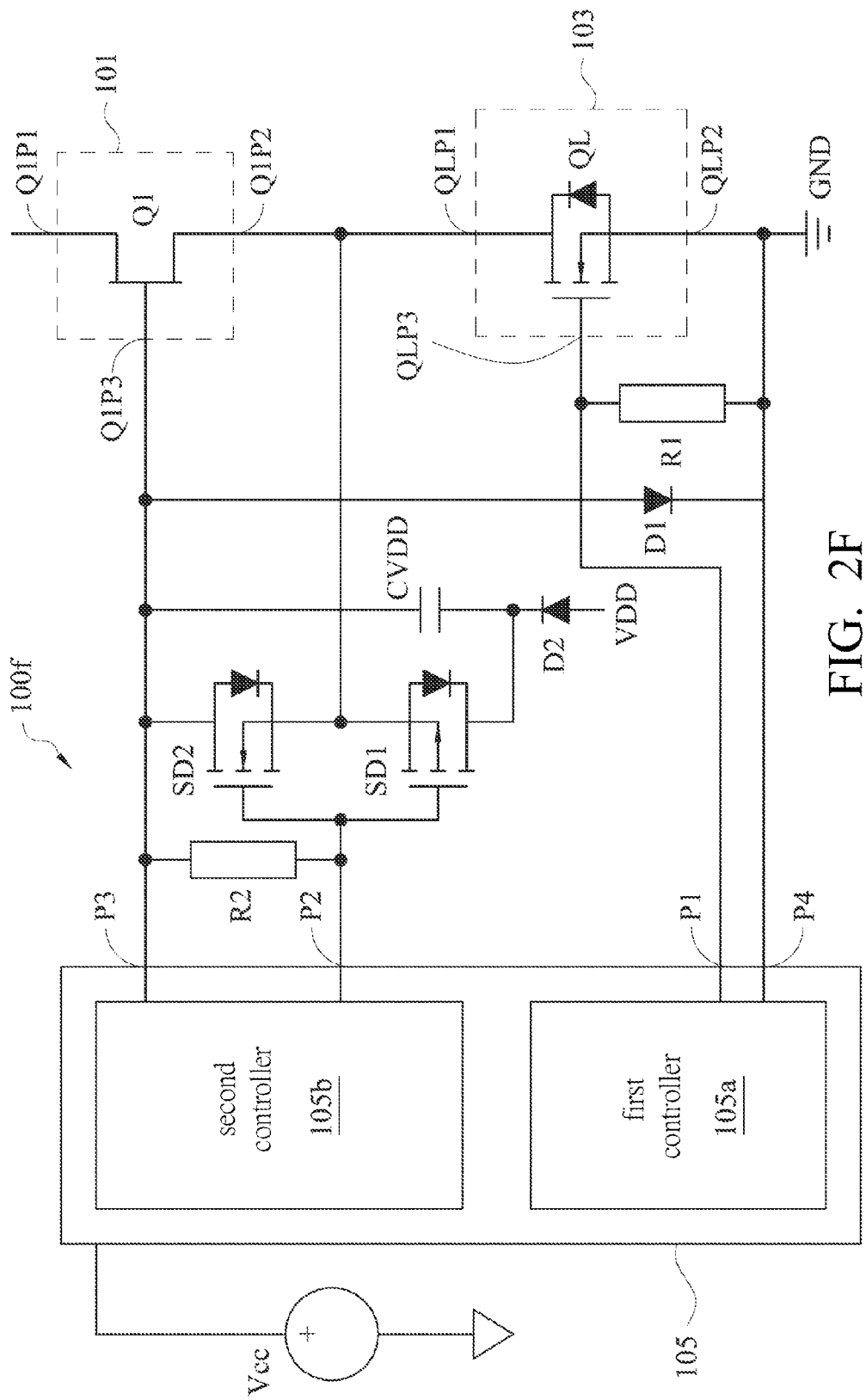
FIG. 2F is a diagram illustrating a power circuit according to a sixth exemplary embodiment of the present disclosure.

FIG. 2F is a diagram illustrating a power circuit 100f according to a sixth exemplary embodiment of the present disclosure. As shown in FIG. 2F, the second switch unit S2 includes a first normally-off switch SD1, a second normally-off switch SD2, a resistor R2, an input capacitor CVDD and a diode D2.

For instance, the first normally-off switch SD1 and the second normally-off switch SD2 may respectively may be a P-type MOSFET and an N-type MOSFET. The resistor R2 is coupled to the second end P2 and the third end P3 of the control unit 105. Both the control end of the first normally-off switch SD1 and the control end of the second normally-off switch SD2 could receive a driving signal outputted from the second end P2 of the control unit 105. The source electrode of the first normally-off switch SD1 is coupled to the cathode of the diode D2. The capacitor CVDD is coupled to the third end P3 of the control unit 105 and the cathode of the diode D2, and the anode of the diode D2 is coupled to a voltage source VDD.

It is to be noted that, in order to ensure the normally-on switch 101 may be turned off via the operations of the normally-off switch 103 when the control unit 105 does not with the control ability (at this time the control signal is the turning off signal), the second normally-off switch SD2 of the totem pole may be set to be N-type MOSFET, and the first normally-off switch SD1 of the totem pole may be set to be P-type MOSFET.

Besides, when the second end P2 of the control unit 105 outputs a low-voltage-level signal, the second normally-off switch SD2 turns off and the first normally-off switch SD1 turns on and outputs a high-voltage-level signal, which makes the voltage between the second end Q1P2 (the source electrode) and the control end Q1P3 (the gate electrode) of the normally-on switch 101 be a positive voltage. Hence, the normally-on switch 101 is at the "off" state. On the other hand, when the second end P2 of the control unit 105 outputs a high-voltage-level signal, the first normally-off switch SD1 turns off, and the second normally-off switch SD2 turns on and outputs a low-voltage-level signal, and the voltage between the second end and the control end of the normally-on switch 101 approaches zero, hence making the normally-on switch 101 be in the "on" state.

Furthermore, the resistor R2 is coupled to the third end P3 and the second end P2 of the control unit 105. When the voltage source Vcc does not provide the voltage (e.g., both the voltage source Vcc and the voltage source VDD are 0 voltage), the resistor R2 may ensure the second normally-off switch SD2 to be in the "off" state, thereby making a cross voltage between the first end QLP1 (the drain electrode) and the second end QLP2 (source electrode) of the normally-off switch 103 charge a cross voltage between the second end Q1P2 (the source electrode) and the control end Q1P3 (the gate electrode) of the normally-on switch 101 to a turn-off threshold though the diode D1. Accordingly, the establishment of the cross voltage between the second end Q1P2 (the source electrode) and the control end Q1P3 (the gate electrode) of the normally-on switch 101 would not be impeded by the second normally-off switch SD2 (which is a P-type MOSFET in the prior art). At this time, the first normally-off switch SD1 which is achieved by a P-type MOSFET is in the "on" state since the cross voltage between the second end Q1P2 (the source electrode) and the control end Q1P3 (the gate electrode) of the normally-on switch 101 is increasing, but it would not affect the final establishment of the cross voltage between the second end Q1P2 (the source electrode) and the control end Q1P3 (the gate electrode) of the normally-on switch 101.

Since the Miller effect of the normally-on switching component is more obvious, it requires a drive circuit with a very low impedance to achieve the fast switching of the normally-on switching component. As shown in FIG. 2F, may by choosing excellent the first normally-off switch SD1 and the second normally-off switch SD2, an impendence of the driving circuit itself may be reduced, hence making the impendence formed by the connection lines between the driving circuit and the normally-on switch 101 become a main factor.

Figure 2G:
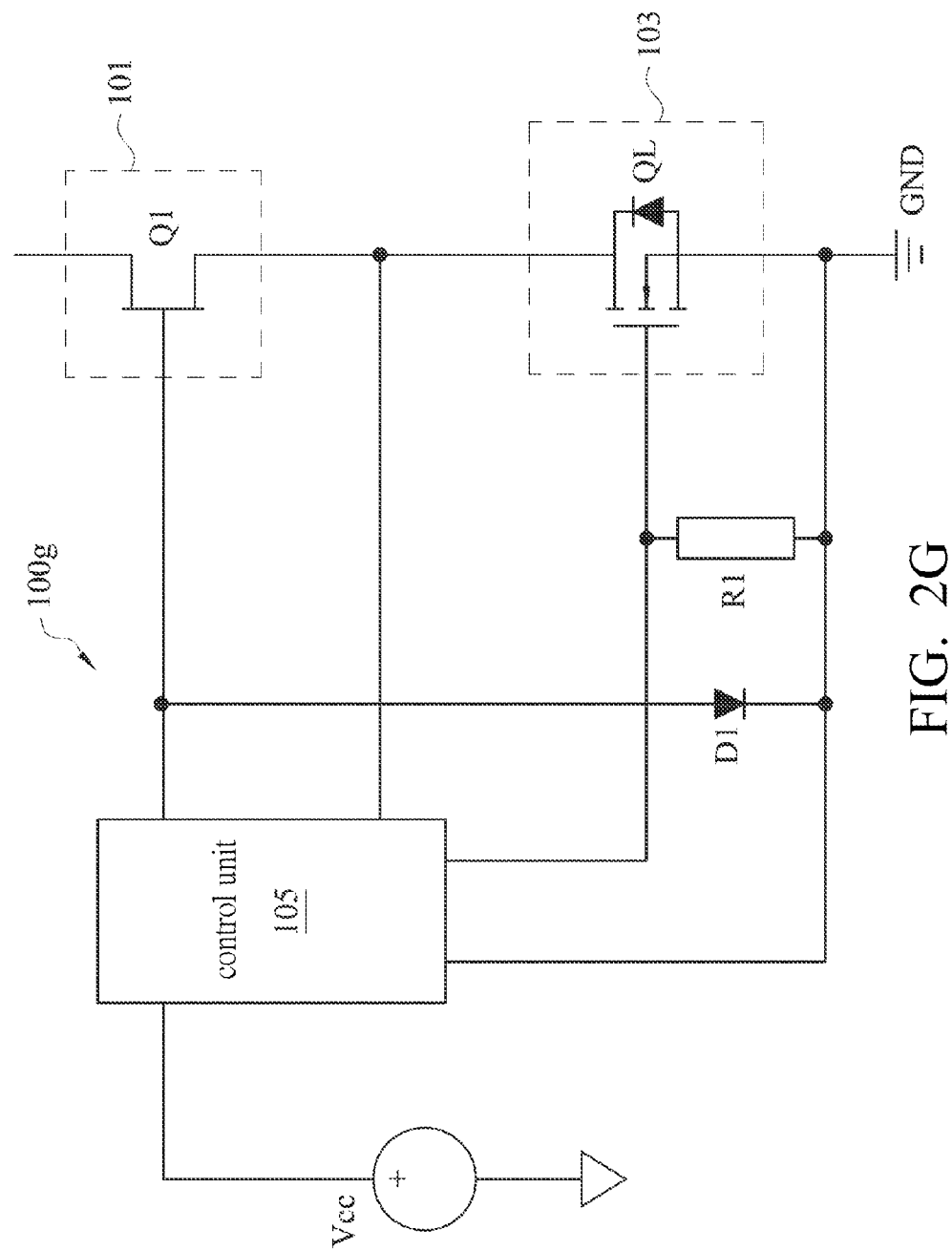
FIG. 2G is a diagram illustrating a power circuit according to a seventh exemplary embodiment of the present disclosure.

FIG. 2G is a diagram illustrating a power circuit 100g according to a seventh exemplary embodiment of the present disclosure. As shown in FIG. 2G, comparing to the power circuit 100c in FIG. 2C, the second switch unit S2 of FIG. 2C is integrated into the control unit 105.

For instance, the arrangement of the control signal is associated with the situation whether control unit 105 has the driving capability or not, and thereby integrating the second switch unit S2 into the control unit 105 may make the control unit 105 have the capability of detecting the driving voltage, for instance, for the low voltage protection of the voltage source VDD. Apparently, the low voltage protecting level is larger than the negative voltage threshold value of the normally-on switch 101. Under the situation that the control capability is detected through the control unit 105, the accordingly turning-on or turning-off control signal is arranged. The aforementioned accordingly turning-on or turning-off control signal may be used by the control unit 105, or it may be provided for the usage of the Si components or other circuits. The aforementioned accordingly turning-on or turning-off control signals may also be arranged according to the detecting of the temperature, the circuit of the normally-on switch and other signals.

Figure 2H:
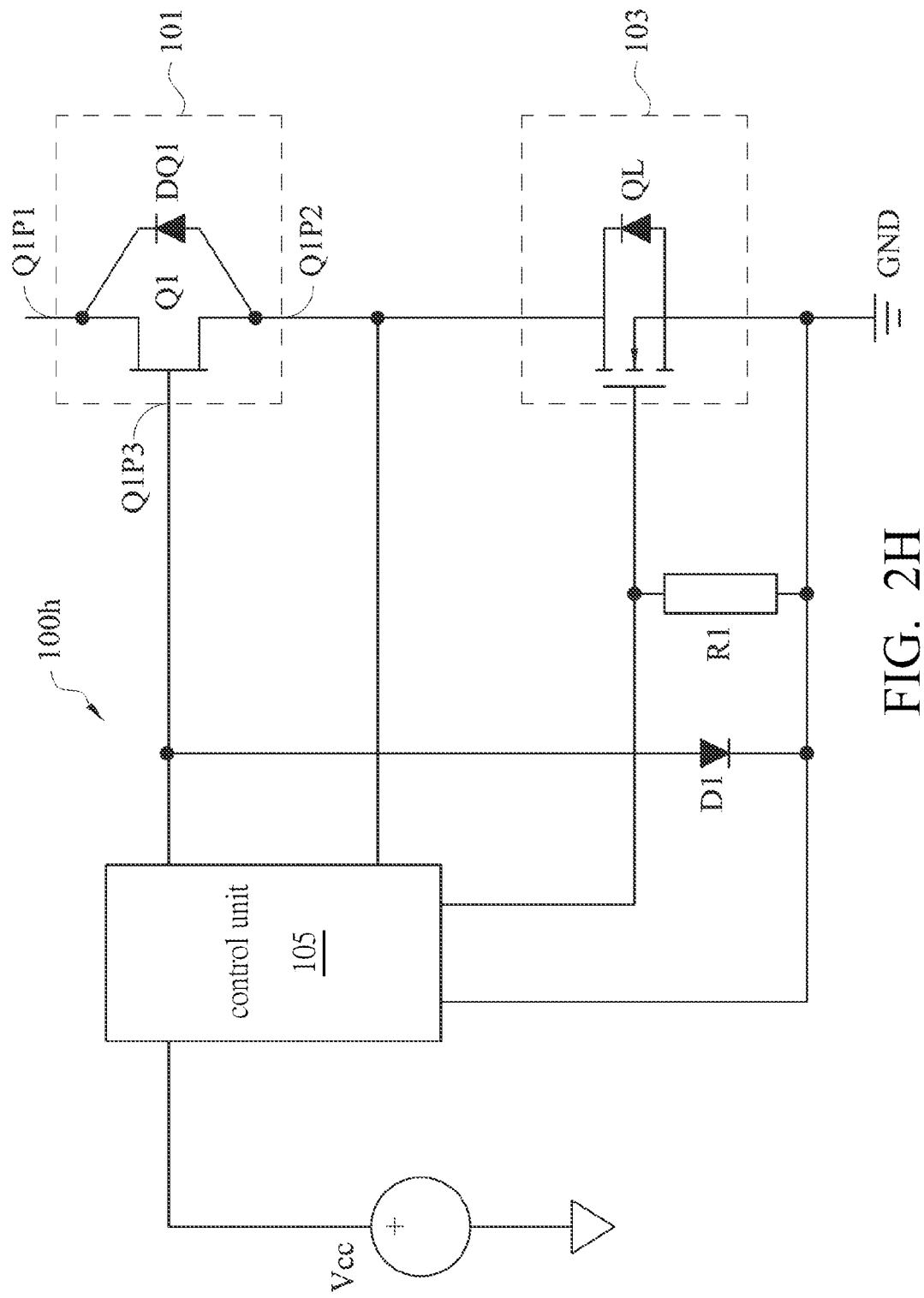
FIG. 2H is a diagram illustrating a power circuit according to an eighth exemplary embodiment of the present disclosure.

FIG. 2H is a diagram illustrating a power circuit 100h according to an eighth exemplary embodiment of the present disclosure. As shown in FIG. 2H, the power circuit 100h further includes a diode DQ1 which is coupled to the first end Q1P1 and the second end Q1P2 of the normally-on switch 101. The anode of the diode DQ1 is coupled to the second end Q1P2 of the normally-on switch 101, and the cathode of the diode DQ1 is coupled to the first end Q1P1 of the normally-on switch 101. In other words, the power circuit 100h may further has a diode DQ1 which is coupled to the transistor Q1 in parallel, to help effectively reduce the reverse voltage drop. Since the diode DQ1 usually needs to work under a high frequency, it is therefore that a component with a better reverse recovery characteristic should be chosen, such as a SiC diode or a GaN diode.

Figure 2I:
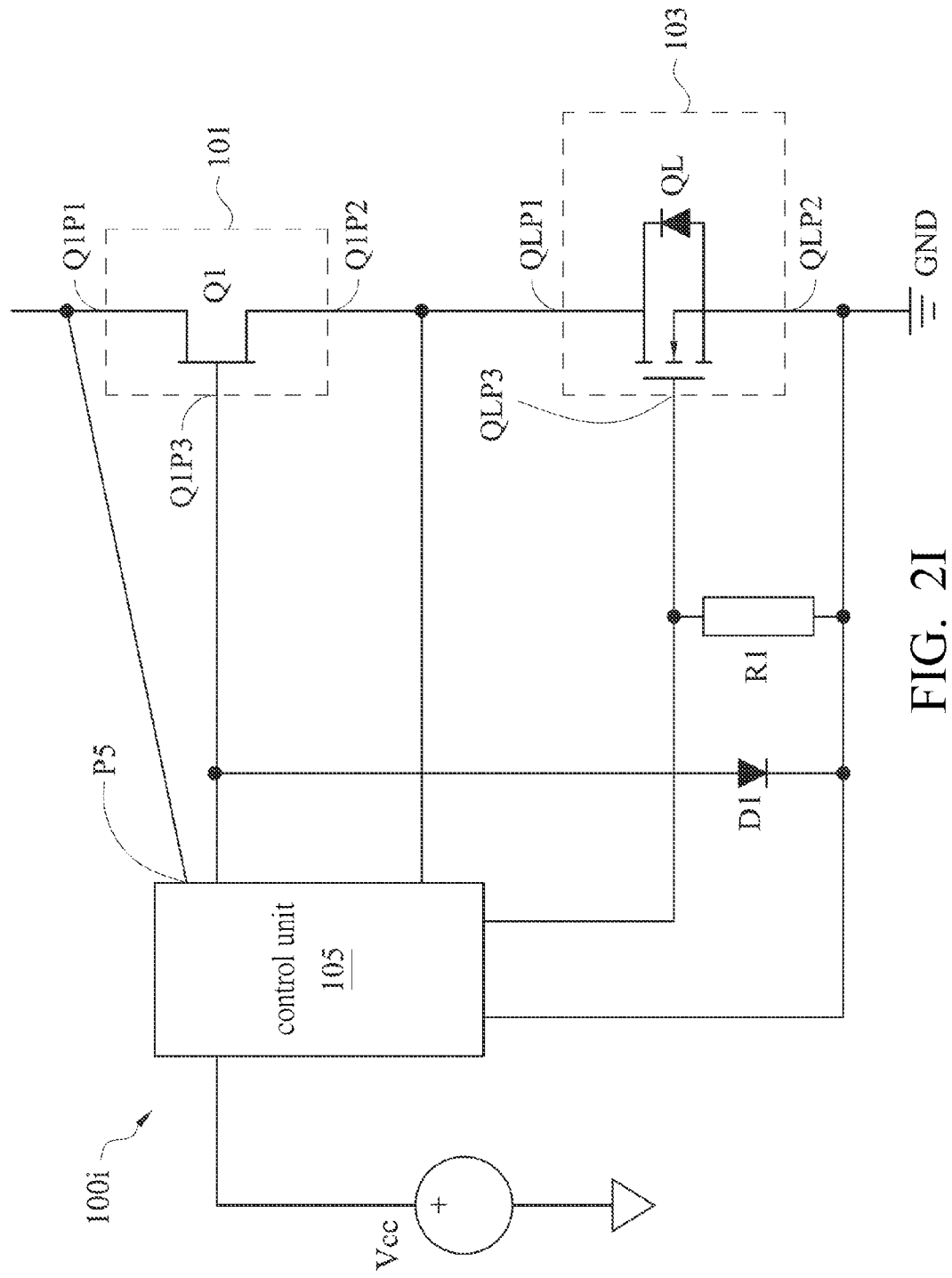
FIG. 2I is a diagram illustrating a power circuit according to a ninth exemplary embodiment of the present disclosure.

FIG. 2I is a diagram illustrating a power circuit 100i according to a ninth exemplary embodiment of the present disclosure. As shown in FIG. 2I, the control unit 105 includes a fifth end P5, and the fifth end P5 of the control unit 105 is coupled to the first end Q1P1 of the normally-on switch 101 (the transistor Q1) for detecting the current direction of the normally-on switch 101.

For instance, the control unit 105 detects the current direction passing through the transistor Q1 by the fifth end P5; the transistor Q1 will be turned on when the current direction passing through the transistor Q1 is required to be a reverse current, for being operated as similar to the synchronous rectification. The synchronous rectification detector may detect the cross voltage between the drain electrode and the source electrode of the transistor QL, and the synchronous rectification detector may detect the cross voltage between the drain electrode and the source electrode of the transistor Q1.

When the cross voltage between the drain electrode and the source electrode of the transistor Q1 is a negative voltage, the transistor Q1 is turned on. On the other hand, when the cross voltage between the drain electrode and the source electrode of the transistor Q1 is not a negative voltage, the transistor Q1 is in "off" state. Besides, by adjusting the control signal of the control unit 105, the transistor Q1 may be controlled to perform the turning-on operation under the reverse current.

Figure 2J:
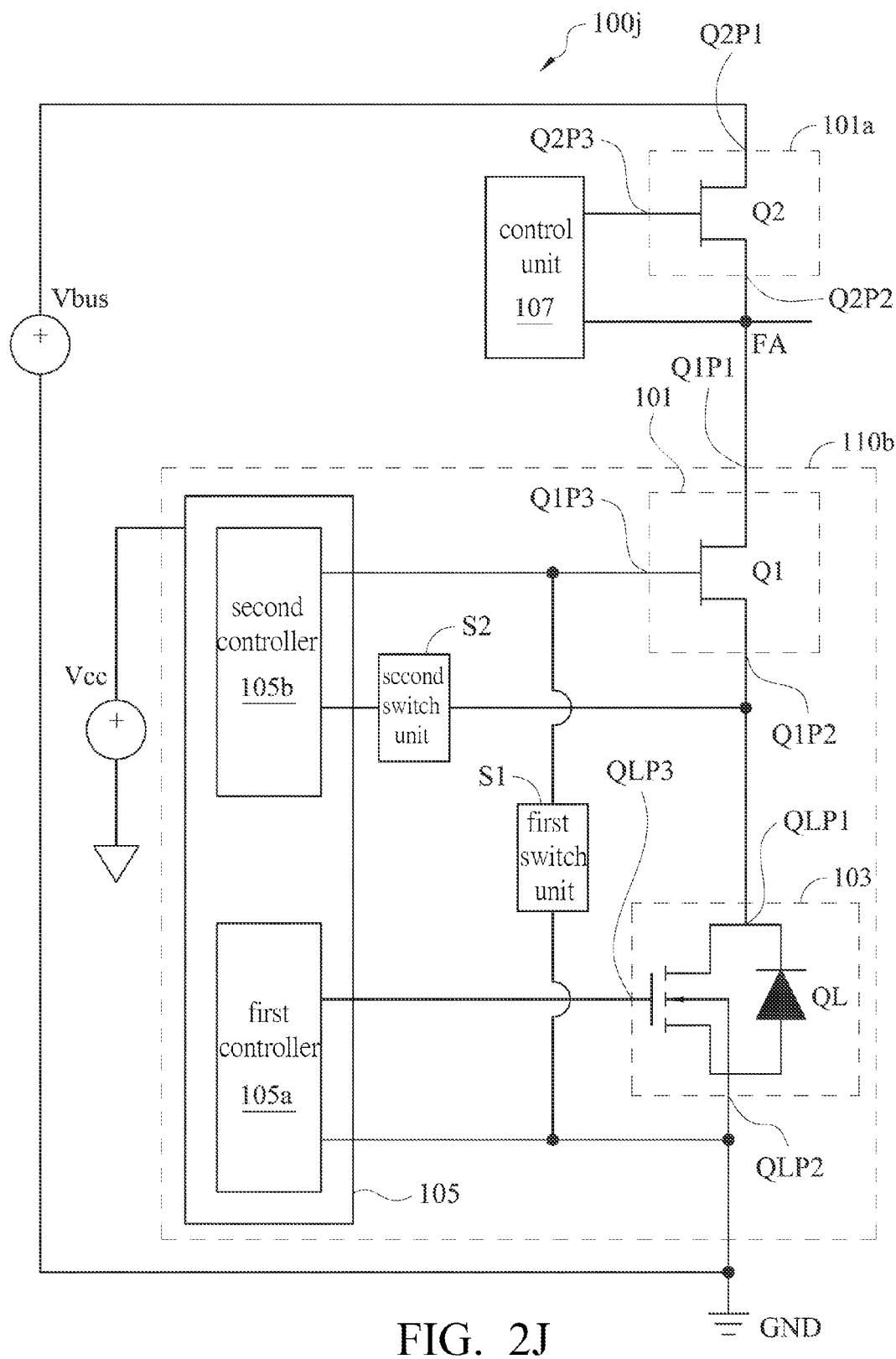
FIG. 2J is a diagram illustrating a power circuit according to a tenth exemplary embodiment of the present disclosure.

FIG. 2J is a diagram illustrating a power circuit 100j according to a tenth exemplary embodiment of the present disclosure. As shown in FIG. 2J, a normally-on switch 101a is added on the basis of the power circuit illustrated in FIG. 2B. Specifically, the power circuit 100j includes a quasi-cascade power unit 110b and a normally-on switch 101a. The quasi-cascade power unit 110b includes a normally-on switch 101, a normally-off switch 103 and a control unit 105. The normally-on switch 101a is coupled to the quasi-cascade power unit 110b in series to form a half-bridge topology. The aforementioned half-bridge topology and a voltage source Vbus are coupled to each other in parallel. The normally-on switch 101a and the quasi-cascade power unit 110b are coupled in series at a common node FA, and the common node FA is used as an output end of the aforementioned half-bridge circuit.

For example, as shown in FIG. 2J, the normally-on switch 101a is coupled to the quasi-cascade structure composed by the normally-on switch 101 and the normally-off switch 103 in series, and the first end Q2P1 of the normally-on switch 101a and the second end QLP2 of the normally-off switch 103 are coupled to the voltage source Vbus. A control unit 107 is used for providing a control signal to the normally-on switch 101a, and the second end Q2P2 of the normally-on switch 101a is coupled to the first end Q1P1 of the normally-on switch 101 at the common node FA. The common node FA is served as an output node from the half-bridge circuit to the external circuit, and both the common node FA and another output node (e.g., either the first end QLP1 or the second end QLP2 of the normally-off switch QL) coupled to the external circuit.

Figure 2K:
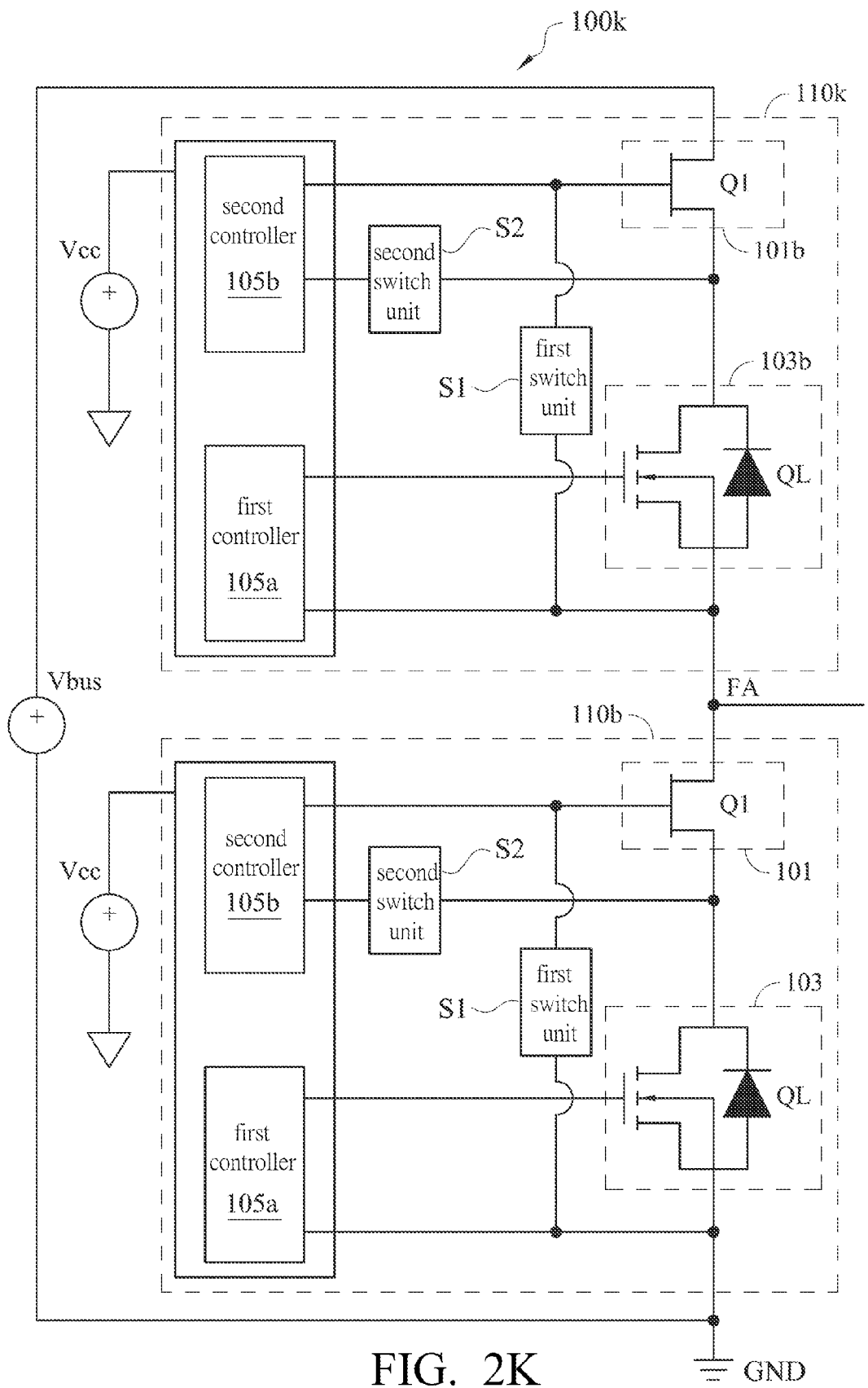
FIG. 2K is a diagram illustrating a power circuit according to an eleventh exemplary embodiment of the present disclosure.

FIG. 2K is a diagram illustrating a power circuit 100k according to an eleventh exemplary embodiment of the present disclosure. As shown in FIG. 2K, a quasi-cascade power unit 110k is added on the basis of the power circuit illustrated in FIG. 2B, the quasi-cascade power unit 110k is coupled to the quasi-cascade power unit 110b and construct a half-bridge topology. The aforementioned half-bridge circuit and a voltage source Vbus are coupled in parallel. The quasi-cascade power unit 110b and the quasi-cascade power unit 100k are coupled in series at a common node FA, and the common node FA is used as an output end of the aforementioned half-bridge circuit.

For instance, the quasi-cascade power unit 110b and the quasi-cascade power unit 110k have the same components. The transistor QL of the quasi-cascade power unit 110k is coupled to the transistor Q1 of the quasi-cascade power unit 110b to form a half-bridge circuit, and form a common node FA. The common node FA is used as an output end from the half-bridge circuit to the external circuit.

Moreover, the aforementioned quasi-cascade structure may be applied to the resonant circuit, such as the series resonant LLC circuit, and it may be applied to a circuit with reverse recovery, such as a totem pole Power Factor Correction (PFC) circuit in Continuous Current Mode (CCM), a boost circuit and a buck circuit.

Figure 3A:
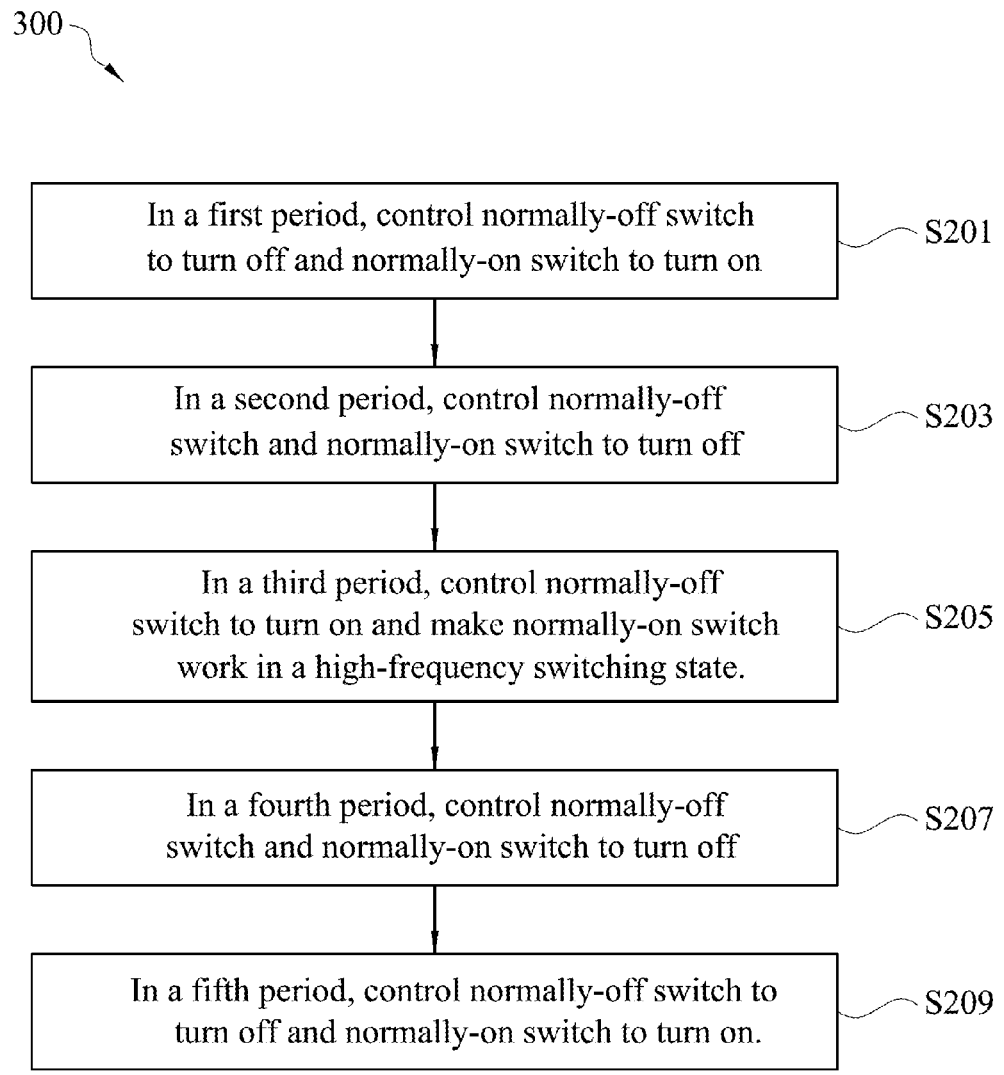
FIG. 3A is a flow chart of a control method according to an exemplary embodiment of the present disclosure.

Referring to FIG. 3A, FIG. 3A is illustrating a flow chart of a control method 200 according to an exemplary embodiment of the present disclosure. Please refer to FIG. 3A in conjunction with FIG. 3B as well. The control method 200 may be applied to the power circuit 210a illustrated in FIG. 3B. The power circuit 210a includes a quasi-cascade power unit 211a. The quasi-cascade power unit 211a includes a normally-on switch 101, a normally-off switch 103 and a control unit 105, and the normally-on switch 101 is coupled to the normally-off switch 103 and the control unit 105.

Moreover, it should be appreciated that the sequence order of the steps disclosed in this exemplary embodiment of the present disclosure may vary according to the design requirements. A plurality of steps may be performed simultaneously according to the order of the steps specifically descript or not. Also, the exemplary embodiment of the control method may be achieved by applying to each of the aforementioned exemplary embodiments of the power circuits; however, it is not meant to be a limitation of the present disclosure.

Figure 3B:
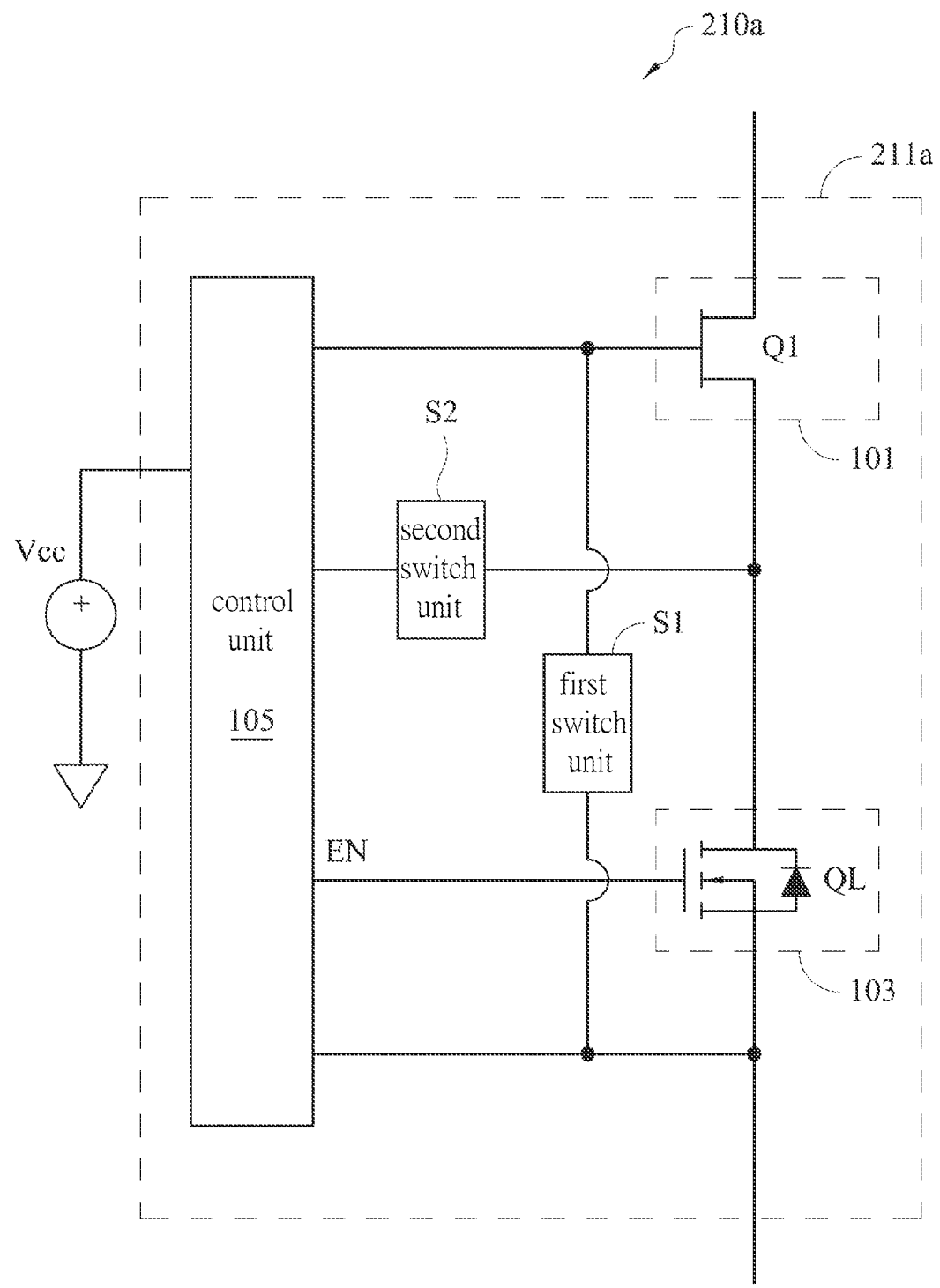
FIG. 3B is a diagram illustrating a power circuit according to an exemplary embodiment of the present disclosure.

For the illustrative purposes, please refer to FIG. 3A and FIG. 3B. Firstly, execute Step S201: In a first period, the normally-off switch 103 is turned off and the normally-on switch 101 is turned on. Next, execute Step S203: In a second period, the normally-off switch 103 and the normally-on switch 101 are turned off. Then, execute Step S205: In a third period, the normally-off switch 103 is turned on and the normally-on switch 101 works in a high-frequency switching state. Then execute Step S207: In a fourth period, the normally-off switch 103 and the normally-on switch 101 are turned off. Then execute Step S209: In a fifth period, the normally-off switch 103 is turned off and the normally-on switch 101 is turned on.

Figure 3C:
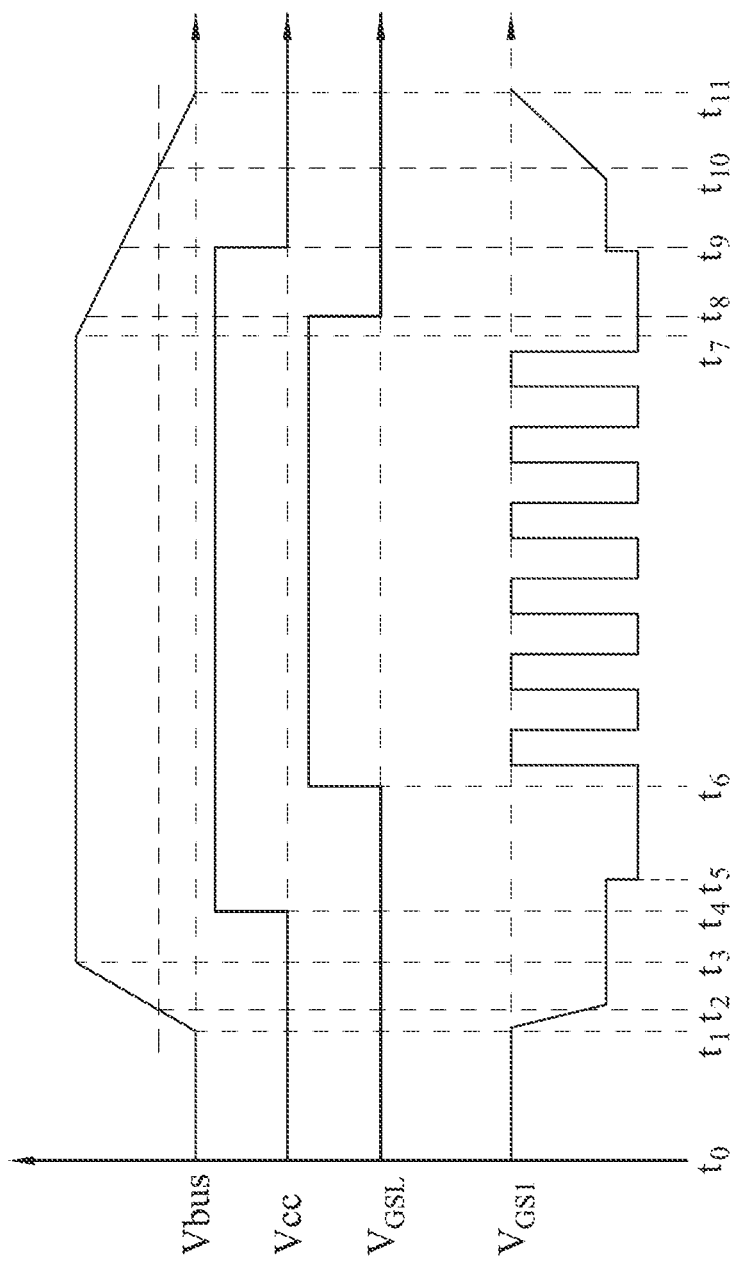
FIG. 3C is illustrating a time sequence diagram of the power circuit according to FIG. 3B.

Referring to FIG. 3C, FIG. 3C is illustrating a time sequence diagram of the power circuit 210a illustrated according to FIG. 3B.

For the illustrative purposes, herein the normally-on switch 101 uses the transistor Q1 as an example, wherein the transistor Q1 may be GaN JFET. Moreover, the normally-off switch 103 is represented by the transistor QL, wherein the transistor QL may be a MOS transistor; however, the aforementioned setting is not used to limit the present disclosure.

In an exemplary embodiment, in the first period (during the time points t0~t2), the control method 200 further includes the following steps. From a first time point t0 to a second time point t1, a first voltage source is turned off, and the normally-on switch and the normally-off switch are controlled according to a control signal which is at a low voltage level.

Specifically, before the first time point t1, since the power supply does not provide the voltage yet, the voltage source Vbus has not been established. Therefore, all the signals outputted from the control unit 105 are 0 volt.

Then, from the second time point t1 to the third time point t2, a voltage level of the voltage source Vbus is boosted from a low voltage level to a first voltage, thereby making a driving voltage of the normally-on switch 101 is pulled from a low voltage level down to a driving voltage threshold value of the normally-on switch 101. It is to be noted that the first voltage value is the operating voltage threshold value of the transistor Q1, and the voltage threshold of the transistor Q1 is a negative voltage. When the voltage level is lower than the aforementioned negative voltage, the transistor Q1 is completely off; oppositely, when the voltage level is higher than the voltage threshold of the transistor Q1, the transistor Q1 starts to turn on.

In other words, during the time points t1~t2, the power supply is activated, thereby the voltage source Vbus is established. At this time, the voltage level of the voltage source Vbus is lower than that of the voltage threshold of the transistor Q1, the voltage source Vcc is not established, and a cross voltage VGSL between the gate electrode and the source electrode of the transistor QL is for turning off. Therefore, the transistor QL is in the "off" state. An absolute value of the cross voltage VGS1 between the gate electrode and the source electrode of the transistor Q1 gradually becomes larger, but still smaller than the voltage level of the voltage threshold of the transistor Q1. Hence, the transistor Q1 keeps in the "on" state.

It is to be noted that, the voltage source Vcc is the power supply source of the control unit 105, and the power is from the input power source of the power converter, or it is directly from the voltage source Vbus. Since the establishment of the voltage source Vcc takes time, the voltage source Vcc supplies power lagging behind the voltage source Vbus. In addition, since the input capacitor has the function of storing the energy, the input capacitor also would be discharged after the input power source is turned off.

In an exemplary embodiment, during a second period (from the time points t2~t6), the control method 200 further includes the following steps: From a third time point t2 to a fourth time point t3, a voltage level of the voltage source Vbus is boosted from a first voltage value to a second voltage level, and making a driving voltage of the normally-on switch 101 be kept at a driving voltage threshold value of the normally-on switch 101.

Specifically, during the time points t2~t3, the voltage level of the voltage source Vbus increases, and the cross voltage VGS1 of the transistor Q1 keeps at the voltage threshold of the transistor Q1 so as to keep the transistor Q1 in the "off" state.

Then, from the fourth time point t3 to the fifth time point t4, the voltage level of the voltage source Vbus keeps at the second voltage value, and the driving voltage of the normally-on switch 101 keeps at the driving voltage threshold value of the normally-on switch 101. In other words, during the time point t3~t4, keeping the voltage level of the voltage source Vbus higher than the voltage threshold of the transistor Q1, thereby the cross voltage VGS1 of the transistor Q1 keeps at the voltage threshold of the transistor Q1 so as to keep the transistor Q1 in the "off" state.

Then, at the fifth time point t4, a voltage level of a voltage source Vcc is boosted, which is used for providing an operating voltage to the control unit 105, from a low voltage level to a working voltage level of the control unit 105. Specifically, during the time points t2~t4, starting to establish the voltage source Vcc, wherein the voltage source Vcc may be designed according to the actual requirement and may be established in a proper period during the time points t2~t3 or during the time points t3~t4.

Next, from the fifth time point t4 to the sixth time point t5, the voltage level of the voltage source Vbus keeps at the second voltage, the working voltage level of the control unit 105 remains the same, and the driving voltage of the normally-on switch 101 keeps at the driving voltage threshold value of the normally-on switch 101. Then, from the sixth time point t5 to the seventh time point t6, keeping the voltage level of the voltage source Vbus at the second voltage value, the working voltage value of the control unit 105 remains the same, and a driving voltage of the normally-on switch is reduced to a driving voltage value.

Specifically, during the time points t4~t6, the voltage level of the voltage source Vbus keeps higher than the voltage threshold of the transistor Q1. After the establishment of the voltage source Vcc, the control unit 105 controls the transistor Q1 according to the voltage source Vcc. In other words, the control unit 105 has the ability to output the turning-off signal to the transistor Q1. At the moment, an absolute value of the cross voltage VGS1 outputted from the control unit 105 is higher than the voltage threshold of the transistor Q1; hence, it ensures the transistor Q1 to be completely off.

In an exemplary embodiment, in the third period (during the time points t6~t8), the control method 200 further includes the following steps: during the seventh time point t6, a control signal is outputted with a high voltage level to a control end of the normally-off switch 103 via the control unit 105 so as to make the normally-off switch 103 be turned on.

That is, at the time point t6, the control unit 105 outputs the control signal with the high voltage level to the gate electrode of the transistor QL, thereby making the transistor QL be turned on.

Then, from the seventh time point t6 to the eighth time point t7, outputting the control signal with the high voltage level to the control end of the normally-off switch 103 via the control unit 105, and outputting a high frequency switch driving signal to the control end of the normally-on switch 101.

Next, from the eighth time point t7 to the ninth time point t8, a voltage level of the voltage source Vbus is reduced from the second voltage value to an under-voltage protection threshold value, the control signal is outputted with the high voltage level to the control end of the normally-off switch 103 by the control unit 105, and the high frequency switch driving signal is outputted to the control end of the normally-on switch 101. It is noted that, the under-voltage protection threshold value represents a low voltage of voltage source Vbus by turning off the input voltage source or lowering the input voltage source too much.

Specifically, during the time points t6~t8, since the control unit 105 has the ability to control the transistor Q1, there is no need to use the transistor QL to help turn off of the transistor Q1. Hence, the cross voltage VGSL may be set as the turning-on signal so as to make the transistor QL be kept in the "on" state. It is to be noted that, the control unit 105 may output the turning-on signal or the turning-off signal to the cross voltage VGSL according to the circuit operating requirements. Since the transistor QL is in the "on" state, the large driving loss, the reverse recovery loss, and the complicated matching issues of the distributing factors of the conventional quasi-cascade structure may be eliminated.

In an exemplary embodiment, in a fourth period (during the time points t8~t10), the control method 200 further includes the following steps: from the ninth time point t8 to the tenth time point t9, the voltage level of the voltage source Vbus is reduced from the under-voltage protection threshold value to third voltage value. Then, at the ninth time point t8, the control signal is outputted with a low voltage level to the control end of the normally-off switch 103 by the control unit 105 so as to make the normally-off switch 103 be turned off. Then, at the tenth time point, a voltage level of the voltage source Vcc is reduced form the working voltage level of the control unit 105 to a low voltage level, and the driving voltage of the normally-on switch 101 is pulled up to the driving voltage threshold value of the normally-on switch 101. It is to be noted that, the third voltage value represents a voltage value of the voltage source Vbus when the input power source fails to be kept at a required voltage value (i.e., when it needs to turn off the control unit 105 and the control circuit for avoiding the malfunctions).

Specifically, during the time points t8~t9, the voltage level of the voltage source Vbus is reduced. By detecting the input power source whether it is off, or by detecting the circuit whether it should continue to work in the high frequency, the signal of the cross voltage VGSL may be reset as the signal for turning off the transistor QL. The control unit 105 may output the turning-off control signal to the cross voltage VGS1 so as to make the transistor Q1 in the deep "off" state.

Next, from the tenth time point t9 to the eleventh time point t10, the voltage level of the voltage source Vbus is reduced from the third voltage value to the first voltage value so as to make the driving voltage of the normally-on switch 101 be kept at the driving voltage threshold value of the normally-on switch 101.

Specifically, during the time points t9~t10, the voltage level of the voltage source Vbus reduces, and a voltage level of the cross voltage VGSL of the transistor QL is set as 0 volt so as to make the transistor QL in the off state. The cross voltage VGS1 of the transistor Q1 keeps at the voltage threshold of the transistor Q1 so as to make the transistor Q1 in the off state.

In an exemplary embodiment, in the fifth period (during the time point t10~t11), the control method 200 further includes the following steps: from the eleventh time point t10 to the twelfth time point t11, a voltage level of the voltage source Vbus is reduced from a first voltage value to a low voltage level, and making the driving voltage of the normally-on switch 101 boost from a driving voltage threshold value of the normally-on switch 101 to a low voltage level.

Specifically, after the time point t10, the voltage level of the voltage source Vbus gradually reduces to 0 volt so as to make the cross voltage VGS1 of the transistor Q1 increase from the voltage threshold value of the transistor Q1 to turn to the "on" state. The cross voltage VGSL of the transistor QL is 0 volt, hence it is in the off state.

Thus, when the power circuit 210b is applied to the actual applications, in an embodiment, only the transistor Q1 is operated under the high frequency during the work, and it may receive an independent driving control signal. Since the characteristics of the transistor Q1 will completely be out of the effect of the transistor QL, it may operate with all the properties of the GaN components. Therefore, the disclosed circuit may be applied into almost all the circuit. Especially, the aforementioned power circuits may be applied to circuits such as the series resonant LLC circuit, the totem-pole Power Factor Correction (PFC) circuit in Continuous Current Mode (CCM), the boost circuit and the buck circuit.

Figure 3D:
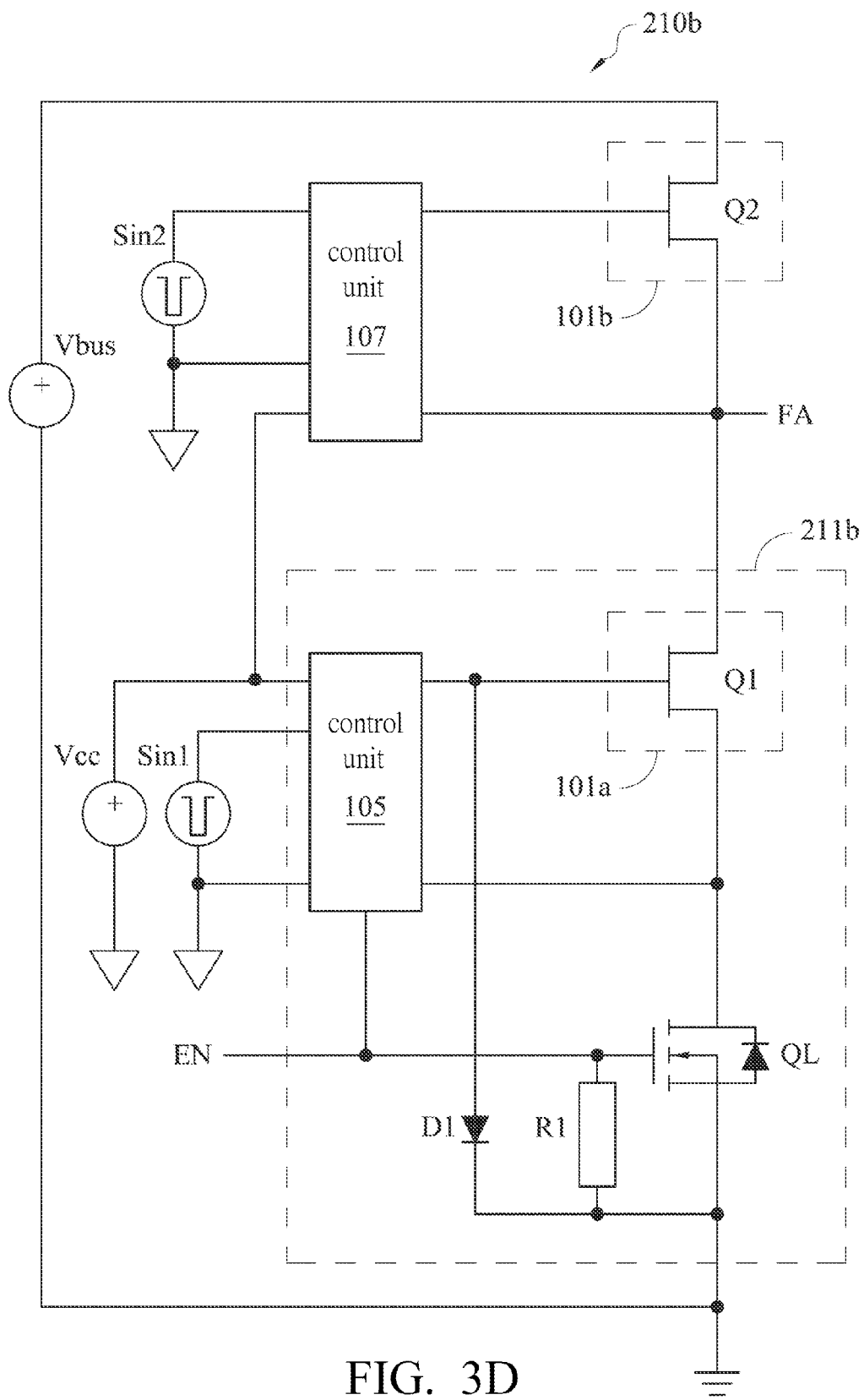
FIG. 3D is a diagram illustrating a power circuit according to an exemplary embodiment of the present disclosure.

In an exemplary embodiment, the control method 200 may be applied to the power circuit 210b illustrated in FIG. 3D.

As shown in FIG. 3D, the power circuit 210b includes a quasi-cascade power unit 211b. The quasi-cascade power unit 211b and the normally-on switch 101b are coupled in series to form a half-bridge circuit, the control unit 105 is coupled to the normally-on switch 101a and a normally-off switch 103, and the control unit 107 is coupled to the normally-on switch 101b.

For instance, as shown in FIG. 3D, the power circuit 210b includes a transistor QL and a transistor Q1 which are coupled in series, and a transistor Q2 which is coupled to the transistor QL in series. The transistor Q1 and the transistor Q2 are coupled to the voltage source Vbus. The transistor Q1 and the transistor QL form a quasi-cascade structure, and the transistor Q2 works independently. The output of the control unit 105 is electrically connected to the source and the gate of the transistor Q1. The output of the control unit 107 is electrically connected to the gate and the source of the transistor Q2. It is to be noted that, the transistor Q1 and the transistor Q2 may be GaN JFET and the transistor QL may be MOS transistor; however, it is not to limit the present disclosure.

Besides, the first signal Sin1 and the second signal Sin2 are coupled to the control unit 105 and the control unit 107, respectively. The voltage source Vcc is electrically connected to the control unit 105 and the control unit 107. The gate electrode of the transistor QL is electrically connected to the control unit 105. The anode of the diode D1 is electrically connected to the gate of the transistor Q1, and the cathode of the diode D1 is electrically connected to the source of the transistor QL. The resistor R1 is electrically connected between the gate and the source of the transistor Q1.

It is to be noted that, the first signal Sin1 is the input driving signal to the transistor Q1 and the second signal Sin2 is the input driving signal to the transistor Q2. When the input driving signal is under the normal working state, it is usually a high frequency signal, such as 100000 (100K) Hz. The bridge arm may not be under the shoot-through state; therefore, the first signal Sin1 and the second signal Sin2 are complementary signals with dead zone.

Since the bridge arm circuit is mainly formed by the transistor Q1 and the transistor Q2, the voltage withstanding capabilities may be both at least equal to the cross-over between the voltage source Vbus. Therefore, as long as the transistor Q1 may reliably turn off with the assistance of the transistor QL, the circuit is capable of withstanding the voltage of the voltage source Vbus and the transistor Q1 is in the on state. As shown in FIG. 3D, the quasi-cascade structure is used to connect with the transistor Q2 in a series connection.

Figure 3E:
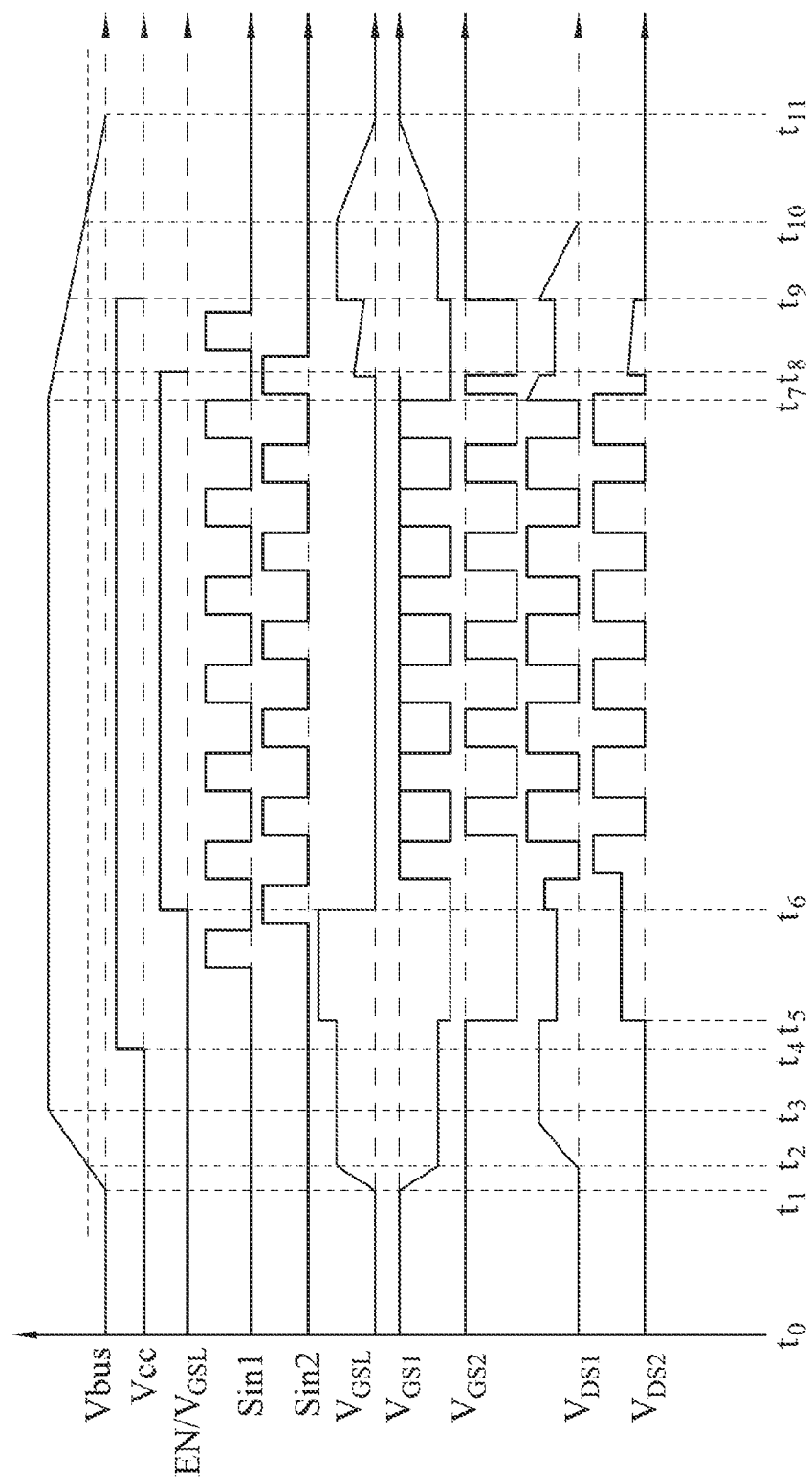
FIG. 3E is illustrating a time sequence diagram according to an exemplary embodiment of the power circuit of the present disclosure.

Referring to FIG. 3E, FIG. 3E is illustrating a time sequence diagram according to an exemplary embodiment of the power circuit 210b of the present disclosure.

In an exemplary embodiment, the control method 200 further includes the following steps: In the first period (during the time points t0~t2), the normally-on switch 101b is controlled to be turned on.

Specifically, during the time points t0~t1, the voltage source Vbus is not given yet, all the signals generated by the control unit 105 and the control unit 107 are 0 volt. It is to be noted that the voltage source Vbus may be connected cross the bridge arm, and the establishment and the elimination of the voltage amplitude usually represents the power-on and the power-off of the input power source of the power converter where the bridge arm is placed at. For instance, the voltage source Vbus may be formed by directly inputting a DC voltage source, or by rectifying an AC voltage source. According to the actual situations, the voltage source Vbus may also be various voltages where the voltage is positive with fluctuation, such as the 400V DC voltage carrying on 40 V AC ripples, which may not necessarily a stable DC supply.

Next, during the time points t1~t2, the system power supply is powered on, the establishment of the voltage source Vbus starts. At this time, the voltage source Vbus is smaller than the voltage threshold of the transistor Q1. Since the voltage source Vcc has not established yet, both the On/Off signal EN and the cross voltage VGSL are ensured by the resistor R1 to be low voltage level signals, thereby it is the turning off signals.

It is to be noted that, the voltage threshold of the transistor Q1 is a negative voltage. When the voltage value is lower than the aforementioned negative voltage value (that is, smaller than the aforementioned negative voltage), the transistor Q1 is completely off; on the contrary, when the voltage value is higher than the voltage threshold of the transistor Q1, the transistor Q1 starts to turn on.

In addition, the On/Off signal EN is the driving signal of the transistor QL. Besides, the On/Off signal EN may also be used on the control unit 105 and the control unit 107. To ensure that the circuit works reliably, the resistor R1 may be coupled between the gate and the source of the transistor QL so as to guarantee that the On/Off signal EN is at a low voltage level, thereby ensuring that the transistor QL is in the off state when the voltage source Vcc is not established. The resistor R1 regards both the effects and the consumptions; hence, it may be ranging from 100 ohms to 1000000 (1M) ohms.

Moreover, since both the transistor Q1 and the transistor Q2 are in the on state in the initial period and the transistor QL is in the off state, the cross voltage VDSL between drain and the source of the transistor QL is about equal to the voltage source Vbus.

It is to be noted that the cross voltage VDSL is a voltage from the drain to the source of the transistor QL. Since it is coupled to the driving loop of the transistor Q1 in series, tit will affect the driving voltage of the transistor Q1.

Assuming the diode D1 is an ideal diode, hence the cross voltage VGS1 is equal to the negative cross voltage VDSL and is about equal to the negative voltage source Vbus. Since the voltage amplitude of the voltage source Vbus is lower than the voltage threshold of the transistor Q1, the transistor Q1 is kept in the on state.

In the second period (during the time points t2~t6), from the third time point t2 to the sixth time point t5, the normally-on switch 101b is controlled to turn on, and from the sixth time point t5 to the seventh time point t6, the normally-on switch 101b is controlled to turn off.

Specifically, during the time points t2~t3, the voltage level of the voltage source Vbus exceeds the voltage threshold of the transistor Q1. At this time, the transistor Q1 starts to work, and the cross voltage VGS1 is stably kept at the voltage threshold of the transistor Q1, and the transistor Q1 is kept in the off state.

Since the cross voltage VDSL keeps the same, the rest voltage is carried by the transistor Q1, that is, the cross voltage VDS1 between the source and the drain of the transistor Q1 is equal to a sum of the voltage source Vbus and the voltage threshold of the transistor Q1 (the voltage threshold of the transistor Q1 is a negative voltage), therefore the cross voltage VDS1 is smaller than the voltage source Vbus.

Besides, during the time points t2~t4, according to the actual requirements, the voltage source Vcc may be designed to be established in a proper period during the time points t2~t3 or during the time points t3~t4.

Next, during the time points t4~t6, after the voltage source Vcc establishes, the control unit 105 and the control unit 107 could output the turning off signals to the transistor Q1 and the transistor Q2 according to the signal states of the On/Off signal EN. The control unit 105 and the control unit 107 have a cross voltage VGS1 and a cross voltage VGS2, respectively, wherein the absolute value of the two cross voltages are greater than the voltage threshold of the transistor Q1, to ensure the transistor Q1 being complete off. Therefore, the diode D1 does not need to be in the on state and hence the control unit 105 hence controls the transistor Q1.

It is to be noted that the cross voltage VGS1 is a voltage between the gate and the source of the transistor Q1. When the voltage is 0 or positive voltage, the transistor Q1 is on; oppositely, when the voltage is a negative voltage, the transistor Q1 is off. Similarly, the cross voltage VGS2 is a voltage between the gate and the source of the transistor Q2. When the voltage is 0 or positive voltage, the transistor Q2 is on; oppositely, when the voltage is a negative voltage, the transistor Q2 is off.

Since the transistors Q1 and Q2 are complete off, the cross voltage VDS1 and the cross voltage VDS2 will redistribute, and if the time is long enough and the circuit is symmetric, a difference between the two voltage drops may be very small. Since each of the transistors Q1 and Q2 has the ability to withstand the voltage source Vbus individually, the two transistors Q1 and Q2 do not need to be turned off simultaneously at this period. However, if the two transistors Q1 and Q2 are both in the off state, it may be easier to design the time sequence so as to ensure the safety.

In the third period (during the time points t6~t8), the normally-on switch 101b is controlled to work in a high-frequency switching state.

During the time points t6~t8, the control unit 105 controls the transistor Q1 and the transistor Q2. Since the control unit 105 and the control unit 107 now have the abilities to control the transistors Q1 and Q2, it does not need the transistor QL to assist the transistors Q1 and Q2 to turn off. Set the On/Off signal EN and the cross voltage VGSL as the turning on signals, thereby the transistor QL is in the normally-on state. The On/Off signal EN is transmitted to the control unit 105 and the control unit 107 simultaneously; thereby the transistor Q1 receives a control signal, that is, the first signal Sin1 from the control unit 105, while the transistor Q2 receives a control signal, that is, the second signal Sin2 from the control unit 107. Since the transistor QL is in the normally-on state, the huge control loss and the reverse recovery loss of the conventional quasi-cascade structure caused by the transistor QL may be eliminated.

In the fourth period (during the time points t8~t10), from the ninth time point t8 to the tenth time point t9, the normally-on switch 101b is controlled to turn off, and from the tenth time point t9 to the eleventh time point t10, the normally-on switch 101b is controlled to turn on.

Specifically, during the time points t8~t9, once detecting that the input power source is off, or under the circumstances that the circuit should not continue to be work in the high frequency, the signal of the On/Off signal EN and the signal of the cross voltage VGSL will be reset as the signal for turning off the transistor QL. Since the voltage source Vcc still remains working abilities, it may respond to the turning off signal so as to make all the transistor Q1, the transistor Q2 and the transistor QL in the off state simultaneously and share the voltage source Vbus.

In addition, during the time points t9~t10, the voltage source Vcc do not have the ability to keep supply the voltage, the control unit 105 and the control unit 107 do not work, the transistor Q2 will return to the on state, the transistor Q1 is controlled again by the transistor QL, and the transistor QL assists the transistor Q1 to turn off.

In the fifth period (during the time points t10~t11), the normally-on switch 101b is controlled to turn on.

Specifically, after the time point t10, since the voltage of the voltage source Vbus is lower than the voltage threshold of the transistor Q1, and the transistor Q1 is in the on state, the voltage source Vbus is directly taken by the transistor QL.

As shown in FIG. 3E, for reducing the difficulty of the control of the time sequence, the establishment of the driving ability of the GaN components should be done in the shortest possible time. Moreover, since the GaN components are expected to the work under high frequency, which means high du/dt, the conventional bootstrap power supply may be not only incapable to ensure the fast establishment of the driving voltage source, but also difficult to resist the high du/dt. The transistor Q2 of the upper bridge arm may select a driving circuit which is capable to deliver a driving signal as well as the energy by applying a transformer; thereby it is achieved to establish the driving ability at the first period of the signal. The driving circuit which is driven by the transformer is very common; hence, the structure and the operations of such driving circuit are omitted for the sake of the brevity. For the consistency of the circuit operations of the bridge arm, the transistor Q1 of the lower bridge arm is better to be driven by the transformer as well.

In an exemplary embodiment, the control method 200 may further be applied to the power circuit 100b illustrated in FIG. 2B.

For instance, the transistor Q1 is a high voltage normally-on component, and the transistor QL is a low voltage normally-off component; the transistor Q1 and the transistor QL are coupled in series. The control signal is coupled to the gate of the transistor QL so as to control the turning-on and the turning-off of the transistor QL. The control unit 105 is coupled to the source of the transistor Q1 through the second switch unit S2.

The first switch unit S1 is coupled between the gate of the transistor Q1 and the source of the transistor QL. The turning-on and the turning-off of the first switch unit S1 may be controlled by the On/Off signal EN or may not, and the disclosure is not limited in this regard. The second switch unit S2 may be controlled simultaneously by both of the control unit 105 and the On/Off signal EN, or it may be controlled by the control unit 105, and the disclosure is not limited to this. In one embodiment, a withstand voltage of the transistor QL may be lower than 50% of a withstand voltage of the transistor Q1 In one embodiment, the first switch unit S1 and the second switch unit S2 may at least include an active switching component or a passive switching component.

Referring to FIG. 2B in conjunction with FIG. 3E, specifically, during the time points t0~t1; the output signal of the control unit 105 is 0 volt.

During the time points t1~t2, the On/Off signal EN is set as the turning off signal, the first switch unit S1 receives the On/Off signal EN and turns on accordingly, and the second switch unit S2 turns off by the control of the On/Off signal EN and the driving signal. Because the On/Off signal EN is set as the turning-off signal, the transistor QL is in the off state. Because the second switch unit S2 turns off, the transistor Q1 is not controlled by the control unit 105.

Since the first switch unit S1 turns on, the gate of the transistor Q1 is electrically connected to the source of the transistor QL via the source of the transistor Q1, thereby the cross voltage VGS1 is a negative voltage. At this time, the voltage source Vbus is smaller, and the negative voltage of the cross voltage VGS1 of the transistor Q1 is larger than the voltage threshold value of the transistor Q1, thereby the transistor Q1 is in the on state.

During the time points t2~t3, setting the On/Off signal EN as the turning off signal, the first switch unit S1 turns on due to the control of the On/Off signal EN, and the second switch unit S2 turns off due to the control of the On/Off signal EN and of the driving signal. Because the On/Off signal EN is the turning off signal, the transistor QL is in the off state. Because the second switch unit S2 turns off, the transistor Q1 is not controlled by the control unit 105. Since the first switch unit S1 turns on, the gate of the transistor Q1 is coupled to the source of the transistor QL via the source of the transistor Q1 so as to make the cross voltage VGS1a negative voltage.

Furthermore, the voltage level of the voltage source Vbus keeps increasing, and the cross voltage VGS1 of the transistor Q1 is kept at the voltage threshold of the transistor Q1 so as to make the transistor Q1 off. A voltage between the drain and the source of the transistor QL is stably the voltage threshold value so as to make a voltage between the drain and the source of the transistor Q1 be equal to a voltage between the drain of the transistor Q1 and the source of the transistor QL minus the voltage threshold of the transistor Q1 so as to ensure that the low voltage components would not be under a high voltage.

During the time points t2~t4, according to the actual requirements, the voltage source Vcc may be designed to be established in a proper period during the time points t2~t3 or during the time points t3~t4.

During the time points t4~46, after the voltage source Vcc establishes, the control unit 105 then has the ability to output the turning off signal to the transistor Q1. The second switch unit S2 turns on due to the control of the control unit 105. The control signal outputted from the control unit 105 is applied between the gate and the source of the transistor Q1. In this way, an absolute value of the control signal outputted from the control unit 105 is greater than the voltage threshold of the transistor Q1 so as to make the transistor Q1 completely off. It is to be noted that the voltage source Vcc is the voltage source for the control unit 105.

During the time points t6~t8, set the On/Off signal EN as the turning on signal so as to make the transistor QL in the normally-on state. The first switch unit S1 turns off, and the second switch unit S2 turns on, the control unit 105 outputs a turning-on signal or a turning-off signal to the transistor QL according to the operating requirements of the circuit.

During the time points t8~t9, after detecting that whether the input power source is off, or whether the circuit should not continue to be working in the high frequency, the signal of the On/Off signal EN is reset as the turning off signal. Since the voltage source Vcc still has some working abilities, the control unit 105 may still output the turning off signal. The second switch unit S2 turns on due to the control of the control unit 105 so as to make the transistor Q1 turn off. The first switch unit S1 turns on due to the control of the control signal.

During the time points t9~t10, the voltage level of the voltage source Vcc gradually decreases to 0 volt, and the On/Off signal EN is set as the turning off signal so as to make the second switch unit S2 turn off due to the control signal of the control unit 105, and make the first switch unit S1 turn on due to the control signal of the control unit 105. At this time, the transistor QL is in the off state, the cross voltage VGS1 of the transistor Q1 keeps at the voltage threshold of the transistor Q1 so as to make the transistor Q1 in the off state.

After the time point t10, the On/Off signal EN is set as the turning off signal, the second switch unit S2 is off, and the first switch unit S1 is on. The cross voltage VGS1 of the transistor Q1 gradually increases from the voltage threshold of the transistor Q1, and thereby the transistor Q1 is in the on state, and the transistor QL is in the off state.

Figure 4A:
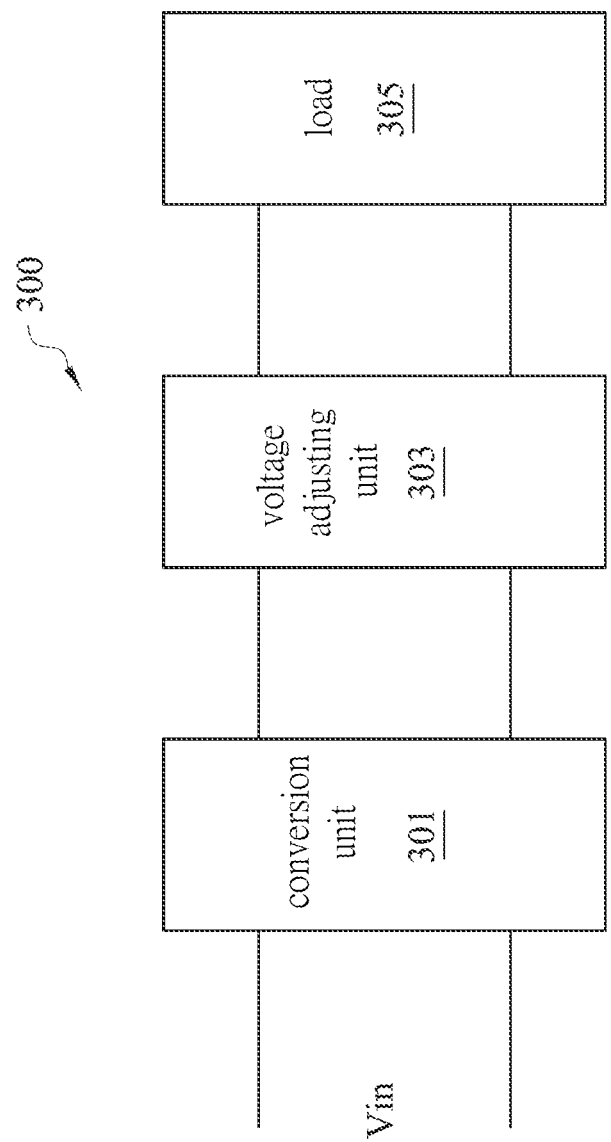
FIG. 4A is a diagram illustrating a power system according to an exemplary embodiment of the present disclosure.

Referring to FIG. 4A, FIG. 4A is a diagram illustrating a power system 300 according to an exemplary embodiment of the present disclosure.

As shown in FIG. 4A, the power system 300 includes a conversion unit 301 and a voltage adjusting unit 303. The conversion unit 301 includes an input end and an output end. The input end of the conversion unit 301 is used to be coupled to an input power source Vin. The conversion unit 301 may be a rectifying unit, or it may be an inverting unit, but the disclosure is not limited in this regard. The voltage adjusting unit 303 includes an input end and an output end. The input end of the voltage adjusting unit 303 is coupled to the output end of the conversion unit 301. The output end of the voltage adjusting unit 303 is coupled to the load 305.

Besides, the input power source Vin is electrically connected to the voltage adjusting unit 303 through the conversion unit 301, and the voltage adjusting unit 303 regulates the amplitude of the receives voltage or the shape of the signal according to the requirements of the load 305 so as to output a certain voltage for the load 305. The load 305 may be a DC load or may an AC load, and the conversion unit 301 includes at least one aforementioned quasi-cascade power unit of the above embodiments of the present disclosure.

Figure 4B:
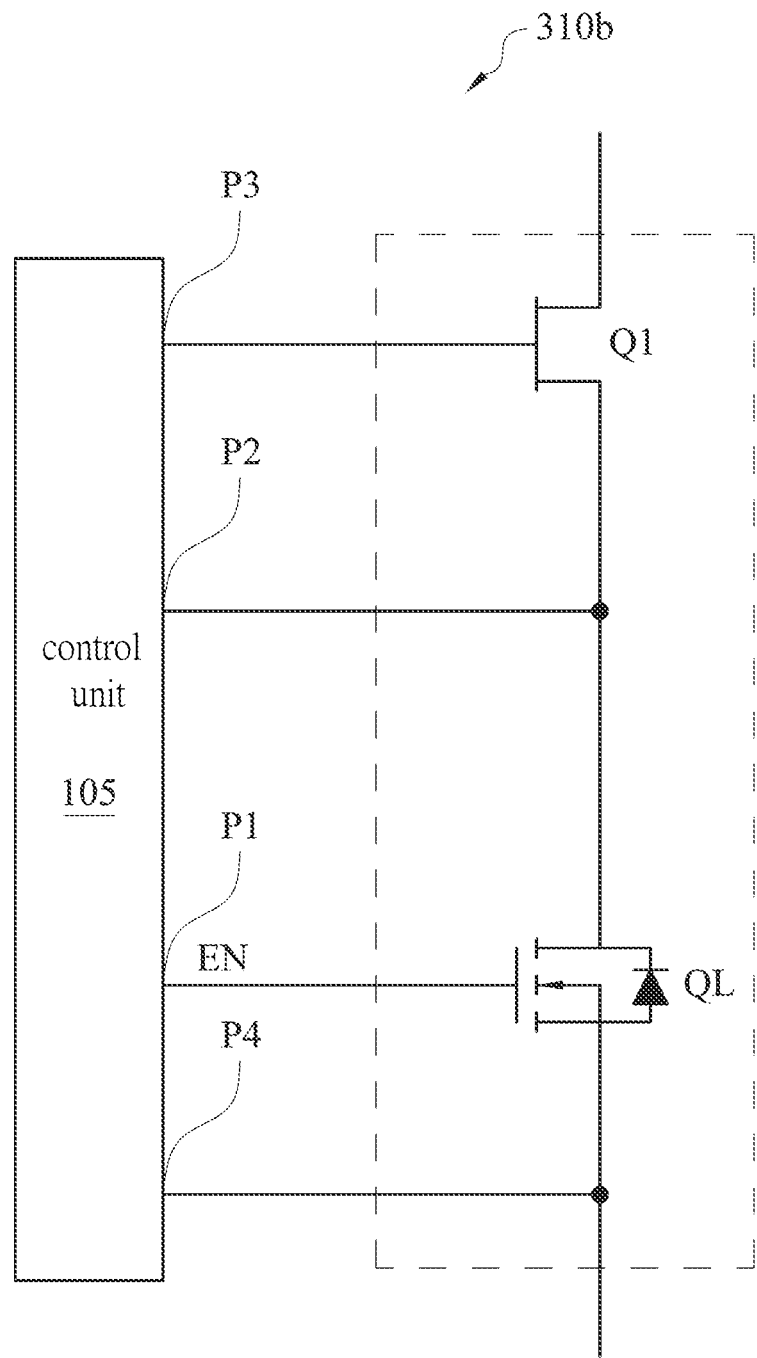
FIG. 4B is a diagram illustrating a quasi-cascade power unit according to a twelfth exemplary embodiment of the present disclosure.

FIG. 4B is a diagram illustrating a quasi-cascade power unit 310*b* according to a twelfth exemplary embodiment of the present disclosure. A conversion unit 301 may includes a quasi-cascade power unit 310*b*. As shown in FIG. 4B, the quasi-cascade power unit 310*b* includes a transistor Q1, a transistor QL, and a control unit 105. The transistor QL is coupled to the transistor Q1 in series.

In this exemplary embodiment, the control unit 105 includes a first switch unit S1 and a second switch unit S2, that is, the first switch unit S1 and the second switch unit S2 are integrated into the control unit 105. The control unit 105 includes a first end P1, a second end P2, a third end P3 and a fourth end P4, which are used for independently controlling the transistor Q1 and the transistor QL, respectively. The first end P1 of the control unit 105 is coupled to the gate of the transistor QL, and the third end P3 of the control unit 105 is electrically connected to the gate of the normally-on switch Q1.

Moreover, the source of the transistor Q1 is electrically connected to the drain of the transistor QL, and the drain of the transistor Q1 and the source of the transistor QL are used for coupling to an external circuit. The control unit 105 is used for outputting a control signal for controlling the transistor Q1 and a voltage between the gate and the source of the transistor QL so as to achieve the purpose of turning on or turning off the transistor QL and the transistor Q1.

When the quasi-cascade power unit 310*b* needs to be off for a long time, that is, the transistor Q1 is required to withstand a high voltage blocking, the control unit 105 outputs an On/Off signal EN for turning off the transistor QL. When the quasi-cascade power unit 310b needs to work, the control unit 105 outputs an On/Off signal EN so as to make the transistor QL keep in the on state.

Figure 4C:
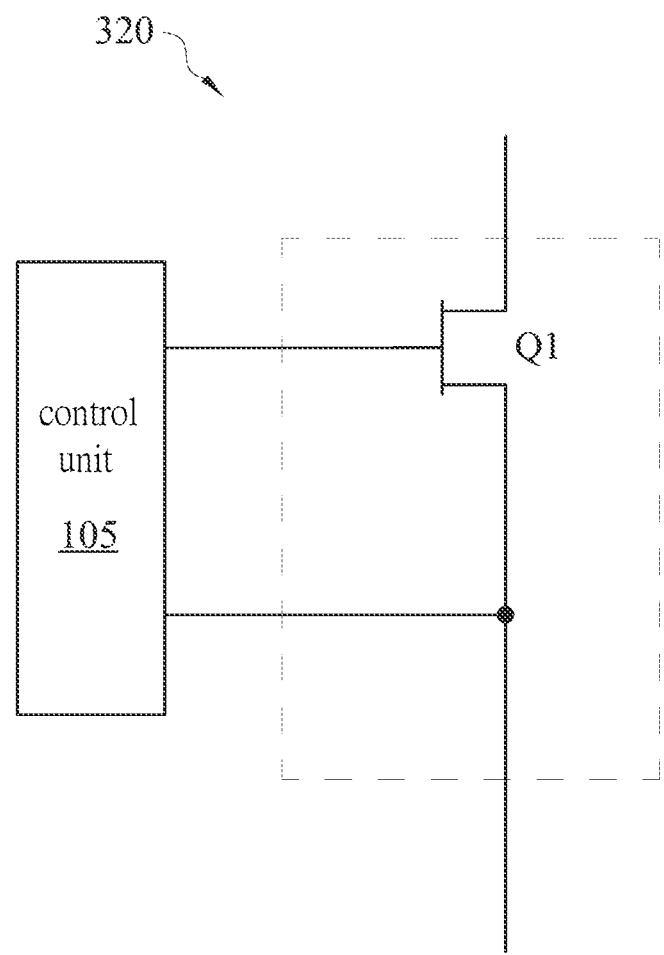
FIG. 4C is a diagram illustrating a quasi-cascade power unit according to a thirteenth exemplary embodiment of the present disclosure.

In addition, the normally-on switch 101 may be GaN component, or other components with wide band gap semiconductor material, such as SiC component. The normally-off switch is usually a Si component. In some conditions, the normally-on switch 101 is controlled by the control unit 105. As shown in FIG. 4C;

FIG. 4C is a diagram illustrating a quasi-cascade power unit 320 according to a thirteenth exemplary embodiment of the present disclosure. The control unit 105 of the power circuit 320 outputs the driving signal for controlling the transistor Q1.

Figure 4D:
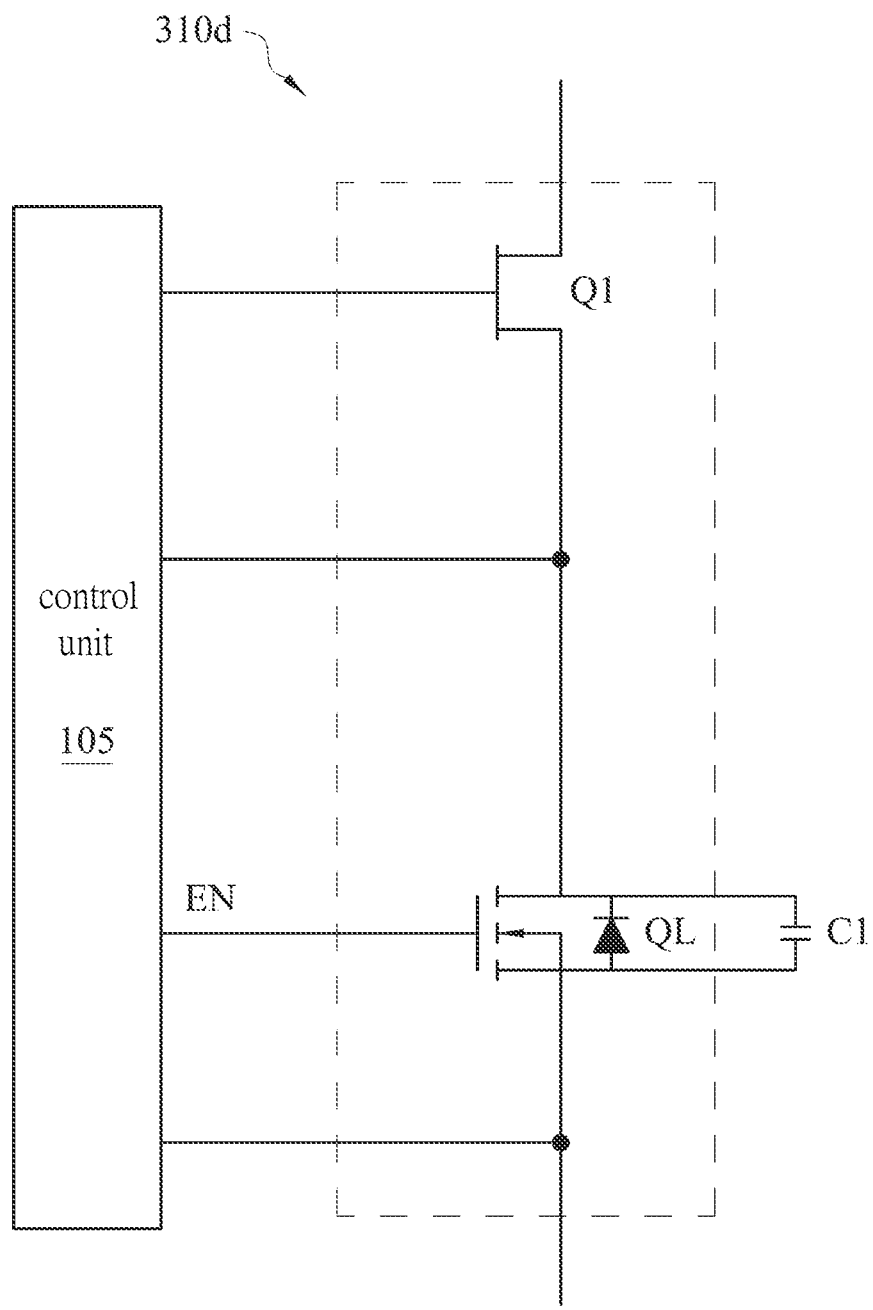
FIG. 4D is a diagram illustrating a quasi-cascade power unit according to a fourteenth exemplary embodiment of the present disclosure.

FIG. 4D is a diagram illustrating a quasi-cascade power unit 310d according to a fourteenth exemplary embodiment of the present disclosure. The quasi-cascade power unit 310d may be applied to the aforementioned conversion unit 301. As shown in FIG. 4D, the difference between FIG. 4B and FIG. 4D is that quasi-cascade power unit 310d not only includes the transistor Q1, the transistor QL, and the control unit 105, but also includes an input capacitor C1, wherein the input capacitor C1 and the transistor QL are coupled in parallel.

For instance, when the quasi-cascade power unit 310d works, the transistor QL keeps in the on state, hence the capacitor C1 may be coupled in parallel between the drain and the source of the transistor QL so as to reduce the loop inductance made by the transistor QL. It is to be noted that, the quasi-cascade power unit 310d may include at least one input capacitor C1, or it may include a plurality of input capacitors C1; moreover, it may use a combination of multiple input capacitors C1 which are coupled in series, in parallel or in series-parallel. In addition, the input capacitor C1 may be an added input capacitor, which is not the parasitic capacitor of the transistor QL.

Figure 4E:
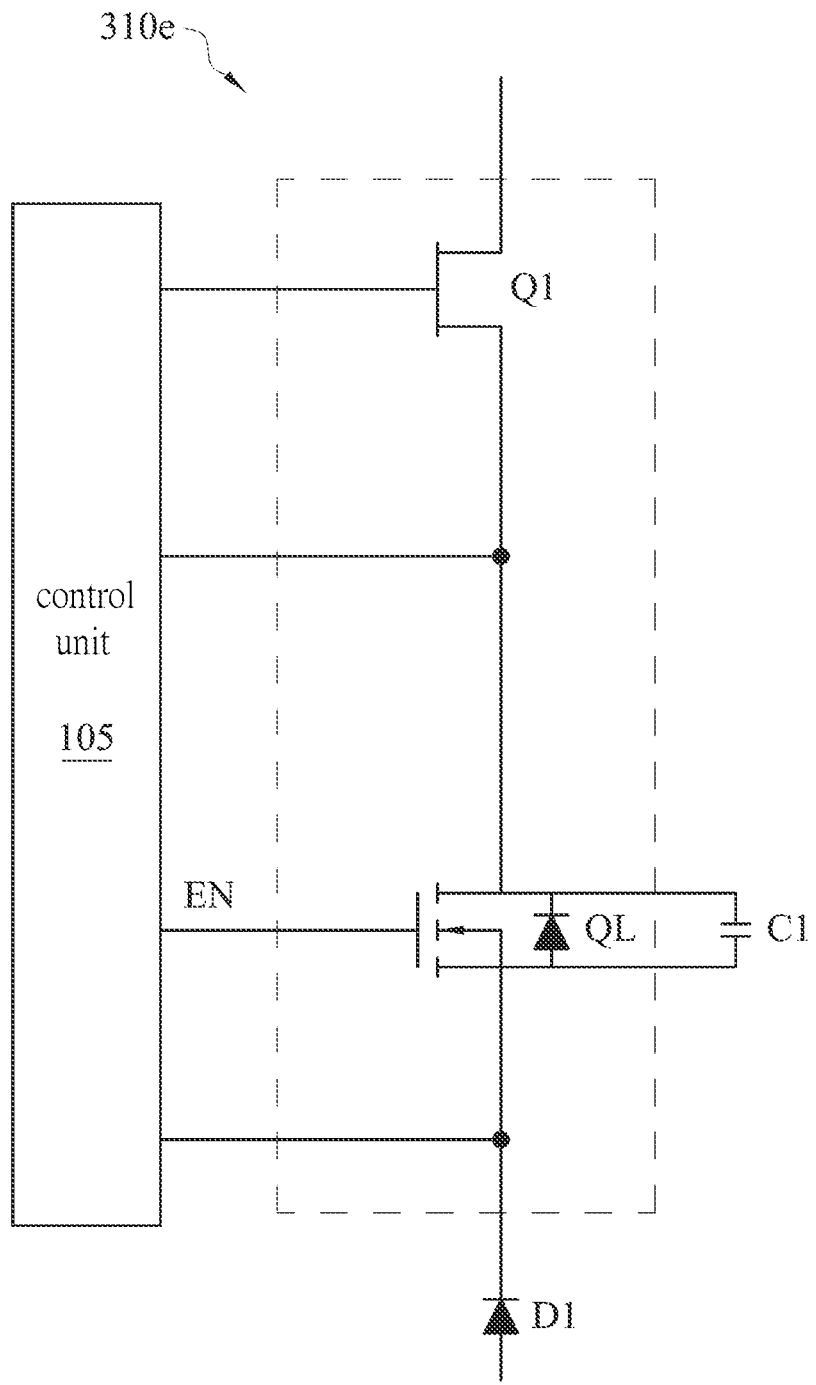
FIG. 4E is a diagram illustrating a quasi-cascade power unit according to a fifteenth exemplary embodiment of the present disclosure.

FIG. 4E is a diagram illustrating a quasi-cascade power unit 310e according to a fifteenth exemplary embodiment of the present disclosure. The quasi-cascade power unit 310e may be applied to the aforementioned conversion unit 301. As shown in FIG. 4E, comparing to FIG. 4D, the difference is that the quasi-cascade power unit 310e not only includes the transistor Q1, the transistor QL, the control unit 105, and the input capacitor C1, but also further includes a diode D1. The cathode of the diode D1 is electrically connected to the source of the transistor QL. The circuit structure illustrated in FIG. 4E may be applied to the buck circuit.

Figure 4F:
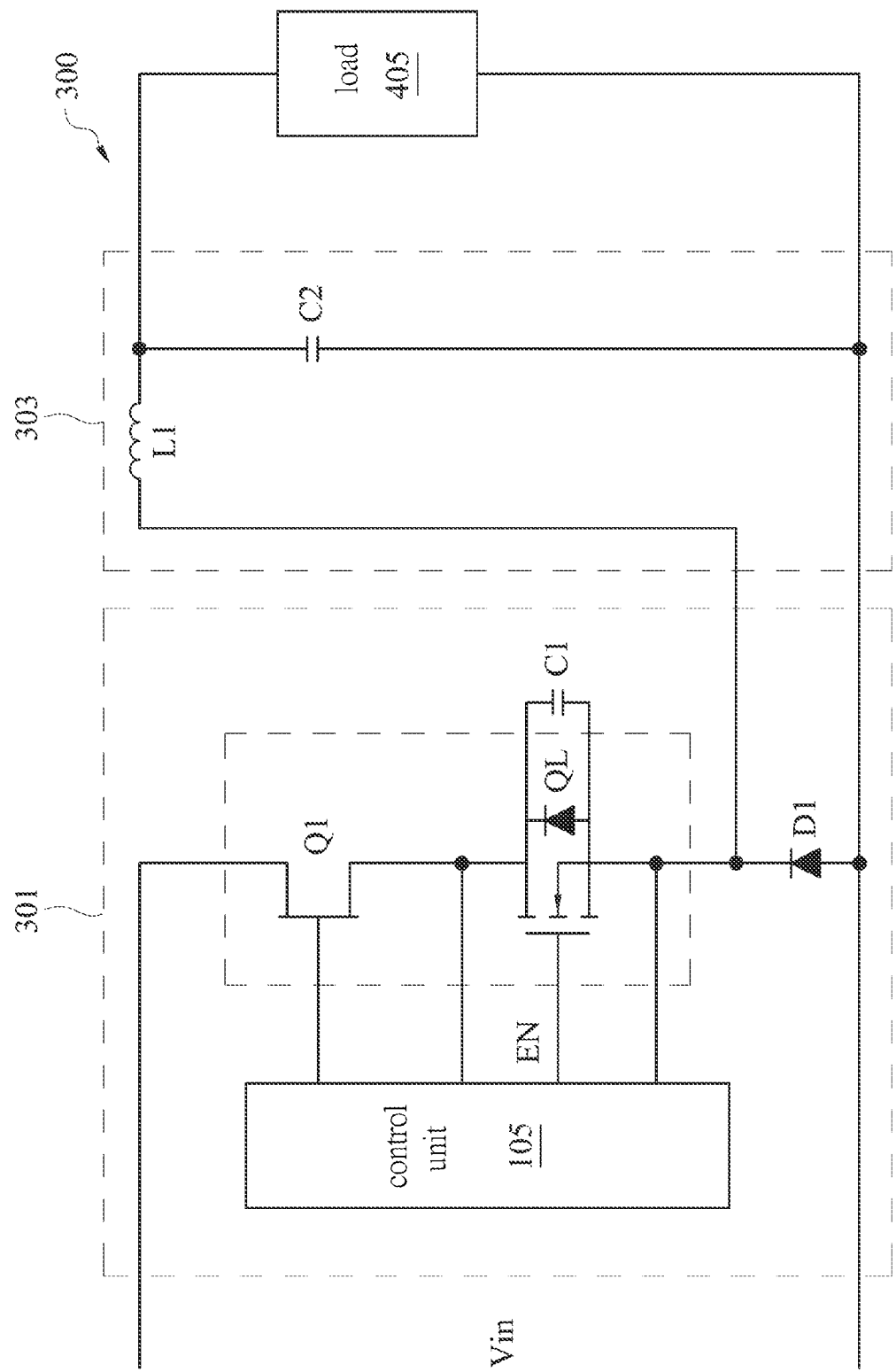
FIG. 4F is a circuit diagram illustrating a power system according to an exemplary embodiment of FIG. 4A.

FIG. 4F is a circuit diagram illustrating a power system 300 according to an exemplary embodiment of FIG. 4A. As shown in FIG. 4F, the voltage adjusting unit 303 includes a capacitor C2 and an inductor L1. The inductor L1 is electrically connected between the capacitor C2 and the source of the transistor QL. When input power source Vin is coupled to the conversion unit 301 of the power system 300, the conversion unit 301 converts the input power source Vin and thereby outputs an inverted voltage. Also, the inverted voltage is adjusted by a voltage adjusting unit 303 formed by the inductor L1 and the capacitor C2, and the voltage adjusting unit 303 outputs the inverted voltage to the load 305.

Figure 4G:
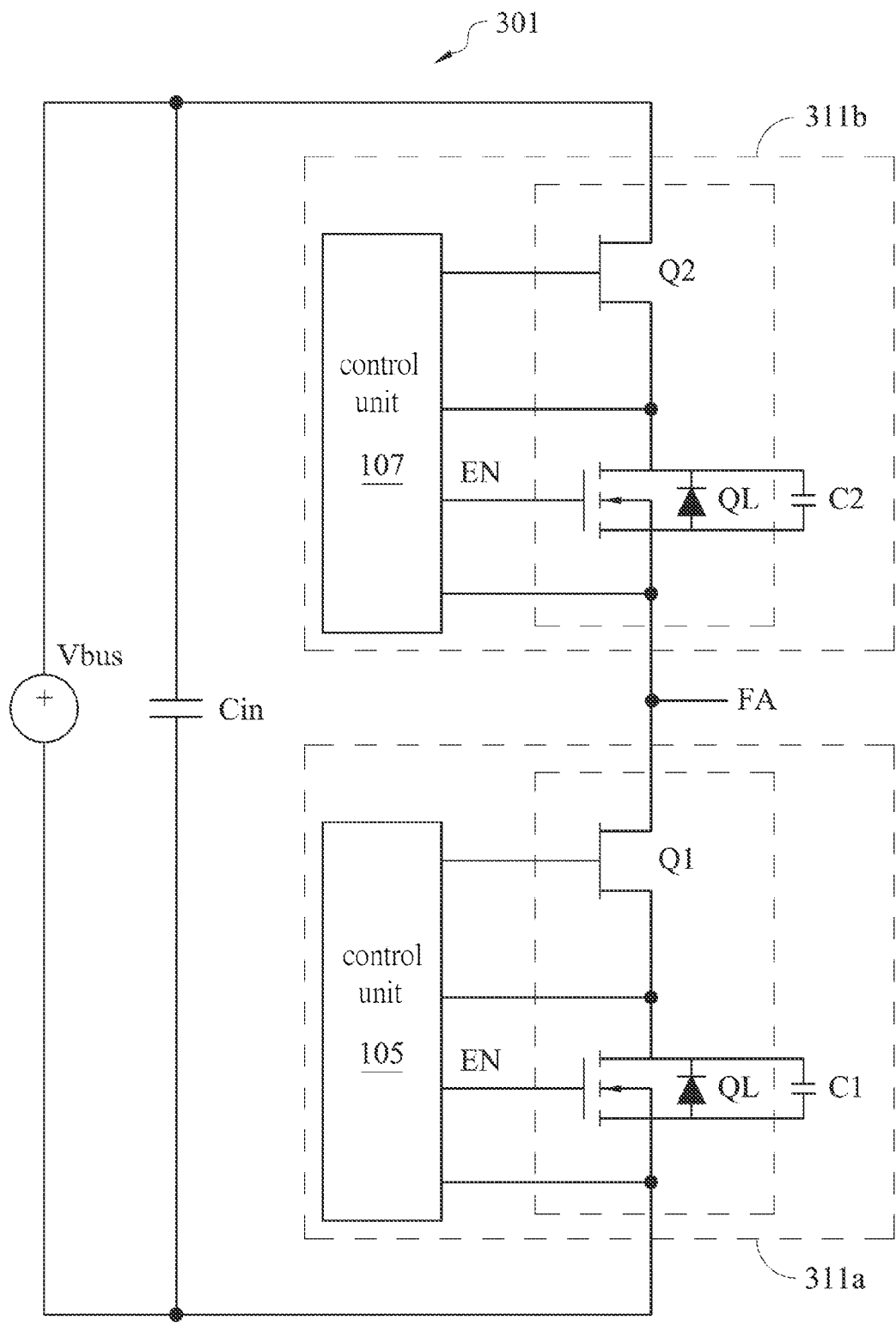
FIG. 4G is a diagram illustrating a conversion unit according to a sixteenth exemplary embodiment of the present disclosure.

FIG. 4G is a diagram illustrating a conversion unit 301 according to a sixteenth exemplary embodiment of the present disclosure. As shown in FIG. 4G; the conversion unit 301 may includes a bridge circuit formed by two quasi-cascade power units are connected in series, and it may further make the input capacitor C1 be electrically connected in parallel between the two ends of the transistor QL1 and make the capacitor C2 be electrically connected in parallel between the two ends of the transistor QL2 so as to reduce the loop inductance.

For instance, the voltage source Vbus is used for providing an input power source Vin, and the input capacitor Cin may be a decoupling capacitor for the voltage source Vbus. The half-bridge circuit includes a quasi-cascade power unit 311a and a quasi-cascade power unit 311b. The input capacitor C1 is coupled between the drain and the source of the transistor QL1 in parallel. In addition, the input capacitor C2 is coupled between the drain and the source of the transistor QL 2 in parallel. The two quasi-cascade structures are coupled in series with a common node FA; the common node FA may be used for connecting to an external circuit.

In addition, in the application of the half-bridge circuit, the source or drain of the transistor QL1 may be served as another connecting common node so as to connect to the external circuit. The input capacitor C1 is electrically connected to the drain and the source of the transistor QL1 in parallel. The capacitance of the input capacitor C1 may preferably be greater than 10 times of the parasitic capacitor between the drain and the source of the transistor QL1. Moreover, the capacitance of the input capacitor C2 may also be greater than 10 times of the parasitic capacitor between the drain and the source of the transistor QL2.

Figure 4H:
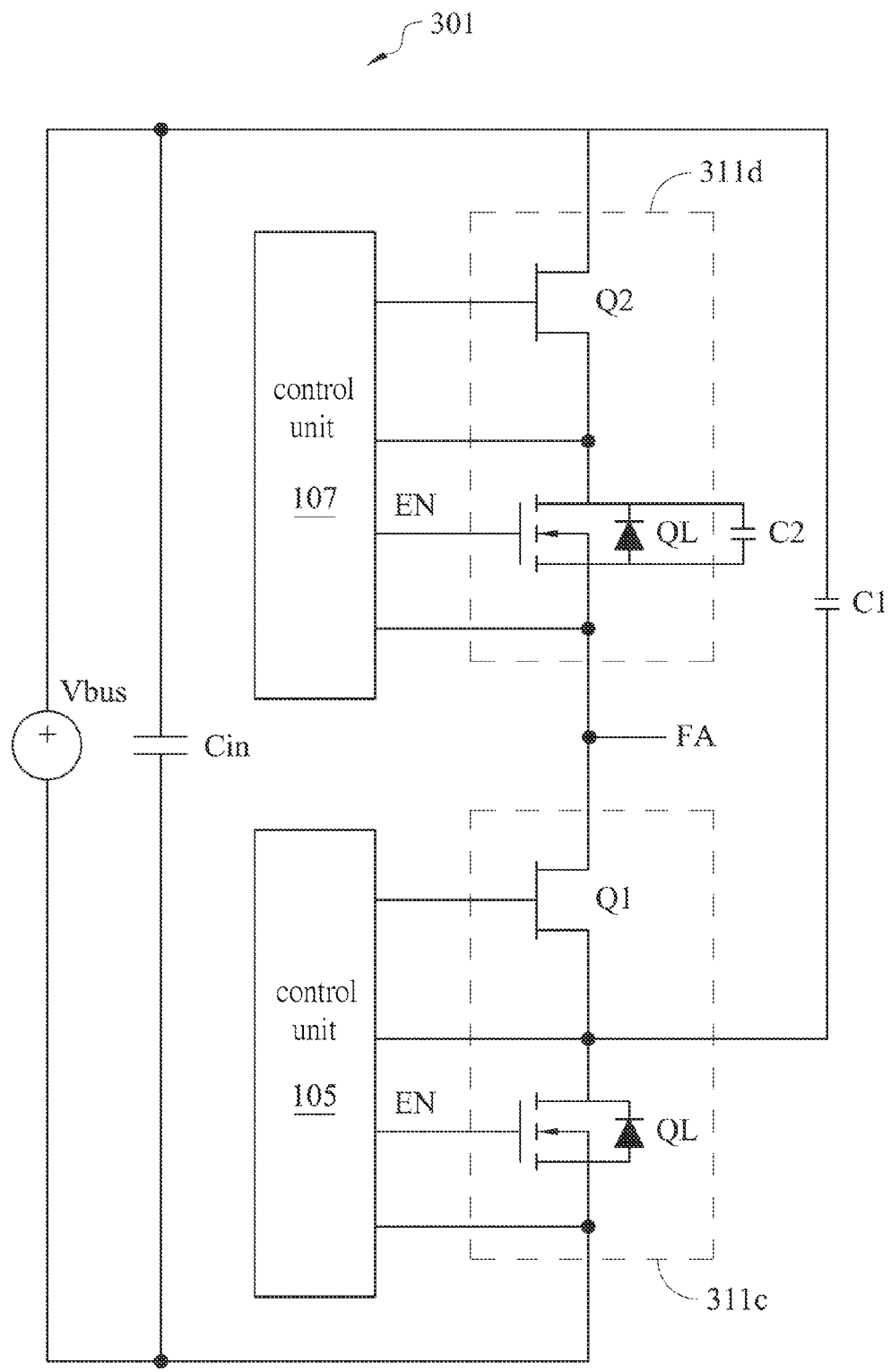
FIG. 4H is a diagram illustrating a conversion unit according to a seventeenth exemplary embodiment of the present disclosure.

FIG. 4H is a diagram illustrating a conversion unit 301 according to a seventeenth exemplary embodiment of the present disclosure. As shown in FIG. 4H, comparing to FIG. 4G, the difference to FIG. 4H is that, in the conversion unit 301, two ends of the input capacitor C1 are coupled to the drain of the transistor Q2 and the source of the transistor Q1, respectively. Specifically, the input capacitor C1 has a first end and a second end, the first end of the input capacitor C1 is electrically connected to the drain of the transistor QL1, the second end of the input capacitor C1 is electrically connected to the drain of the transistor Q2. It is to be noted that, the input capacitor C1 is electrically connected to the capacitor Cin in series, and under such a situation, the input capacitor C1 and the capacitor Cin are electrically connected between the drain and the source of the transistor QL1.

Figure 4I:
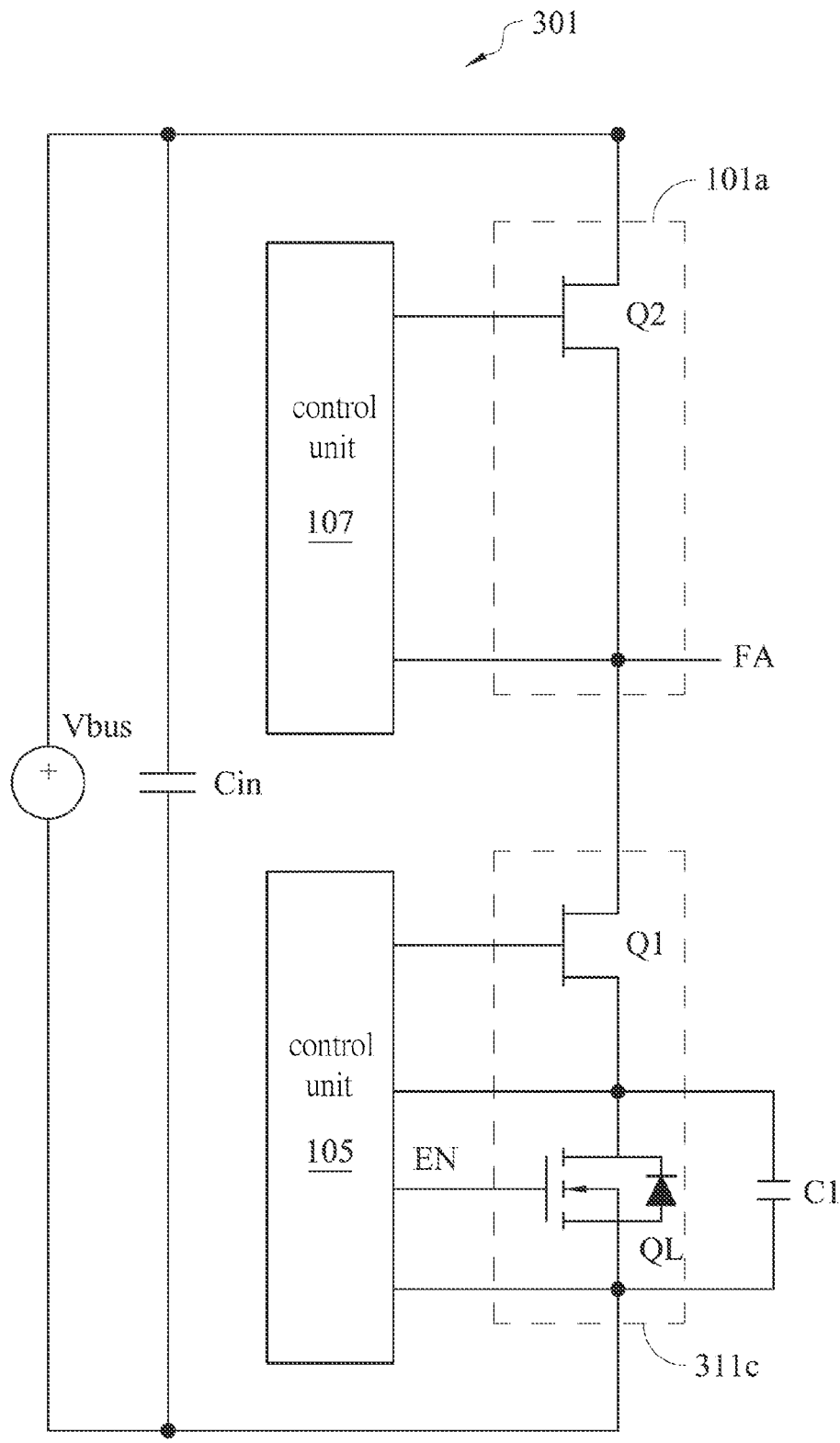
FIG. 4I is a diagram illustrating a conversion unit according to an eighteenth exemplary embodiment of the present disclosure.
Figure 4J:
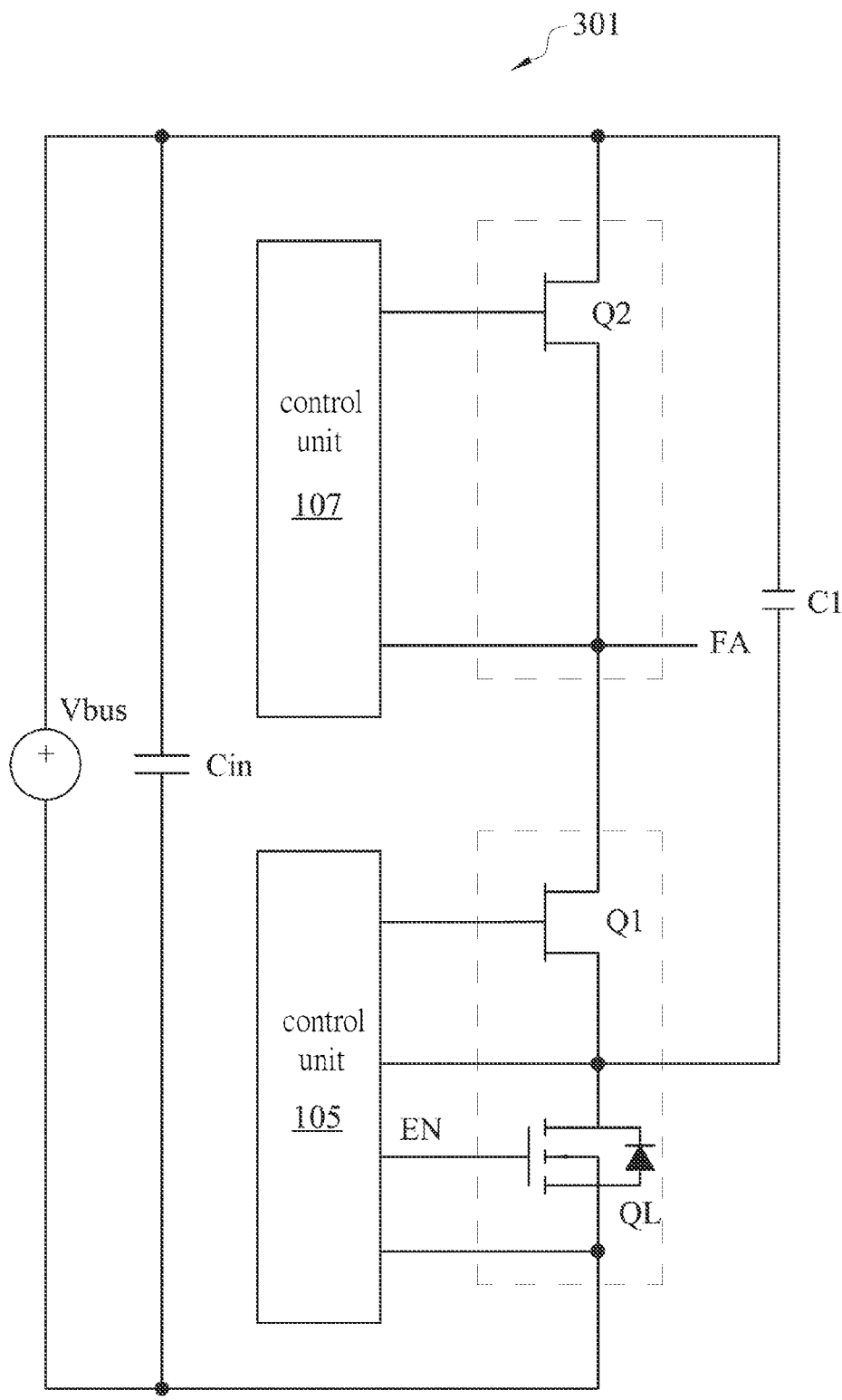
FIG. 4J is a diagram illustrating a conversion unit according to a nineteenth exemplary embodiment of the present disclosure.
Figure 4K:
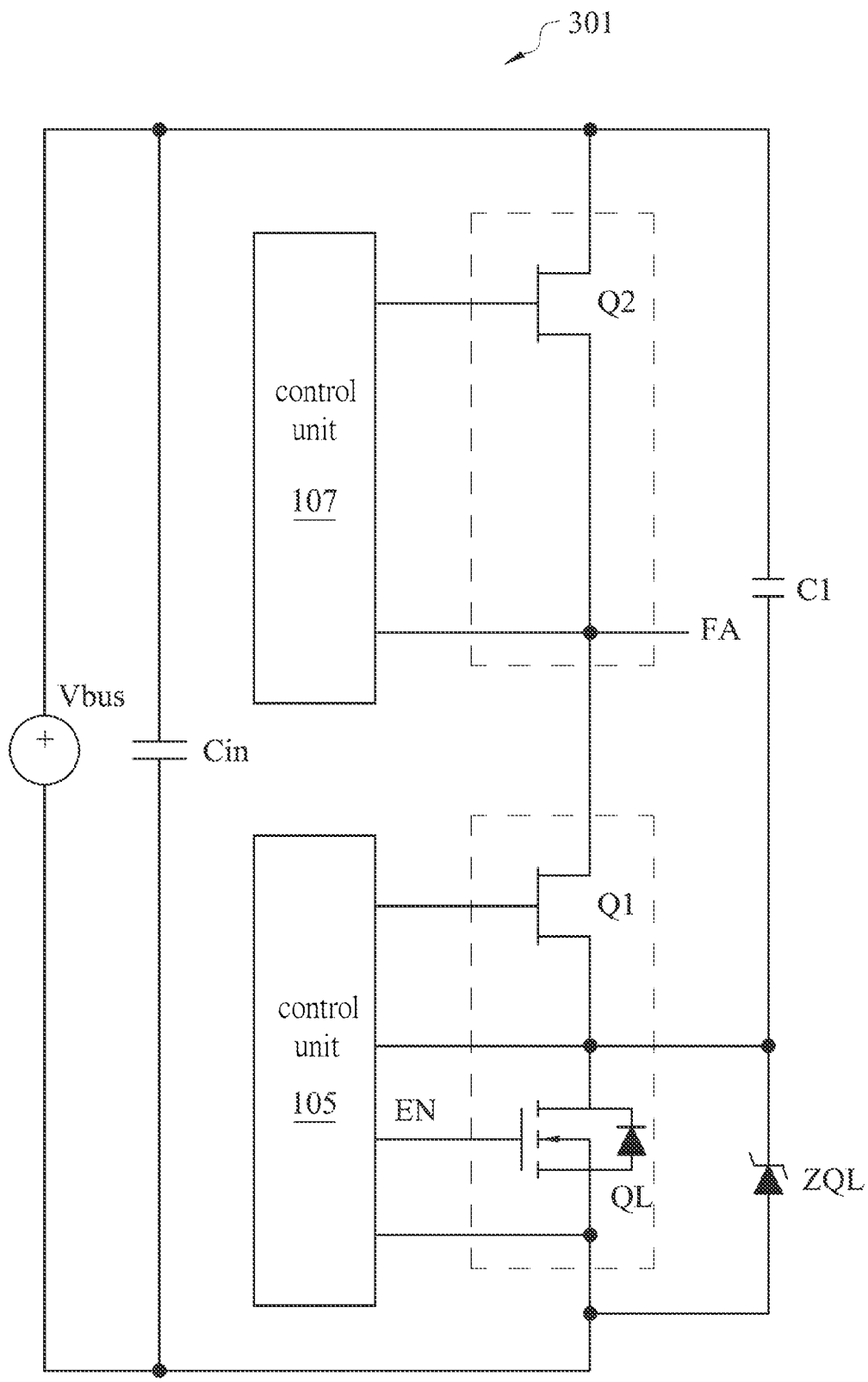
FIG. 4K is a diagram illustrating a conversion unit according to a twentieth exemplary embodiment of the present disclosure.

FIG. 4I is a diagram illustrating a conversion unit 301 according to an eighteenth exemplary embodiment of the present disclosure. As shown in FIG. 4I, comparing to FIG. 4H, the difference of FIG. 4I is that the bridge structure of the conversion unit 301 includes a quasi-cascade structure 311c which is coupled to a normally-on switch 101a in series, wherein the quasi-cascade structure 311c includes a transistor Q1 and a transistor QL, and the normally-on switch 101a includes a transistor Q2. The capacitor C1 is electrically connected to the drain and the source of the transistor QL in the quasi-cascade structure 311c in parallel. The capacitor Cin is a decoupling capacitor of the voltage source Vbus. The transistor Q2 is electrically connected to transistor Q1 in series. The transistor Q2, the transistor Q1 and the transistor QL may form a half-bridge circuit. The source of the transistor Q2 is coupled to the drain of the transistor Q1 with a common node FA for coupling to an external circuit via the common node FA. In the applications of the half-bridge circuit, the source or the drain of the transistor QL may be used as another node for coupling to an external circuit FIG. 4J is a diagram illustrating a conversion unit 301 according to a nineteenth exemplary embodiment of the present disclosure. As shown in FIG. 4J, comparing to FIG. 4I, the difference of FIG. 4J is that two ends of the capacitor C1 are coupled to the drain of the transistor Q2 and the source of the transistor Q1 respectively. Specifically, when the voltage source Vbus is activated, an initial state of the capacitor C1 is a low voltage, and the transistor QL is off. When the voltage of the voltage source Vbus increases, an equivalent impedance of the capacitor C1 is smaller than an turning-off impedance of the transistor QL, and thus the voltage of the voltage source Vbus will drop on the transistor QL, and this may lead to the over voltage danger of the transistor QL. Therefore, in one or more embodiments, the capacitance of the input capacitor C1 should be in a proper range, such as smaller than 10 microfarads (uF). FIG. 4K is a diagram illustrating a conversion unit 301 according to a twentieth exemplary embodiment of the present disclosure. As shown in FIG. 4K, comparing to FIG. 4J, the difference of FIG. 4K is that the conversion unit 301 further includes a zener clamp device ZQL, and the zener clamp device ZQL is electrically connected to the transistor QL in parallel. Specifically, the zener clamp device ZQL may provide an Over Voltage Protection (OVP) of the transistor QL, that is, when the voltage exceeds a certain voltage value, the voltage is clamped so as to restrict the voltage of the transistor QL under a safe value. In other words, by using the zener clamp device ZQL, the transistor QL hence is ensured to work under a reliable voltage.

However, the use of the zener clamp device ZQL may lead to an increased cost of money. For keeping the voltage of the transistor QL to be under s safe range, another way may be to instantaneously detect a cross voltage VDSL between the drain and the source of the transistor QL by the control circuit. When the voltage of the cross voltage VDSL is higher than a certain value, a control signal is provided to the gate of the transistor QL so as to make the transistor QL turn on and to make the cross voltage VDSL at a certain value.

Figure 4L:
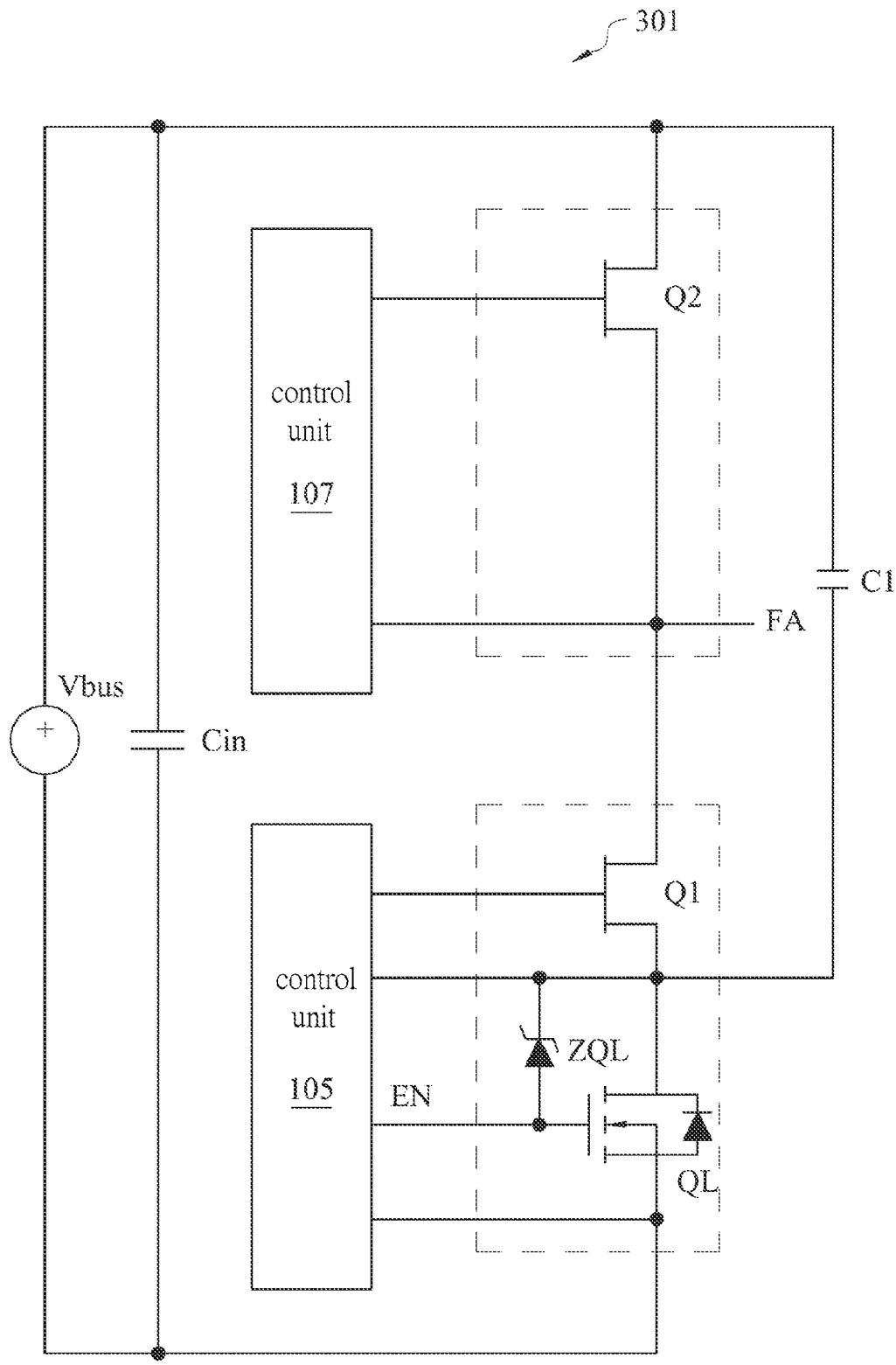
FIG. 4L is a diagram illustrating a conversion unit according to a twenty-first exemplary embodiment of the present disclosure.

FIG. 4L is a diagram illustrating a conversion unit 301 according to a twenty-first exemplary embodiment of the present disclosure. As shown in FIG. 4L; comparing to FIG. 4K, the difference of FIG. 4L is that the zener clamp device ZQL is electrically connected to the gate and the drain of the transistor QL. For instance, when the voltage of the quasi-cascade power unit 310 increases, the cross voltage VDSL between the drain and the source of the transistor QL will be automatically clamped on the stable voltage which equals clamped voltage of the zener clamp device ZQL plus the driving voltage threshold value of the transistor QL.

Figure 4M:
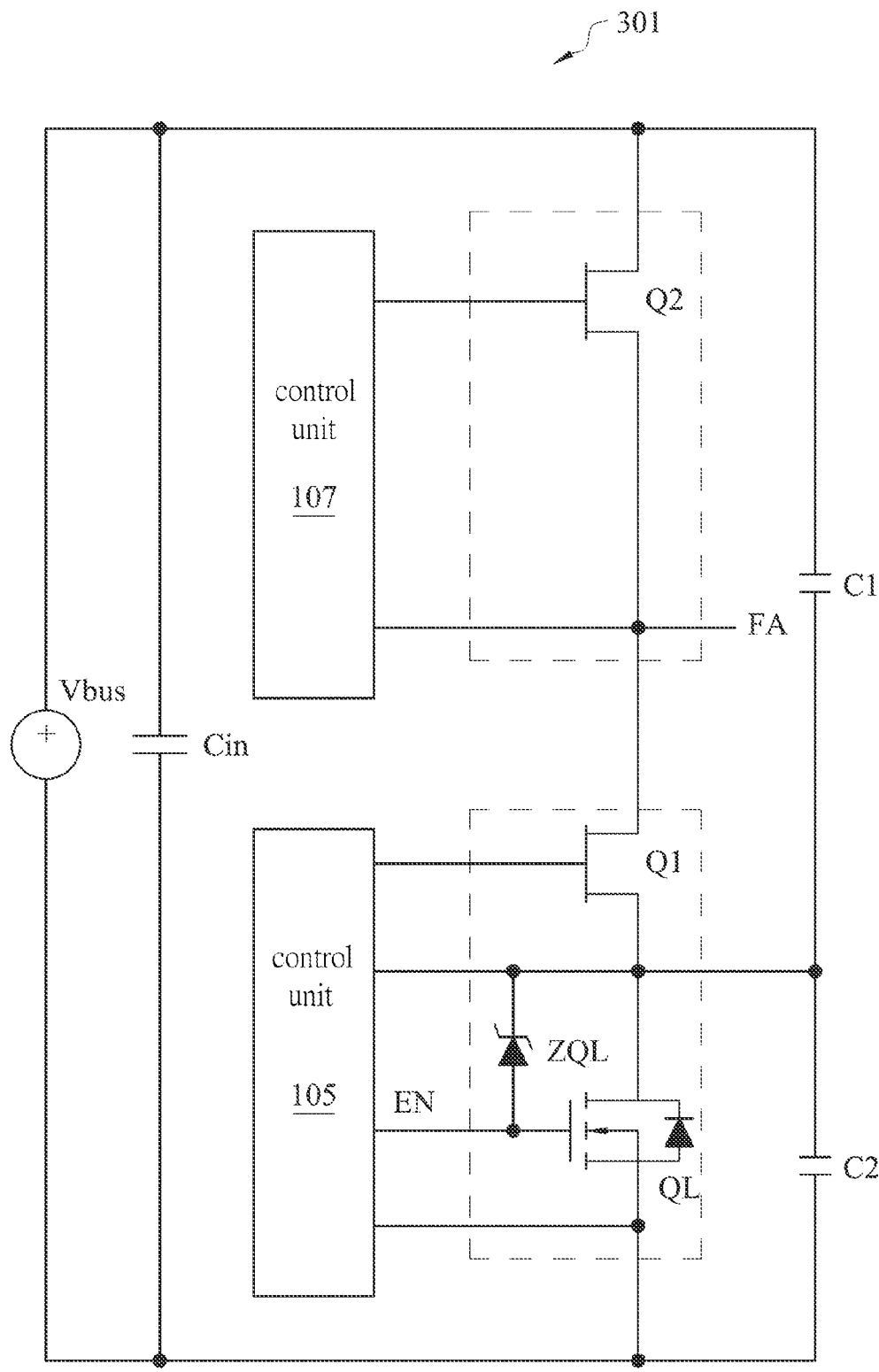
FIG. 4M is a diagram illustrating a conversion unit according to a twenty-second exemplary embodiment of the present disclosure.

FIG. 4M is a diagram illustrating a conversion unit 301 according to a twenty-second exemplary embodiment of the present disclosure. As shown in FIG. 4M, comparing to FIG. 4L, the difference of FIG. 4M is that the conversion unit 301 further includes an input capacitor C2. The input capacitor C2 has a first end and a second end, and the input capacitor C2 is electrically connected to the first end and the second end of the transistor QL in parallel. The transistor QL of the conversion unit 301 is electrically connected to the input capacitor C2 in parallel, to make the voltage of the transistor QL down to a safe range while the input capacitor C2 and the input capacitor Cin share the voltage. The safety of the transistor QL may be ensured by making the capacitance of the parallel connected input capacitor C2 match that of the input capacitor C1.

For instance, supposing the highest operating voltage of the transistor QL is VdsQLmax, it may be ensured that C2>((Vbus−VdsQLmax)/VdsQLmax)*C1, wherein Vbus is the voltage source and VdsQLmax is the highest operating voltage of the transistor QL. However, it should be noted that the electrically connection of the input capacitor C1 may vary, for the use as a voltage divider, and the disclosure is not limited to this.

Figure 4N:
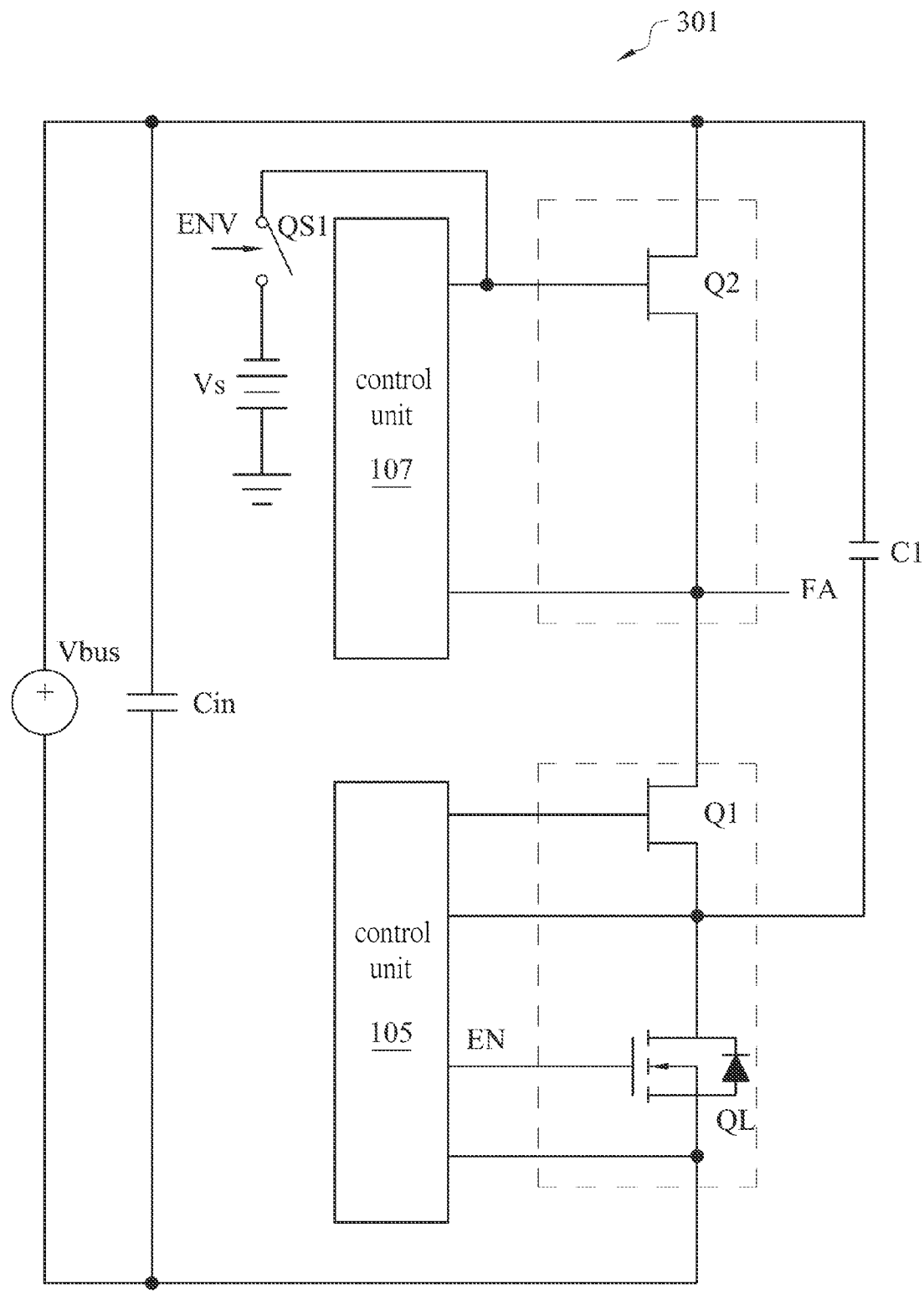
FIG. 4N is a diagram illustrating a conversion unit according to a twenty-third exemplary embodiment of the present disclosure.

FIG. 4N is a diagram illustrating a conversion unit 301 according to a twenty-third exemplary embodiment of the present disclosure. As shown in FIG. 4N; comparing to FIG. 4J, the difference of FIG. 4N is the conversion unit 301 further includes a switch QS1, the switch QS1 is coupled between the gate of the transistor Q2 and the voltage source Vs. The quasi-cascade power unit 310 includes a voltage source Vs, and the voltage source Vs is electrically connected to the gate of the transistor Q1 via the switch QS1. When the On/Off signal EN controls the transistor QL and makes the transistor QL in the off state, the switch QS1 is controlled by the control signal ENV and is in the on state.

Oppositely, the On/Off signal EN controls the transistor QL and makes the transistor QL in the on state, and the transistor QS1 is controlled to turn off by the control signal ENV. In the operations, it mainly uses a high voltage (to ground) of the common node FA to turn off the transistor Q2. In addition, if the voltage source Vs is 0 volt, it is like the situation that the voltage source Vs is short circuited. If the voltage source Vs increases, it will be more conducive to turn off the transistor Q2.

Figure 4O:
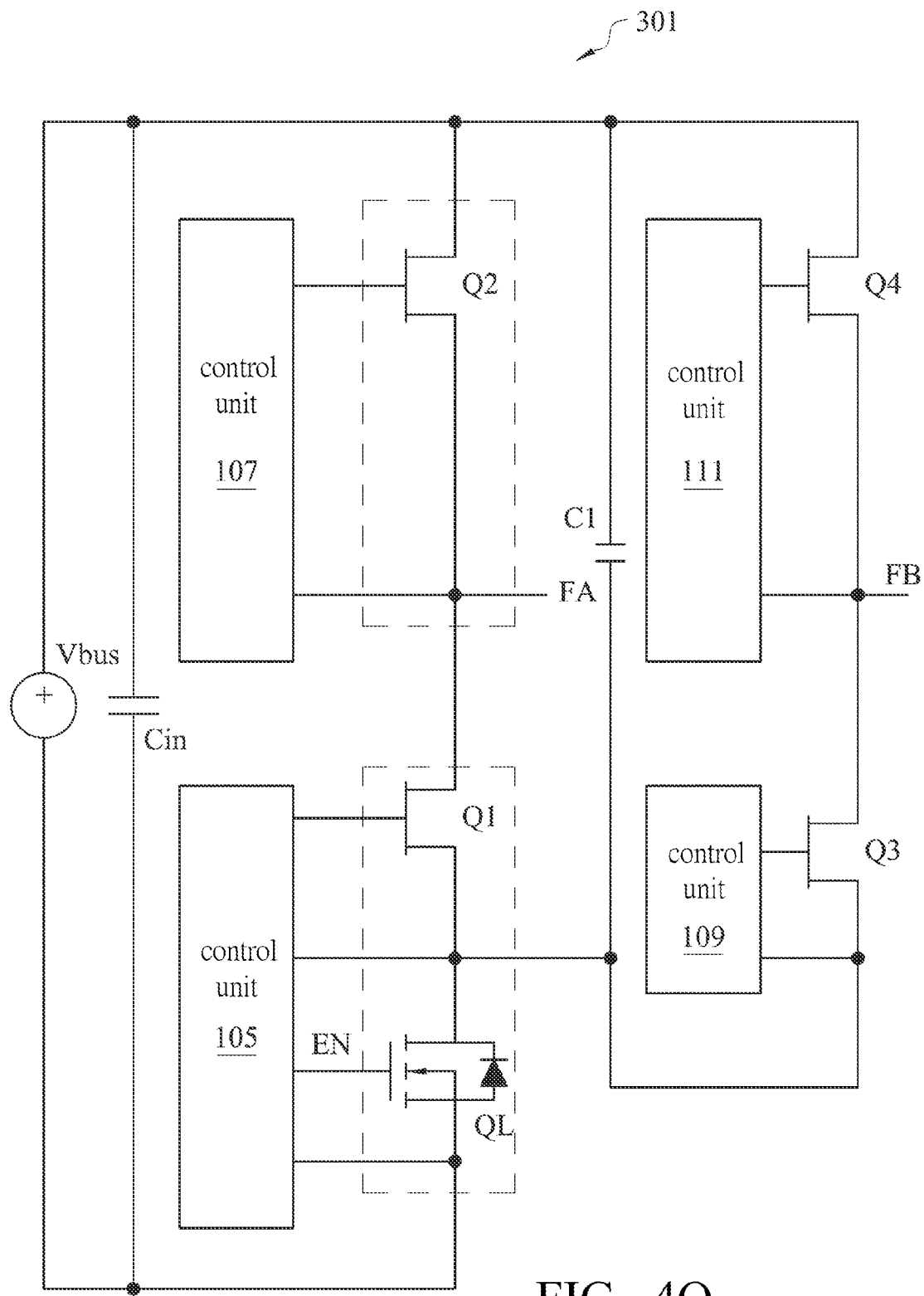
FIG. 4O is a diagram illustrating a conversion unit according to a twenty-fourth exemplary embodiment of the present disclosure.

FIG. 4O is a diagram illustrating a conversion unit 301 according to a twenty-fourth exemplary embodiment of the present disclosure. As shown in FIG. 4O, comparing to FIG. 4J, the difference of FIG. 4O is that the conversion unit 301 includes a full bridge circuit, wherein one bridge arm is formed by normally-on switches. Specifically, the transistor Q3 and the transistor Q4 are connected in series. The drain of the transistor Q3 is electrically connected to the source of the transistor Q4 at the common node FB. The common node FB and the common node FA may jointly connect to the external circuit. The control unit 109 is used for controlling a voltage level between the gate and the source of the transistor Q3, and the control unit 111 is used for controlling a voltage level between the gate and the source of the transistor Q4.

In the operations, each of the two bridge arms may only require one transistor to keep in the OFF state for ensuring the circuit safety. A cross voltage VDSL between drain and the source of the transistor QL will increase when the four transistors Q1, Q2, Q3, and Q4 are in the on state. Supposing the components are consistent, the corresponding gate-off voltages of the transistor Q1 and the transistor Q3 are −25V and −30V, respectively. Then, when the cross voltage VDSL of the transistor QL exceeds 25V, the transistor Q1 will turn off because the gate voltage is −25V. But since the transistor Q3 and the transistor Q4 are still in the on state, the cross voltage VDSL will keep increase to 30V so as to make the transistor Q3 turn off. In this way, the circuit is stable and the function for protecting multiple bridge arms by the low voltage components is achieved. Moreover, the decoupling capacitor such as the input capacitor C1 may also be added into the circuit for affectively reducing the loop inductance.

Figure 5A:
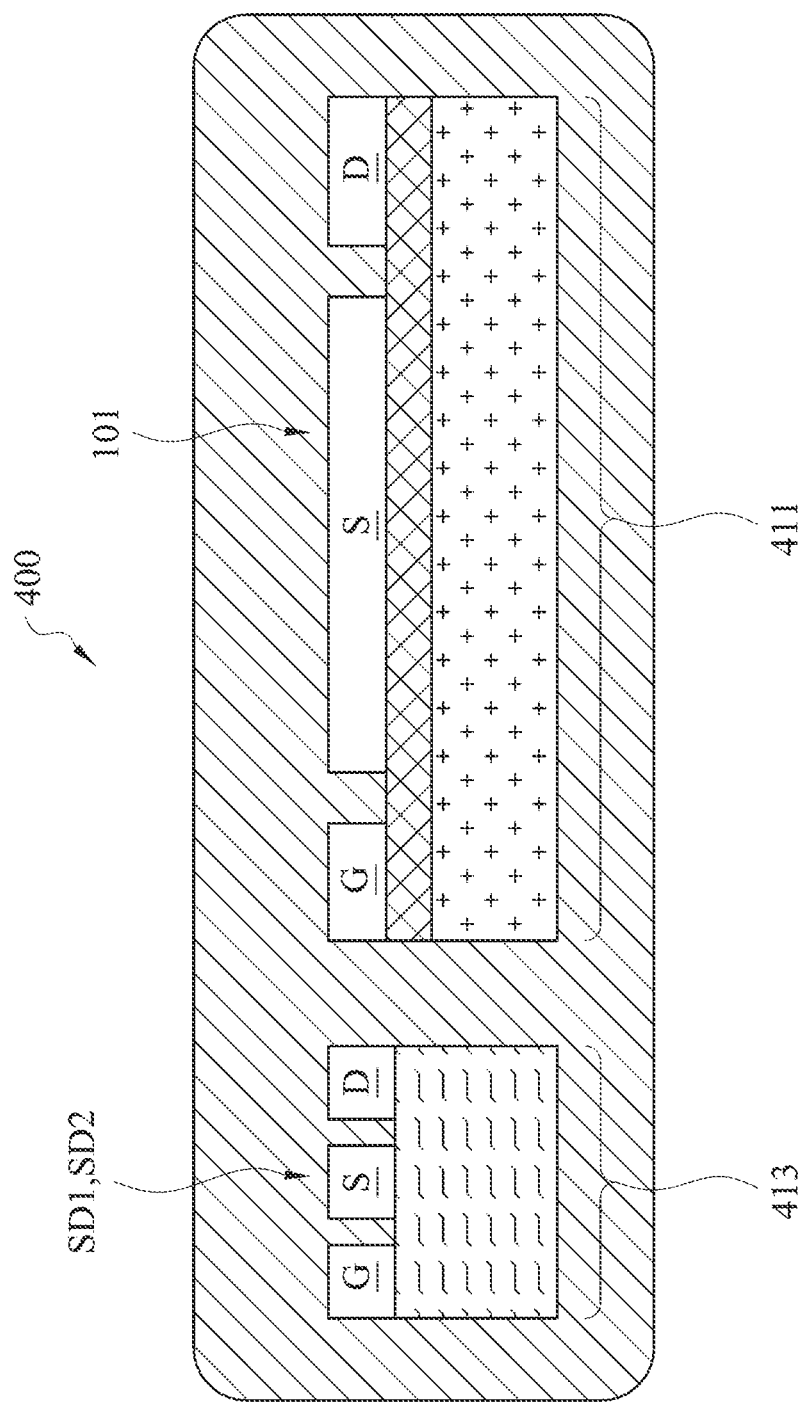
FIG. 5A is illustrating a cross sectional view of a package structure of a power circuit according to a twenty-fifth exemplary embodiment of the present disclosure.

Please refer to FIG. 5A, FIG. 5A is a cross sectional view of a package structure 400 of a power circuit (as shown in FIG. 2F) according to a twenty-fifth exemplary embodiment of the present disclosure.

In this exemplary embodiment, the package structure 400 includes a first normally-off switch SD1, a second normally-off switch SD2 and a normally-on switch 101. The first normally-off switch SD1 includes a source S, a drain D and a gate G, wherein the drain D, the source S and the gate G of the first normally-off switch SD1 are a first end, a second end and a control end of the first normally-off switch SD1, respectively. The drain D of the first normally-off switch SD1 forms a first pin. The second normally-off switch SD2 includes a source S, a drain D and a gate G, wherein the drain D, the source S and the gate G of the second normally-off switch SD2 are a first end, a second end and a control end of the second normally-off switch SD2, respectively. The source S of the second normally-off switch SD2 is electrically connected to the drain D of the first normally-off switch SD1. The gate G of the second normally-off switch SD2 is electrically connected to the gate G of the first normally-off switch SD1 and forms a second pin, and the source S of the second normally-off switch SD2 forms a third pin.

In addition, the normally-on switch 101 comprises the first normally-off switch SD1 and the second normally-off switch SD2. The normally-on switch 101 includes a source S, a drain D and a gate G, wherein the drain D, the source S and the gate G of the normally-on switch 101 are a first end, a second end and a control end of the normally-on switch 101, respectively. The gate G of the normally-on switch 101 is electrically connected to the drain D of the second normally-off switch SD2. The source S of the normally-on switch 101 is electrically connected to the drain D of the first normally-off switch SD1 for forming a fourth pin, and the drain D of the normally-on switch 101 forms a fifth pin. The above first pin, the second pin and the third pin are used for receiving a control signal, respectively, and the above fourth pin and the fifth pin are used for connecting to an external circuit.

As shown in FIG. 5A, the first normally-off switch SD1 and the second normally-off switch SD2 are integrated in a chip 413, and the normally-on switch 101 is integrated in a chip 411. In this way, by integrating the chip 411 and the chip 413 into a package structure, the driving inductive reactance of the driving loop is significantly reduced.

It is to be noted that the first normally-off switch SD1 and the second normally-off switch SD2 may form a totem pole structure. In addition, the normally-on switch 101 may include SiC JFETs or GaN JFETs.

Since the package structure of FIG. 5B-FIG. 5F are similar to the package structure illustrated in FIG. 5A, for the sake of the brevity, only the features of each of the exemplary embodiments that are different to the exemplary embodiment illustrated in FIG. 5A will be described.

Figure 5B:
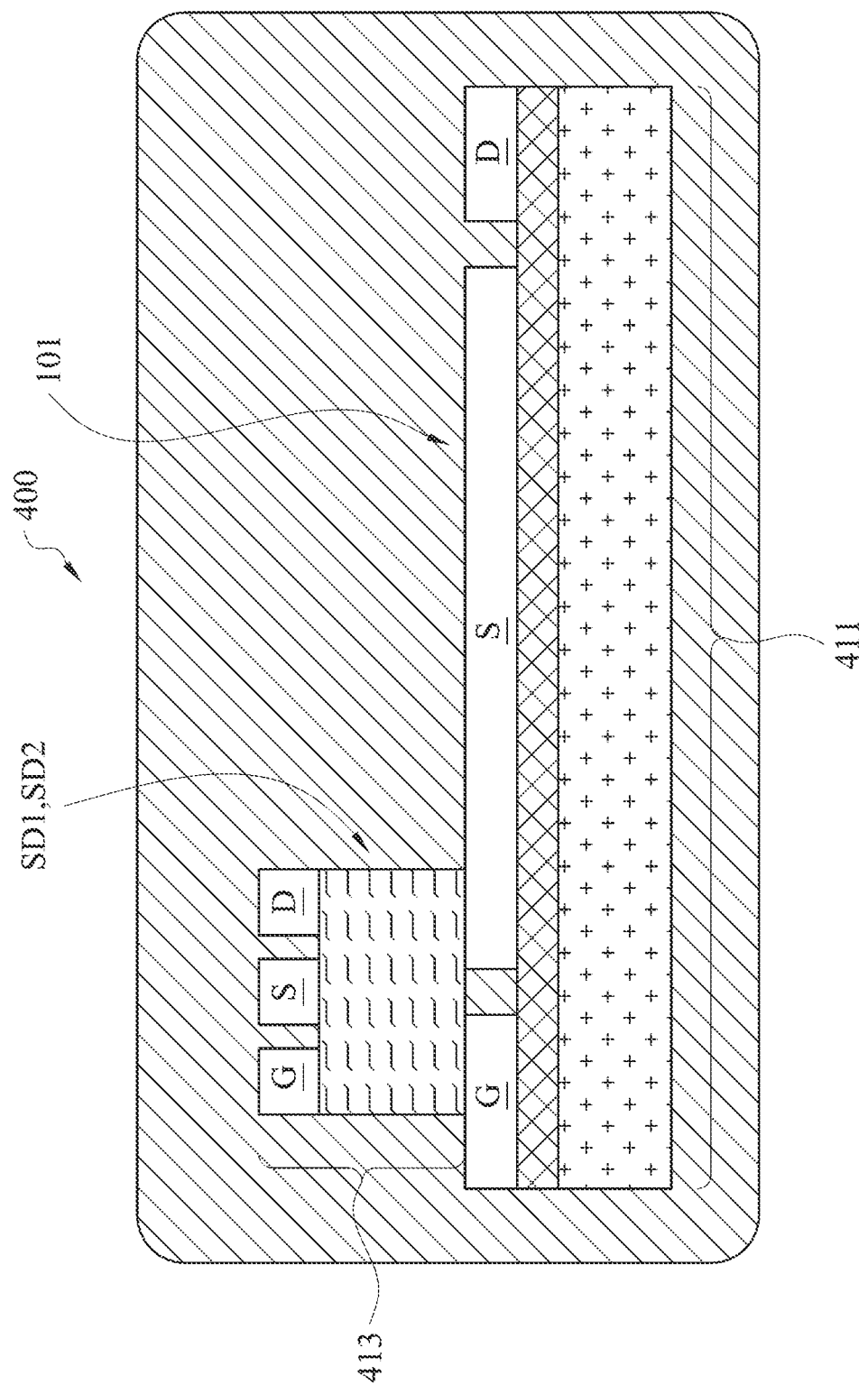
FIG. 5B is a cross sectional view of a package structure of a power circuit according to a twenty-sixth exemplary embodiment of the present disclosure.

Referring to FIG. 5B, FIG. 5B is illustrating a cross sectional view of a package structure 400 of a power circuit according to a twenty-sixth exemplary embodiment of the present disclosure. As shown in FIG. 5B, comparing to FIG. 5A, the difference to FIG. 5B is that the chip 413 is stacked on the chip 411. In this way, the loop effect due to the arrangement space of the chip 411 and the chip 413 is hence reduced.

Figure 5C:
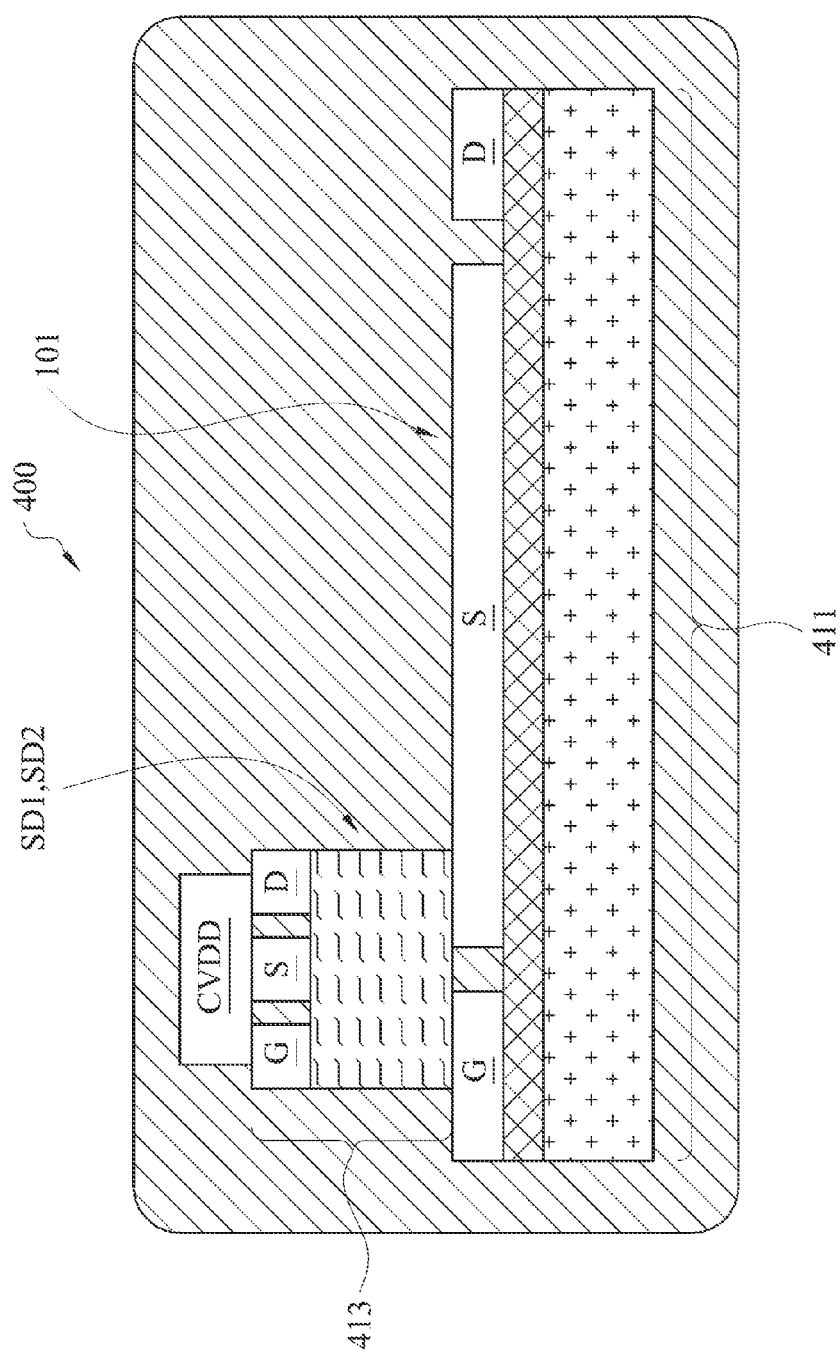
FIG. 5C is a cross sectional view of a package structure of a power circuit according to a twenty-seventh exemplary embodiment of the present disclosure.

Referring to FIG. 5C, FIG. 5C is illustrating a cross sectional view of a package structure 400 of a power circuit according to a twenty-seventh exemplary embodiment of the present disclosure. As shown in FIG. 5C, comparing to FIG. 5B, the difference to FIG. 5C is that the package structure 400 further includes an input capacitor CVDD. The input capacitor CVDD is stacked on the chip 413. Thus, loop effect of the totem pole is hence reduced.

Figure 5D:
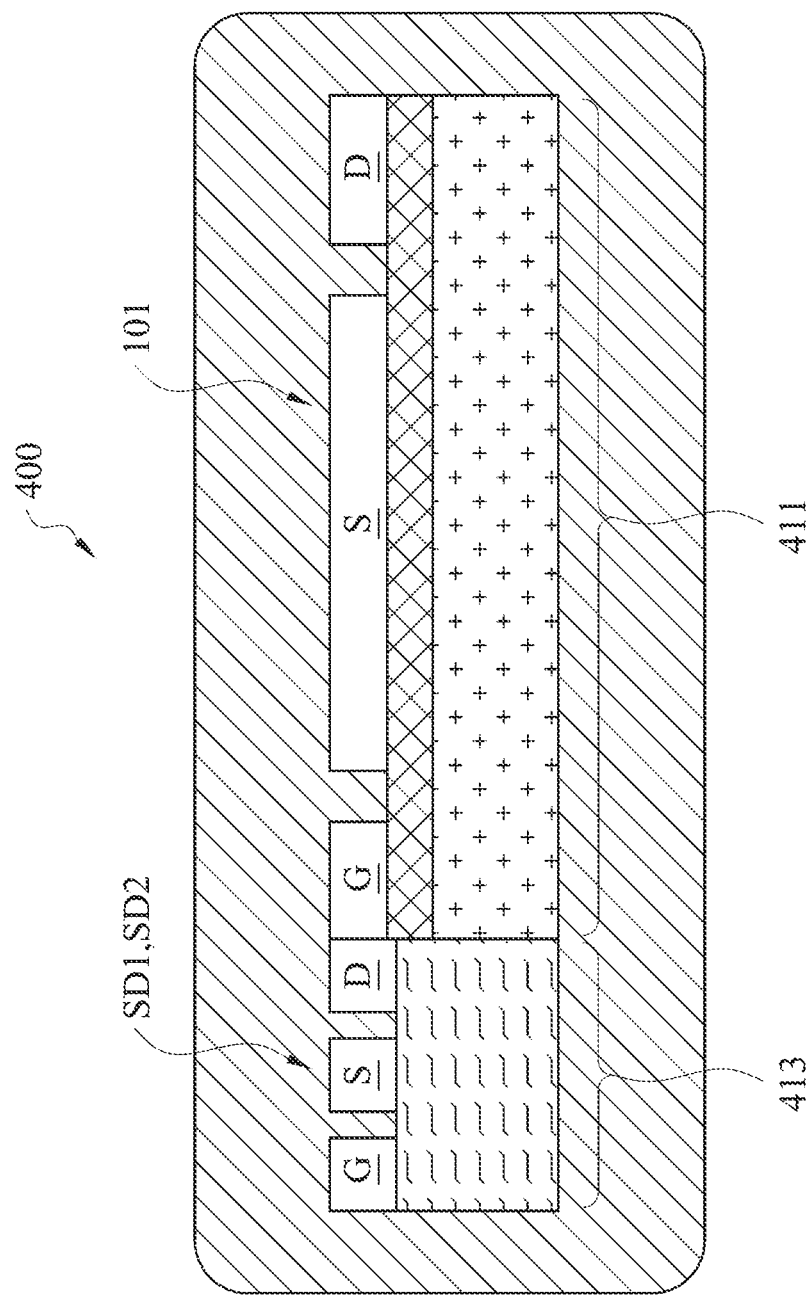
FIG. 5D is a cross sectional view of a package structure of a power circuit according to a twenty-eighth exemplary embodiment of the present disclosure.

Referring to FIG. 5D, FIG. 5D is illustrating a cross sectional view of a package structure 400 of a power circuit according to a twenty-eighth exemplary embodiment of the present disclosure. As shown in FIG. 5D, comparing to FIG. 5A, the difference to FIG. 5D is that the first normally-off switch SD1 and the second normally-off switch SD2 are integrated as a semiconductor structure, and the said semiconductor structure and the normally-on switch 101 are integrated into a integrated circuit chip.

Figure 5E:
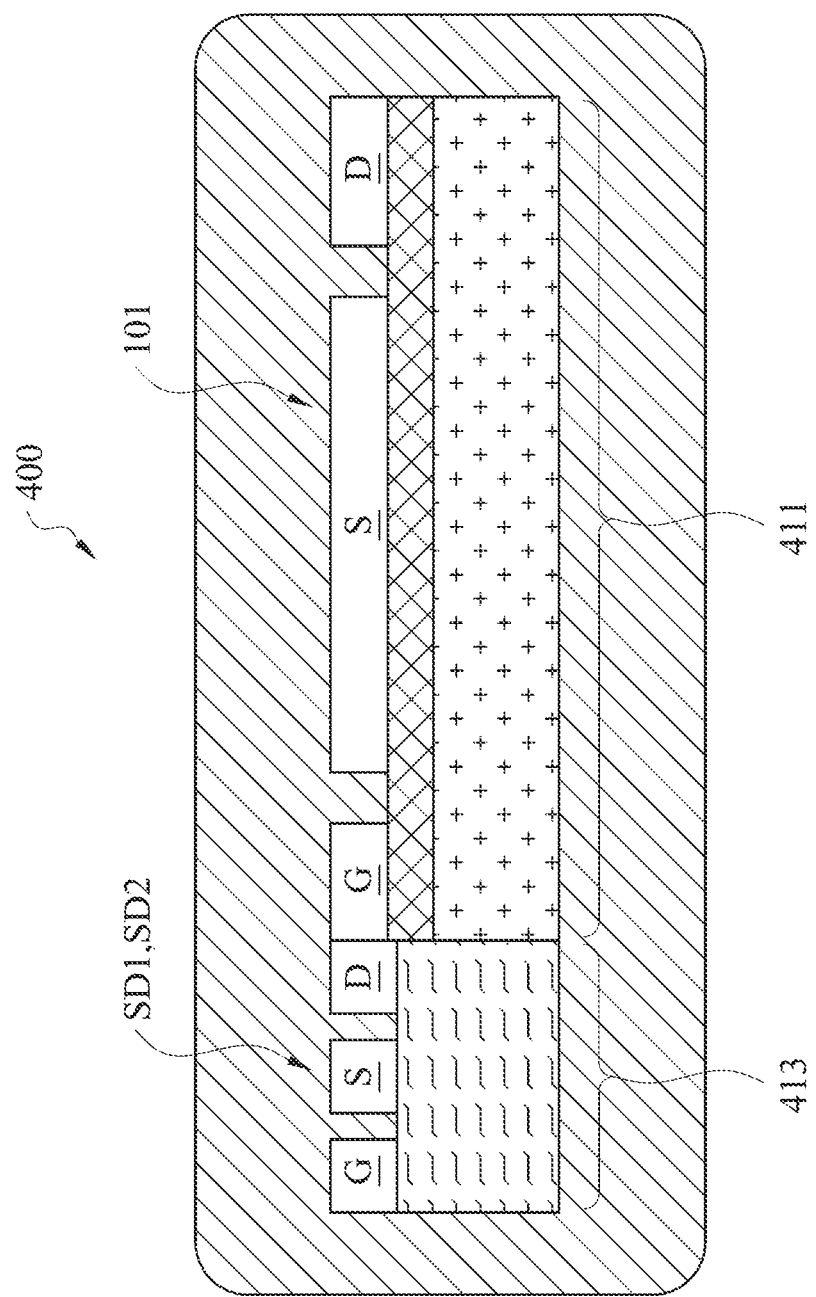
FIG. 5E is illustrating a cross sectional view of a package structure of a power circuit according to a twenty-ninth exemplary embodiment of the present disclosure.

Referring to FIG. 5E, FIG. 5E is illustrating a cross sectional view of a package structure 400 of a power circuit according to a twenty-ninth exemplary embodiment of the present disclosure. As shown in FIG. 5E, comparing to FIG. 5D, the difference to FIG. 5E is that the aforementioned semiconductor structure includes SiC transistor(s), Si transistor(s) or GaN transistor(s). In this way, the said semiconductor structure herein may be made on the same chip as the chip 411 of the normally-on switch 101, and it is allowed to make the combinations of the Si driving totem pole, or the combinations of totem pole of the normally-off wide bandgap material (such as SiC or GaN) on the chip 411.

Figure 5F:
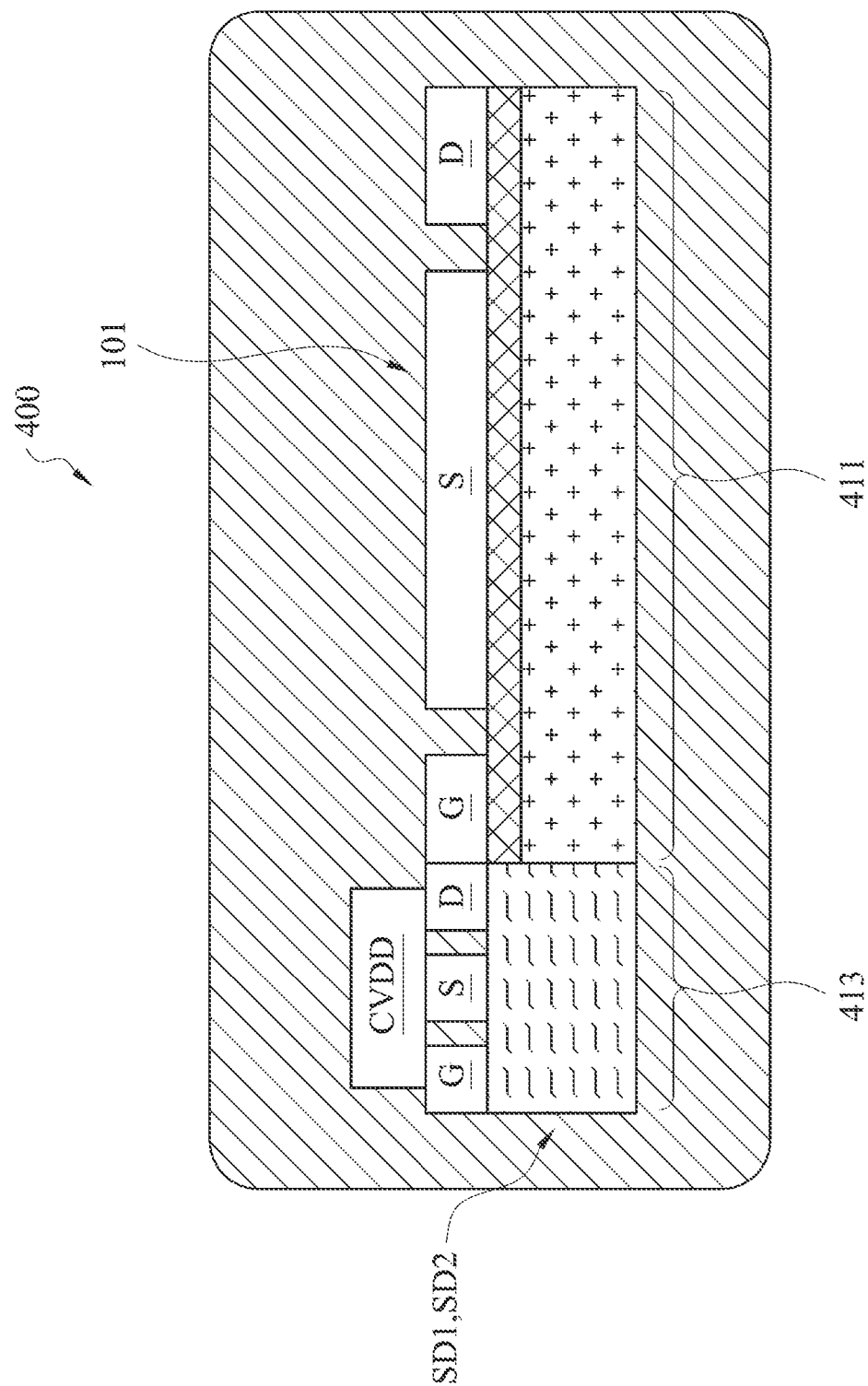
FIG. 5F is illustrating a cross sectional view of a package structure of a power circuit according to a thirtieth exemplary embodiment of the present disclosure.

Referring to FIG. 5F, FIG. 5F is illustrating a cross sectional view of a package structure 400 of a power circuit according to a thirtieth exemplary embodiment of the present disclosure. As shown in FIG. 5F, comparing to FIG. 5E, the difference to FIG. 5F is that the package structure 400 further includes an input capacitor CVDD, and the input capacitor CVDD is stacked on the aforementioned semiconductor structure. In this way, better driving performance is achieved so as to make the GaN component succeed better high frequency characteristics.

From the above descriptions, the exemplary embodiments illustrated in FIG. 5D~FIG. 5F may be achieved by the manufacture of the semiconductor structure without the existence of the package structure.

In short, the aforementioned totem pole and the normally-on switch 101 may be integrated into a package structure, or the aforementioned totem pole may be stacked on the package structure, or it is allowed to directly integrate the totem pole of the normally-off switches SD1 and SD2 on the same chip where the chip of the normally-on switch 101 is. The inductive reactance of the driving loop may be reduced by integrating the combinations of the totem pole and the GaN chip of the controlled normally-on switch 101 into a single package structure. Moreover, the combinations may also be directly stacked on the GaN chip of the controlled normally-on switch 101 so as to avoid the driving inductive reactance of the driving loop caused by the arrangement space of the two chips. Furthermore, it is also allowed to stack the input capacitor CVDD on the combinations so as to further effectively reduce the inductive reactance of the driving loop of the totem pole.

Figure 6A:
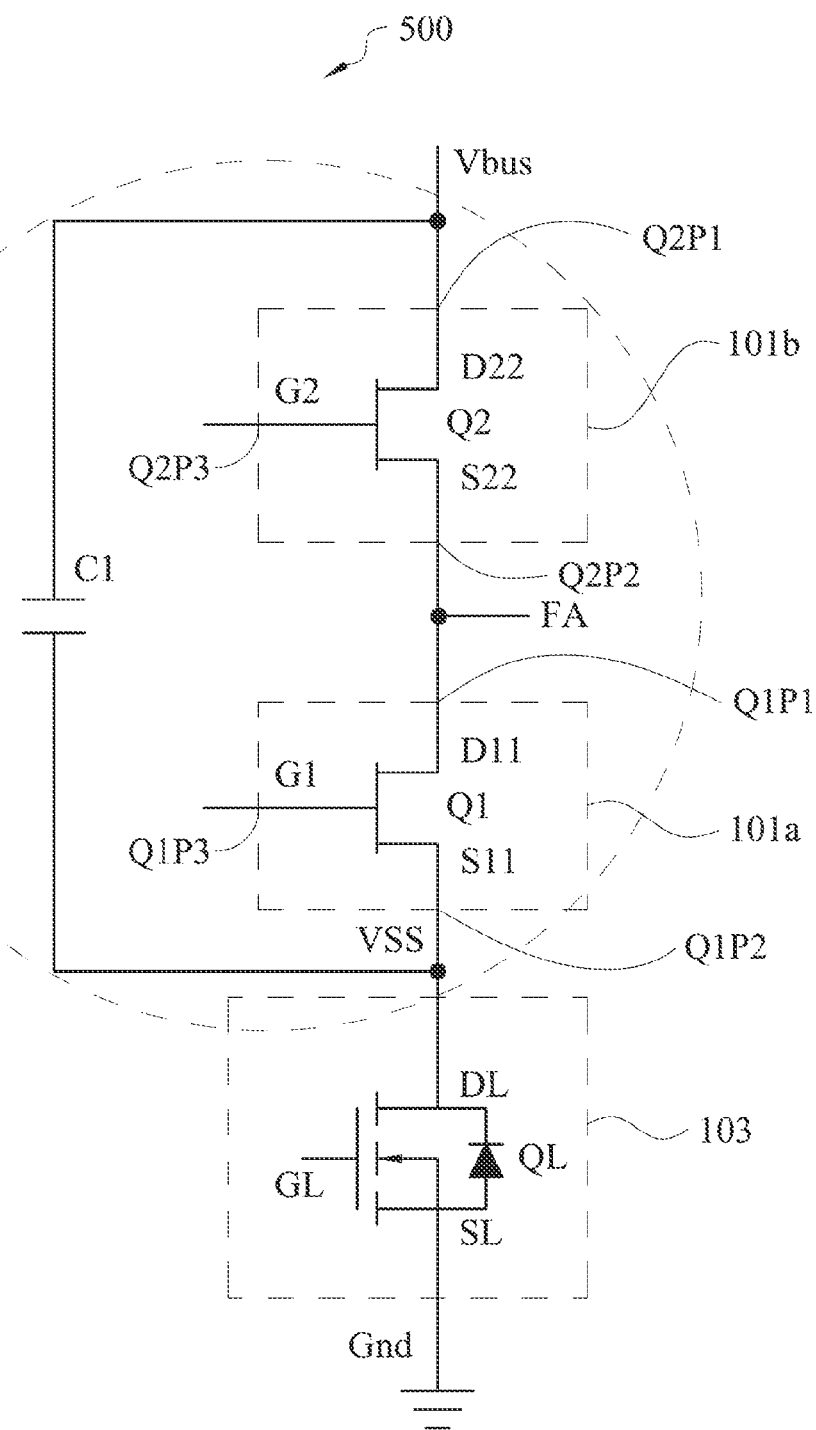
FIG. 6A is illustrating a power circuit according to a thirty-first exemplary embodiment of the present disclosure.

Referring to FIG. 6A, FIG. 6A is a power circuit 500 according to a thirty-first exemplary embodiment of the present disclosure.

For the conventional series structure and the bridge arm formed by quasi-cascade structure which has not been optimized, since there are always Si transistor(s) existing between the two plenary GaN transistors, complex performance is needed for the connection between the components formed on the package structure by different technologies. The quasi-cascade structure circuits disclosed in the aforementioned embodiments of the present disclosure are optimized, and in a plurality of the exemplary embodiments, the bridge arm is formed by two GaN components connecting in series, and it is allowed to be directly connected to the decoupling capacitors to form a shortest loop with no other components in between.

As shown in FIG. 6A, the power circuit 500 includes a quasi-cascade structure formed by a normally-on switch 101b (i.e., the transistor Q2), a normally-on switch 101a (i.e., the transistor Q1) and a normally-off switch 103 (I.e., the transistor QL) and an input capacitor C1. The normally-on switch 101a includes a first end Q1P1, a second end Q1P2 and a control end Q1P3; the normally-on switch 101a and the normally-off switch 103 are connected in series to form a quasi-cascade structure. The normally-on switch 101b includes a first end Q2P1, a second end Q2P2, and a control end Q2P3. The second end Q2P2 of the normally-on switch 101b is electrically connected to the first end Q1P1 of the normally-on switch 101a. In addition, the input capacitor C1 includes a first end and a second end. The first end of the input capacitor C1 is electrically connected the first end Q2P1 of the normally-on switch 101b, and the second end of the input capacitor C1 is electrically connected to the second end Q1P2 of the normally-on switch 101a.

The quasi-cascade structure formed by the normally-off switch 103 and the normally-on switch 101a is electrically connected to the normally-on switch 101b in a series connection, thereby forming a bridge arm; the second end Q2P2 of the normally-on switch 101b is electrically connected to the first end Q1P1 of the normally-on switch 101a at a common node FA, and the common node FA is electrically connected to an external circuit. In an application of the half-bridge circuit, the source SL or the drain DL of the normally-off switch 103 may be used as another connection node, to connect with the external circuit. The quasi-cascade structure circuits disclosed in the aforementioned embodiments of the present disclosure are optimized time and time again, and in a plurality of the exemplary embodiments, the bridge arm is formed by two GaN components connect in series, and it is allowed to be directly connected to the decoupling capacitors to form a shortest loop with no other components in between.

Figure 6B:
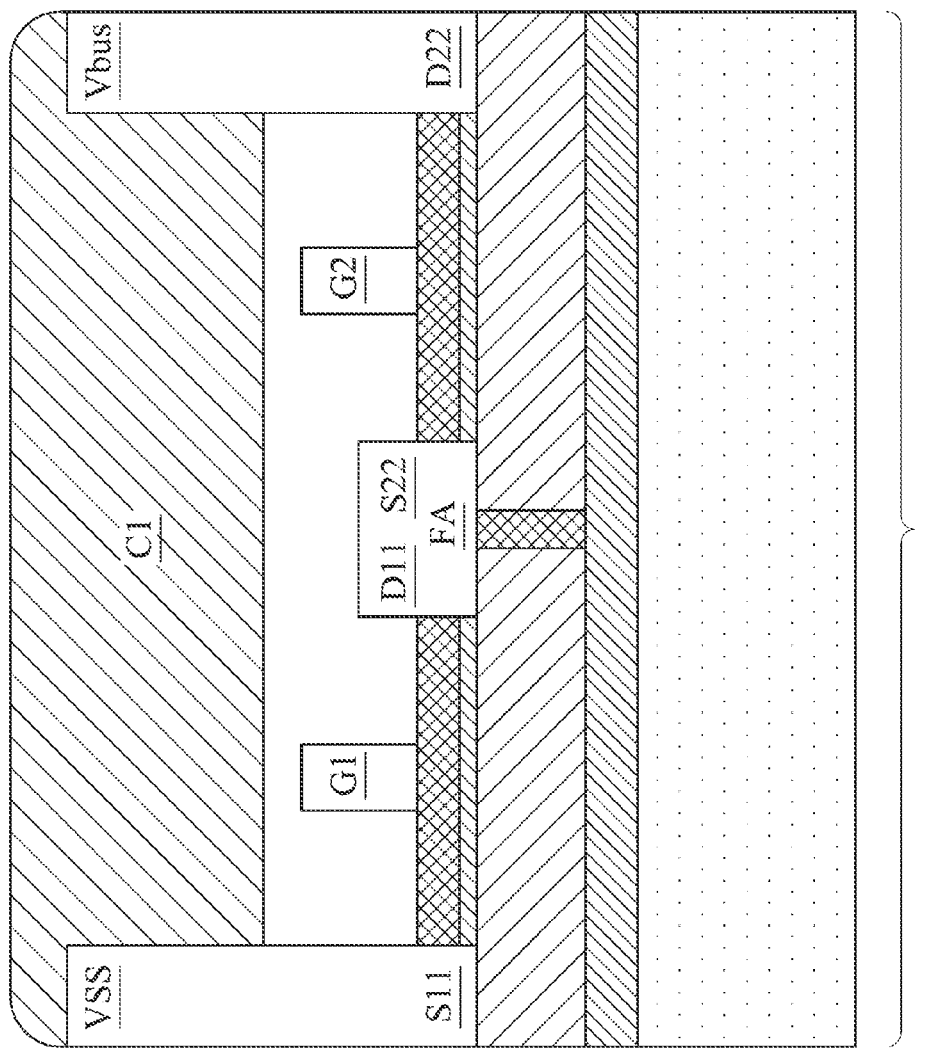
FIG. 6B is illustrating a cross-sectional view of a package structure of a power circuit according to FIG. 6A.

Referring to FIG. 6B, FIG. 6B is a cross-sectional view of a package structure of a power circuit 500 in FIG. 6A.

In this exemplary embodiment, as shown in FIG. 6B, the normally-on switch 101a and the normally-on switch 101b of the power circuit 500 are integrated in and arranged right next each other in an integrated circuit chip 511. The normally-on switch 101a and the normally-on switch 101b include a transistor Q1 and a transistor Q2, respectively. The control end Q2P3 of the normally-on switch 101b forms a first pin, and the first end Q1P1 of the normally-on switch 101a is electrically connected to the second end Q2P2 of the normally-on switch 101b to form a second pin. The control end Q1P3 of the normally-on switch 101a forms a third pin, and the first end of the input capacitor C1 is electrically connected to the first end Q2P1 of the normally-on switch 101b to form a fourth pin. The second end of the input capacitor C1 is electrically connected to the second end Q1P2 of the normally-on switch 101a to form a fifth pin. In one embodiment, the aforementioned first pin and the third pin are used for receiving a first control signal and a second control signal respectively, and the aforementioned second pin, the fourth pin and the fifth pin are used for connecting to an external circuit.

In addition, the quasi-cascade structure formed by the transistor QL and the transistor Q1 is electrically connected to the transistor Q2 in series so as to form a bridge arm. An end of the input capacitor C1 is electrically connected to the drain D22 of the transistor Q2, and another end of the input capacitor C1 is electrically connected to the source S11 of the transistor Q1. The source S22 of the transistor is electrically connected to the drain D11 of the transistor Q1 at a common node FA, wherein the common node FA is connected to an external circuit. In addition, in the application of the half-bridge circuit, the source SL or drain DL of the transistor QL may be served as another connecting common node so as to connect to the external circuit.

For instance, since the GaN components are with plenary structures, the GaN components of the bridge arm therefore may be made in a single chip, and the GaN components are arranged right next to each other. In addition, it is allowed to make the source of the transistor Q2 to be directly electrically connected to the drain of the transistor Q1

Moreover, the input capacitor C1 is stacked on the integrated circuit chip 511. For instance, the input capacitor C1 may be arranged nearby integrated circuit chip 511, and the first end of the input capacitor C1 is directly electrically connected to the drain of the transistor Q2 to form a fourth pin and connect to the voltage source Vbus, so as to make the inductance almost zero which is caused by the connections. Similarly, the source of the transistor Q1 is electrically connected to the second end of the input capacitor C1, and then forms a fifth pin and connect to the voltage source VSS. A corresponding inductance caused by the connections is almost zero. Therefore, the loop effects cause by the transistor Q1, the transistor Q2 and the input capacitor C1 are very small.

Figure 6C:
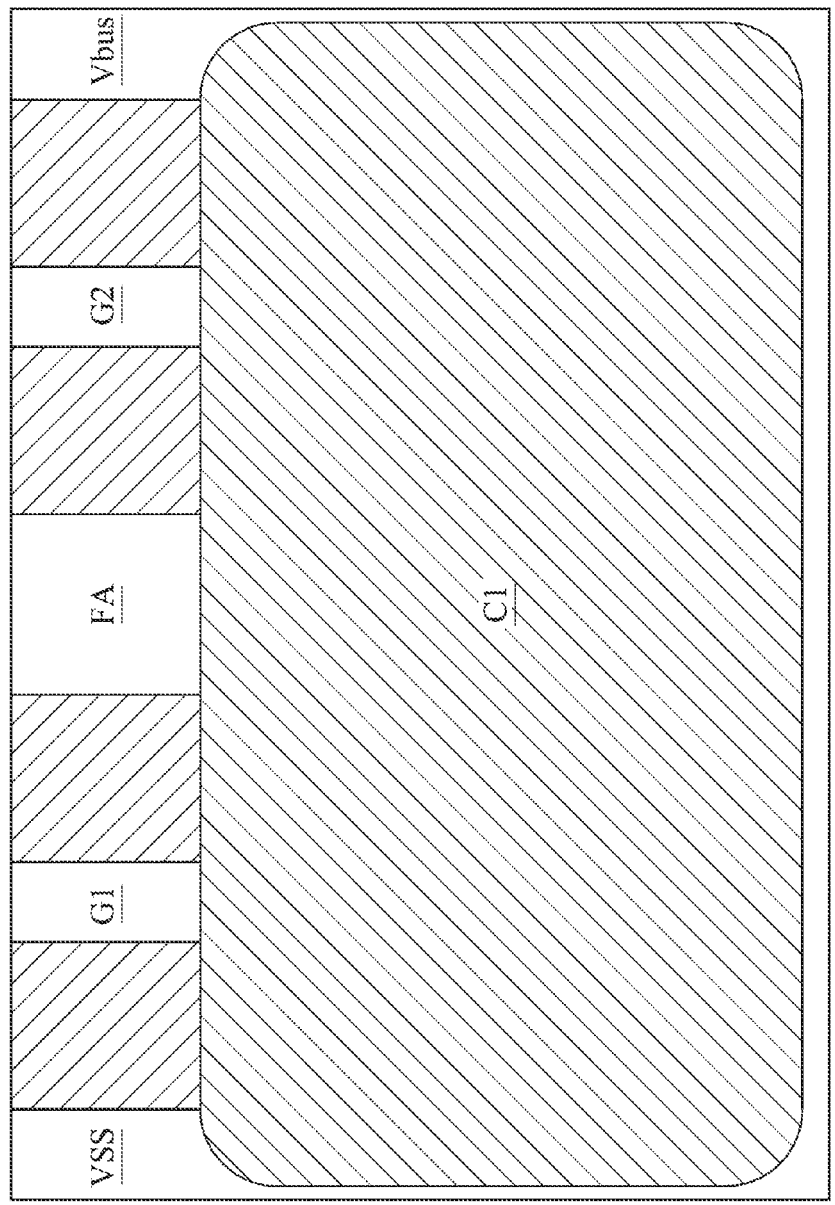
FIG. 6C is a diagram illustrating a top view of a package structure of a power circuit according to FIG. 6A.

Referring to FIG. 6C, FIG. 6C is a diagram illustrating a top view of a package structure of a power circuit 500 according to FIG. 6A.

In an exemplary embodiment, if the input capacitor C1 is directly adjacent to the top side of the chip, then the very small loop effects are achieved. The loop effects may be smaller than the nH level, so as to make the applicable frequency range of the integrated components be upgraded above 1000000 (1M) HZ level.

Figure 6D:
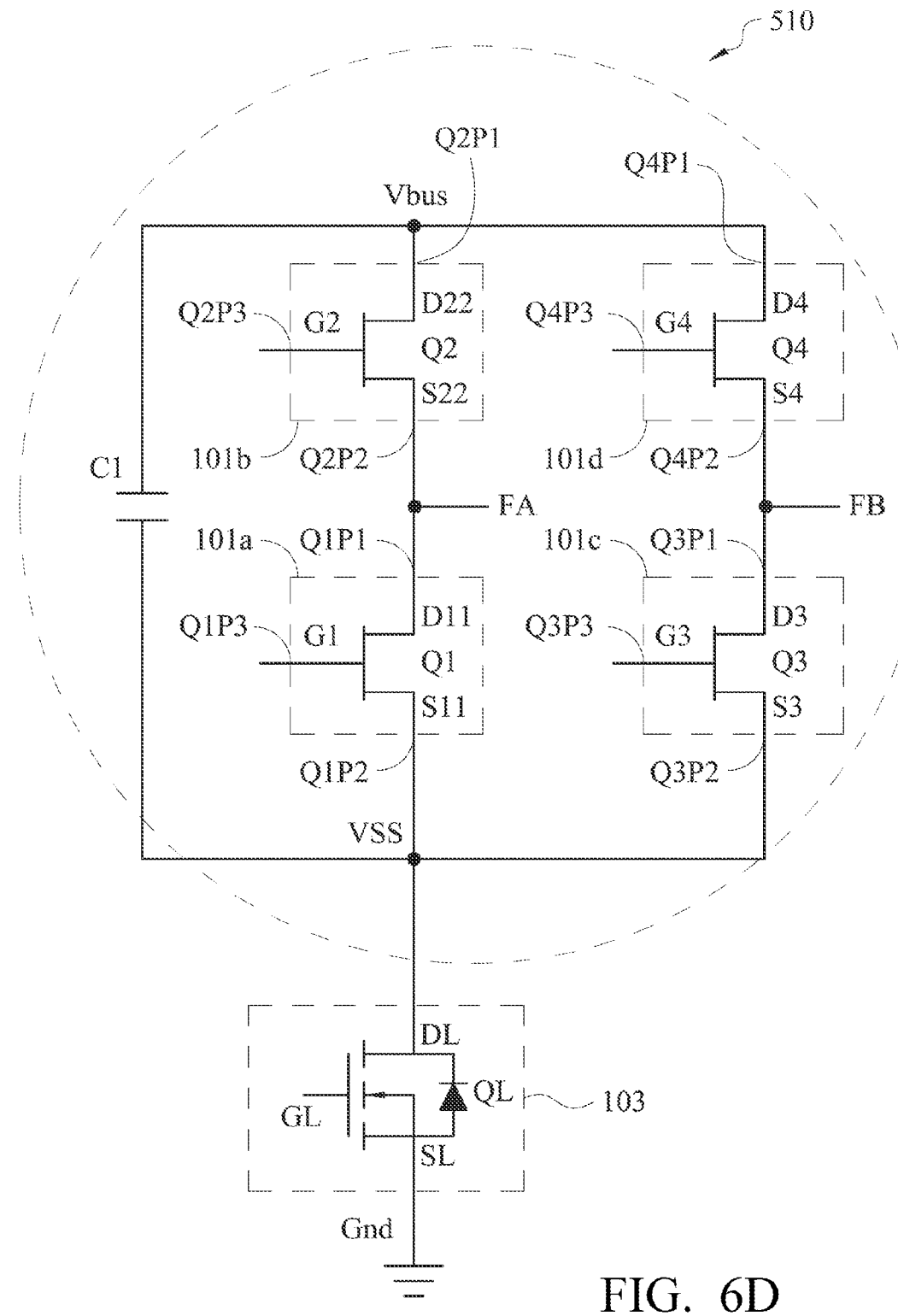
FIG. 6D is illustrating a power circuit according to a thirty-second exemplary embodiment of the present disclosure.

It is easy to be understood that the aforementioned package structures of the present disclosure may simply be expanded up to multiple bridge arm integration or multi-level bridge arm integration. Please Referring to FIG. 6D, FIG. 6D is a power circuit 510 according to a thirty-second exemplary embodiment of the present disclosure. Comparing to the power circuit 500 illustrated in FIG. 6A, the power circuit 510 in FIG. 6D further includes a normally-on switch 101c and a normally-on switch 101d. For the sake of the brevity, only the features that are different to the exemplary embodiment illustrated in FIG. 6A will be described, and the same components and operations are omit.

Specifically, the normally-on switch 101d includes a first end Q4P1, a second end Q4P2 and a control end Q4P3. Also, the first end Q4P1 of the normally-on switch 101d is electrically connected to the first end Q1P1 of the normally-on switch 101b.

The normally-on switch 101c includes a first end Q3P1, a second end Q3P2 and a control end Q3P3. The first end Q3P1 of the normally-on switch 101c is electrically connected to the second end Q4P2 of the normally-on switch 101d. The second end Q3P2 of the normally-on switch 101c is electrically connected to the second end Q2P2 if the normally-on switch 101a.

In other words, FIG. 6D adds a bridge arm formed by the transistor Q3 and the transistor Q4 on the basis of FIG. 6A. The drain of the transistor Q3 is electrically connected to the source of the transistor Q4 at a common node FB, and the drain of the transistor Q4 is electrically connected to the drain of the transistor Q2. The source of the transistor Q3 is electrically connected to the source of the transistor Q1, and the circuit illustrated in FIG. 6D is electrically connected to the external circuits via the common node FB and the common node FA. The four components of the full bridge circuit may also be arranged in a single chip, by using the integrating method similar to that of the single bridge arm; moreover, the principles of the integrating methods of the multiple bridge arm and the multi-level bridge arm are also similar to that of the single bridge arm, and the descriptions thereby are omit for the sake of the brevity.

Figure 6E:
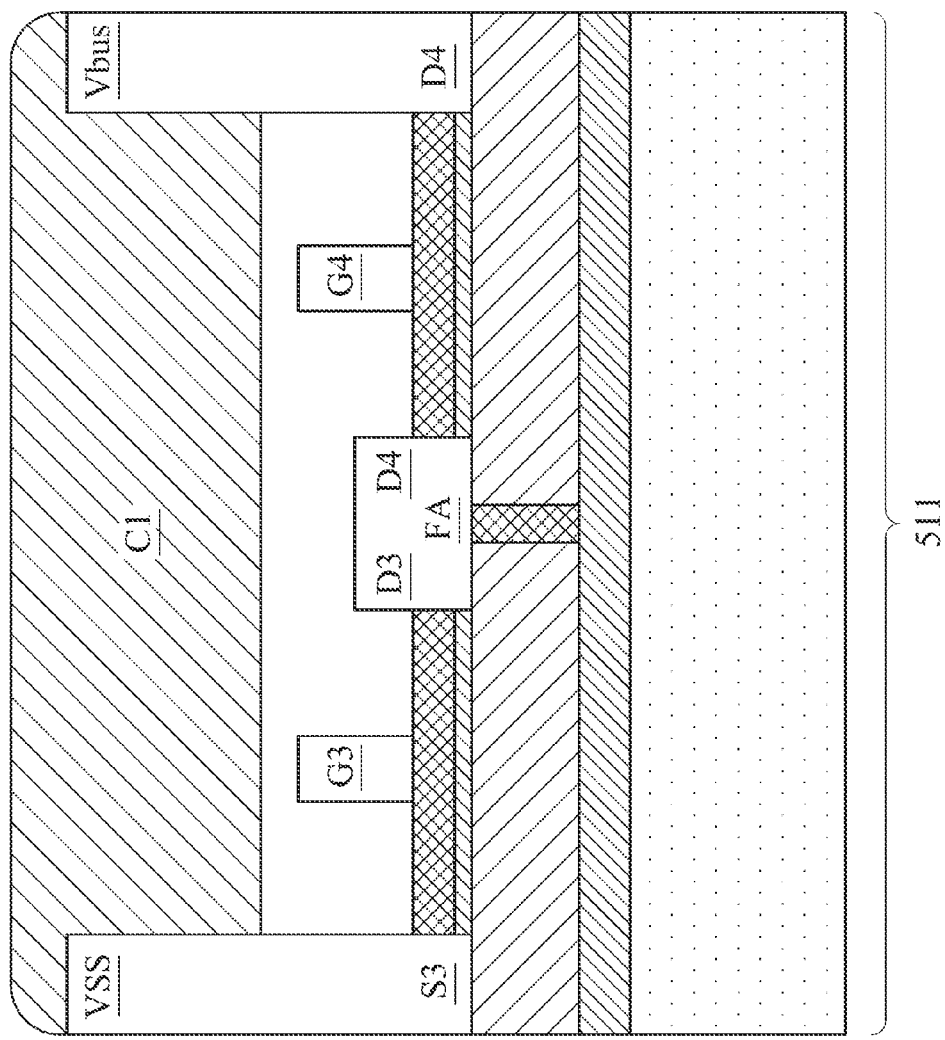
FIG. 6E is illustrating a cross-sectional view of a package structure of a power circuit according to FIG. 6D.

Referring to FIG. 6E, FIG. 6E is illustrating a cross-sectional view of a package structure of a power circuit 510 according to FIG. 6D.

In an exemplary embodiment, the normally-on switch 101c is arranged right next to the normally-on switch 101d, and they are integrated into the integrated circuit chip 511. The control end Q3P3 of the normally-on switch 101c and the control end Q4P3 of the normally-on switch 101d form the eighth pin and the sixth pin, respectively. The common node FB forms a seventh pin. The first end Q4P1 of the normally-on switch 101*d* is electrically connected to the fourth pin, and the second end Q3P2 of the normally-on switch 101*c* is electrically connected to the fifth pin. The aforementioned sixth pin and the eighth pin are used for receiving the third control signal and the fourth control signal, respectively. Moreover, the input capacitor C1 is stacked on the integrated circuit chip 511 and is adjacent to the integrated circuit chip 511.

It is to be noted that the integrated circuit chip 511 includes a Si substrate or a SiC substrate, and the Si substrate or the SiC substrate is electrically connected to the fourth pin, the fifth pin or a ground end; however, it is not meant to limit the present disclosure.

For instance, for making the performances of the wide bandgap materials to be more excellent, in the aforementioned package, the Si substrate (or the Sic substrate) of the integrated circuit chip 511 may be coupled to one of the voltage source Vbus, the voltage source VSS or the ground end (GND), to ensure the optimization of the inner electric field of the wide bandgap materials.

Figure 6F:
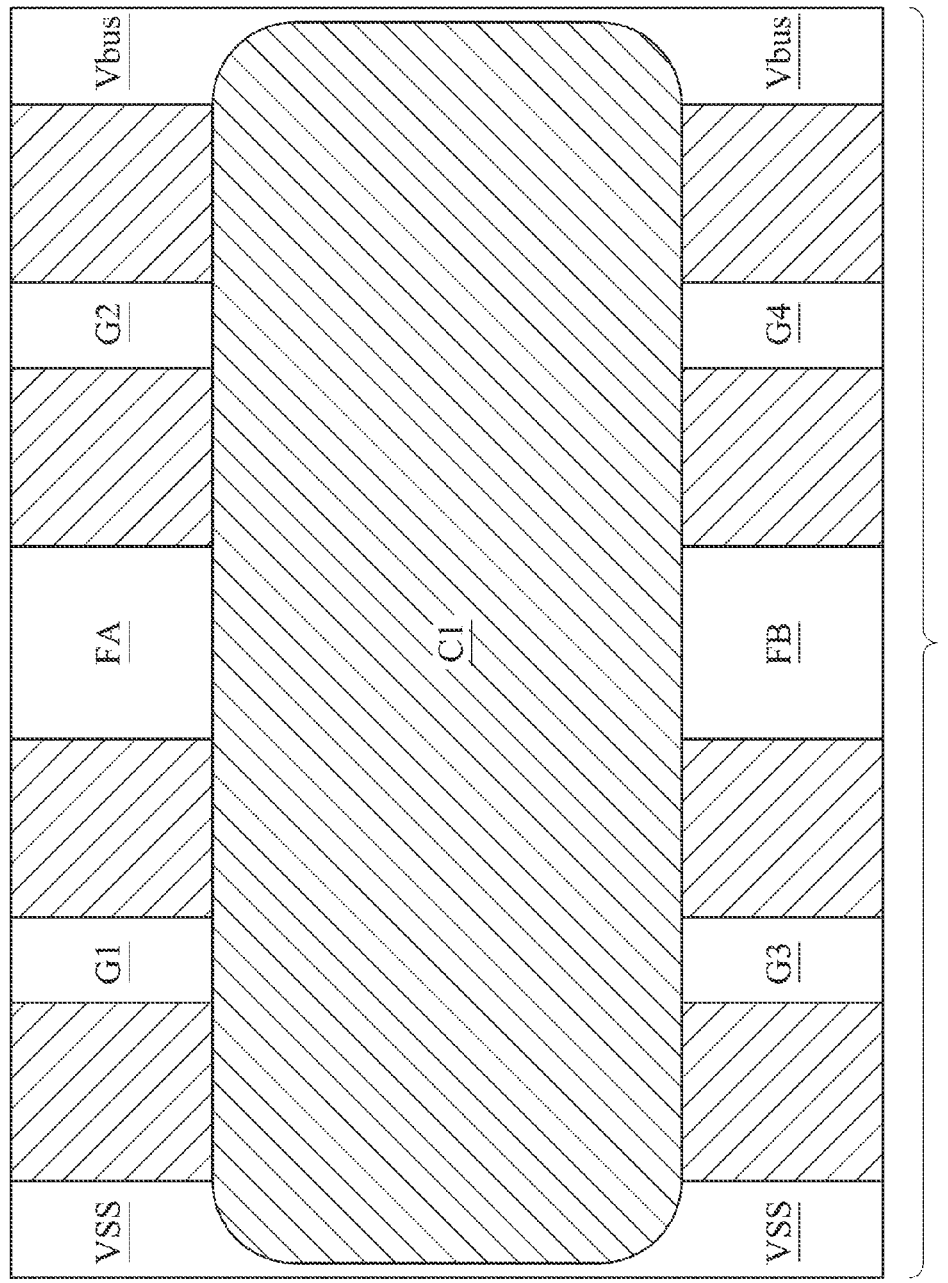
FIG. 6F is a diagram illustrating a top view of a package structure of a power circuit according to FIG. 6D.

Referring to FIG. 6F, FIG. 6F is a diagram illustrating a top view of a package structure of a power circuit 510 according to FIG. 6D. As shown in FIG. 6F, the input capacitor C1 is arranged between the transistor Q1, the transistor Q2, the transistor Q3, and the transistor Q4.

Figure 6G:
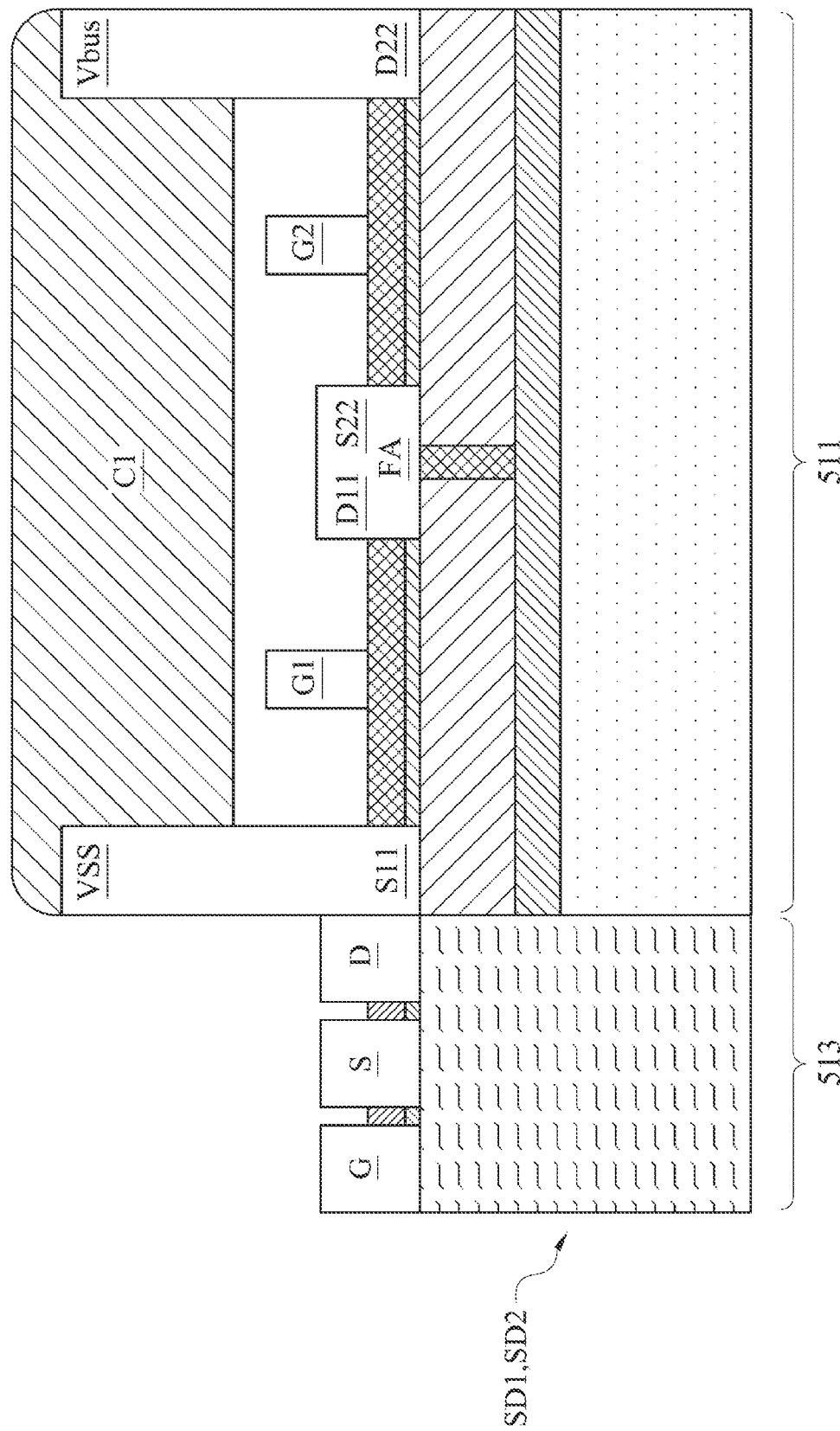
FIG. 6G is illustrating a cross-sectional view of a package structure of a power circuit according to FIG. 6B.

Referring to FIG. 6G, FIG. 6G is a cross-sectional view of a package structure of a power circuit 510 in FIG. 6B.

In this exemplary embodiment, comparing to FIG. 6B, the difference of FIG. 6G is that the package structure herein further includes a normally-off switch SD1 and a normally-off switch SD2. The connection relationship of the normally-off switch SD1 and the normally-off switch SD2 are the same as the aforementioned exemplary embodiment, and the descriptions thereby are omit for the sake of the brevity As shown in FIG. 6G, the normally-off switch SD1 and the normally-off switch SD2 are integrated into the semiconductor structure 513, and the semiconductor structure 513 is integrated into the integrated circuit chip 511.

Thus, by integrating the normally-off switch SD1, the normally-off switch SD2, the transistor Q1, the transistor Q2 and the input capacitor C1 together, better frequency performance is thereby achieved.

Figure 6H:
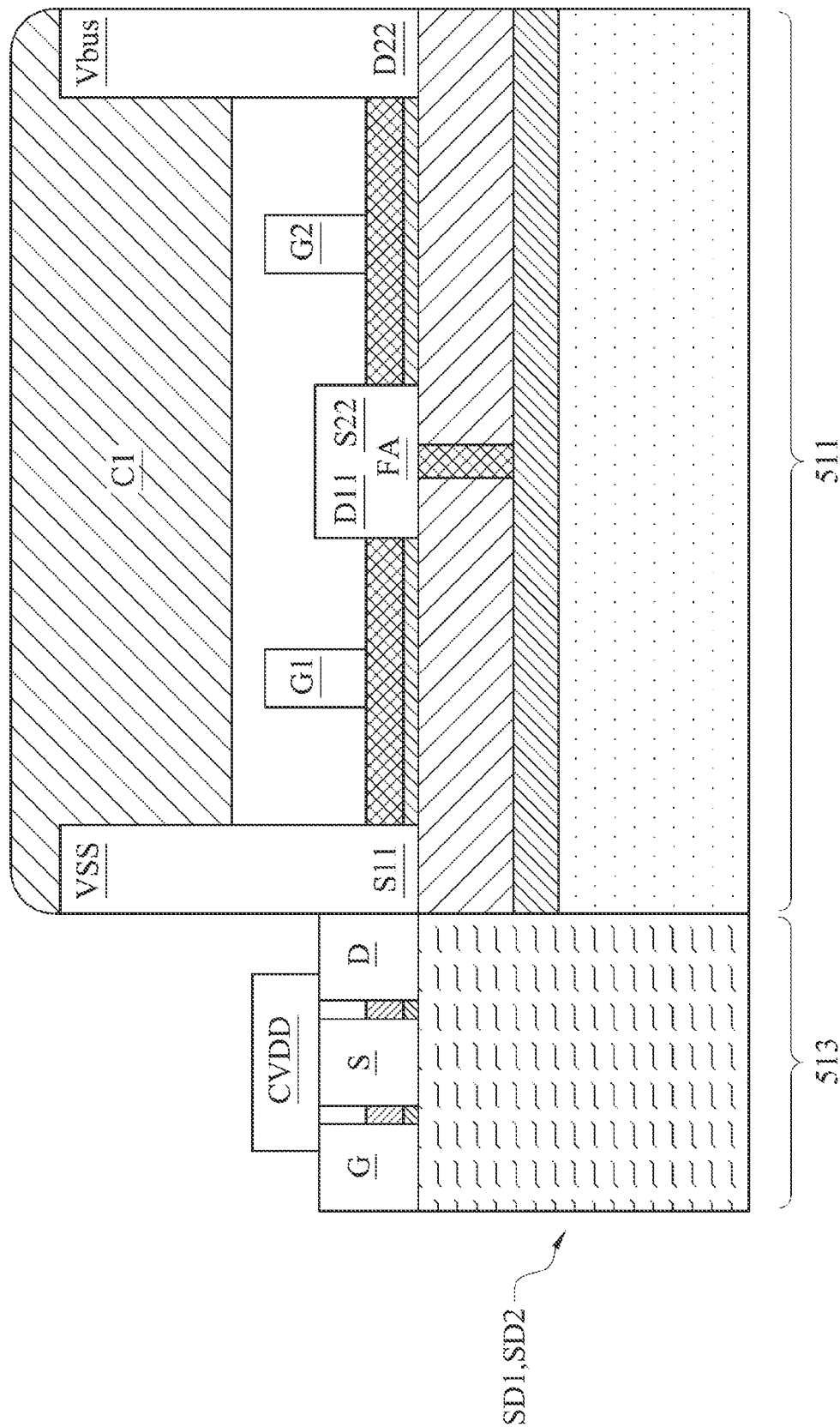
FIG. 6H is illustrating a cross-sectional view of a package structure of a power circuit according to FIG. 6G.

Referring to FIG. 6H, FIG. 6H is further stacking the input capacitor CVDD on the semiconductor structure 513 on the basis of FIG. 6G.

Specifically, comparing to FIG. 6G, the difference to FIG. 6H is that the package structure herein further includes an input capacitor CVDD. By integrating the input capacitor CVDD within the normally-off switch SD1 and the normally-off switch SD2, better frequency performance is thereby achieved.

It is noted that each of the normally-on switch 101*a*, the normally-on switch 101*b*, the normally-on switch 101*c* and the normally-on switch 101*d* can be a SiC JFET or a GaN JFET; however, it is not to limit the present disclosure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations may be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A power circuit, comprising a first quasi-cascade power unit, the first quasi-cascade power unit comprising:
    a normally-on switch, comprising a first end, a second end and a control end;
    a normally-off switch, electrically connected to the normally-on switch in series, comprising a first end, a second end and a control end;
    a control unit, comprising a first end, a second end, a third end and a fourth end, wherein the first end of the control unit is electrically connected to the control end of the normally-off switch, the third end of the control unit is electrically connected to the control end of the normally-on switch;
    a first switch unit, comprising a first end and a second end, wherein the first end of the first switch unit is electrically connected to the control end of the normally-on switch, the second end of the first switch unit is electrically connected to the second end of the normally-off switch; and
    a second switch unit, comprising a first end and a control end, wherein the control end of the second switch unit is electrically connected to the second end of the control unit, the first end of the second switch unit is electrically connected to the second end of the normally-on switch.

2. The power circuit of claim 1, wherein the first switch unit further comprises a control end, the control end of the first switch unit is electrically connected to the first end of the control unit so as to receive an On/Off signal transmitted from the control unit.

3. The power circuit of claim 1, wherein the control unit comprises a first controller and a second controller, the first controller comprises a first end and a second end, the second controller comprises a first end and a second end, the first end and the second end of the first controller are respectively the first end and the fourth end of the control unit, the first end of the second controller is the third end of the control unit, and the second end of the second controller is the second end of the control unit.

4. The power circuit of claim 1, wherein the first switch unit is a diode, the first end of the first switch unit is an anode of the diode, and the second end of the first switch unit is a cathode of the diode.

5. The power circuit of claim 1, further comprising:
    a diode, wherein an anode of the diode is electrically connected to the control unit, and a cathode of the diode is electrically connected to the second end of the normally-on switch.

6. The power circuit of claim 1, wherein the second switch unit further comprises a second control end, the second control end of the second switch unit is electrically connected to the first end of the control unit so as to receive an On/Off signal transmitted from the control unit.

7. The power circuit of claim 6, wherein the second switch unit comprises a first normally-off switch, a second normally-off switch, a third normally-off switch and a voltage source, each of the first normally-off switch, the second normally-off switch and the third normally-off switch comprises a first end, a second end, and a control end, the control end of the third normally-off switch receives the On/Off signal from the first end of the control unit, the control end of the first normally-off switch and the control end of the second normally-off switch receive a driving signal from the second end of the control unit, wherein the negative electrode of the voltage source is electrically connected to the third end of the control unit, the positive electrode of the voltage source is electrically connected to the second end of the first normally-off switch.

8. The power circuit of claim 1, wherein the second switch unit comprises a first normally-off switch, a second normally-off switch, a resistor, a capacitor and a diode, each of the first normally-off switch and the second normally-off switch respectively comprises a first end, a second end, and a control end, the resistor is electrically connected between the second end of the control unit and the third end of the control unit, the control end of the first normally-off switch and the control end of the second normally-off switch receive a driving signal from the second end of the control unit, the second end of the first normally-off switch is electrically connected to a cathode of the diode, the capacitor is electrically connected between the third end of the control unit and the cathode of the diode, and an anode of the diode is electrically connected to the voltage source.

9. The power circuit of claim 1, wherein the second switch unit is integrated into the control unit.

10. The power circuit of claim 1, further comprising:
a diode, electrically connected between the first end of the normally-on switch and the second end of the normally-on switch, wherein an anode of the diode is electrically connected to the second end of the normally-on switch, and a cathode of the diode is electrically connected to the first end of the normally-on switch.

11. The power circuit of claim 1, wherein the control unit comprises a fifth end, the fifth end is electrically connected to the first end of the normally-on switch so as to detect a current direction of the normally-on switch.

12. The power circuit of claim 1, further comprising a second normally-on switch, wherein the second normally-on switch is electrically connected to the first quasi-cascade power unit in series so as to form a haft-bridge, the haft-bridge and a voltage source are electrically connected in parallel, the second normally-on switch and the first quasi-cascade power unit are electrically connected to a common node in series, wherein the common node is an output end of the haft-bridge.

13. The power circuit of claim 1, further comprising a second quasi-cascade power unit, wherein the second quasi-cascade power unit is electrically connected to the first quasi-cascade power unit so as to form a haft-bridge, the half-bridge and a voltage source are connected in parallel, the first quasi-cascade power unit and the second quasi-cascade power unit are electrically connected to a common node in series, wherein the common node is an output end of the half-bridge.

14. The power circuit of claims 1, wherein when the normally-off switch receives a control signal and thus turns on, the normally-on switch receives a high-frequency switching signal and operates in a high-frequency switching state.

15. The power circuit of claims 1, wherein the normally-off switch has a first withstand voltage, the normally-on switch has a second withstand voltage, the first withstand voltage of the normally-off switch is lower than 50% of the second withstand voltage of the normally-on switch.

16. The power circuit of claims 1, wherein the normally-on switch comprises a SiC Junction Field-Effect Transistor (SiC JFET) or a GaN Junction Field-Effect Transistor (GaN JFET).

17. The power circuit of claims 1, wherein the normally-off switch comprises a Metal-Oxide-Semiconductor (MOS) transistor or an Isolated Gate Bipolar Transistor (IGBT).

18. The power circuit of claims 1, wherein the first quasi-cascade power unit is applied to one of the series resonant LLC circuit, the totem-pole Power Factor Correction (PFC) circuit in Continuous Current Mode (CCM), the boost circuit or the buck circuit.

19. A control method, applied to a quasi-cascade power unit, the quasi-cascade power unit comprising a control unit, a normally-on switch and a normally-off switch, wherein the normally-on switch and the normally-off switch are electrically connected in series, the control unit is electrically connected to the normally-on switch and the normally-off switch, the control method comprises:
during a first period, making the normally-off switch turn off and making the normally-on switch turn on;
during a second period, making the normally-off switch and the normally-on switch turn off;
during a third period, making the normally-off switch turn on and making the normally-on switch work in a high-frequency switching state;
during a fourth period, making the normally-off switch and the normally-on switch turn off; and
during a fifth period, making the normally-off switch turn off and making the normally-on switch turn on.

20. The control method of claim 19, wherein the quasi-cascade power unit further comprises a first voltage source, wherein in the first period the control method further comprises the following steps:
turning off the first voltage source, and controlling the normally-on switch and the normally-off switch according to a control signal having a low voltage level; and
boosting a voltage level of the first voltage source from the low voltage level to a first voltage value so as to reduce a driving voltage of the normally-on switch to a driving voltage threshold value of the normally-on switch.

21. The control method of claim 19, wherein the quasi-cascade power unit further comprises a first voltage source and a second voltage source, the second voltage source provides an operating voltage to the control unit, wherein in the second period, the control method further comprises the following steps:
boosting a voltage level of the first voltage source from a first voltage value to a second voltage value, making a driving voltage of the normally-on switch keep at a driving voltage threshold value of the normally-on switch;
keeping the voltage level of the first voltage source at the second voltage value, making the driving voltage of the normally-on switch keep at the driving voltage threshold value of the normally-on switch;
boosting the second voltage source to a working voltage value of the control unit;
keeping the voltage level of the first voltage source at the second voltage value, keeping the working voltage value of the control unit, keeping the driving voltage of the normally-on switch at the driving voltage threshold value of the normally-on switch; and
keeping the voltage level of the first voltage source at the second voltage value, keeping the working voltage value of the control unit, and reducing the driving voltage of the normally-on switch.

22. The control method of claim 19, wherein the quasi-cascade power unit further comprises a first voltage source, wherein in the third period, the control method further comprises the following steps:
outputting a control signal having a high voltage level to a control end of the normally-off switch by the control unit so as to make the normally-off switch turn on;
outputting the control signal having the high voltage level to the control end of the normally-off switch by the control unit, and outputting a high frequency switch driving signal to a control end of the normally-on switch; and
reducing a voltage level of the first voltage source to an under-voltage protection threshold value.

23. The control method of claim 19, wherein the a quasi-cascade power unit further comprises a first voltage source and a second voltage source, the second voltage source provides an operating voltage to the control unit, wherein in the fourth period, the control method further comprises the following steps:
reducing a voltage value of the first voltage source from an under-voltage protection threshold value to a third voltage value;
outputting a control signal having a low voltage level to a control end of the normally-off switch by the control unit so as to make the normally-off switch turn off;
reducing the second voltage source from a working voltage value of the control unit to make a driving voltage of the normally-on switch boost to a driving voltage threshold value of the normally-on switch; and
reducing the voltage value of the first voltage source from the third voltage value to a first voltage value so as to keep the driving voltage of the normally-on switch at the driving voltage threshold value of the normally-on switch.

24. The control method of claim 19, wherein the quasi-cascade power unit further comprises a first voltage source, wherein in the fifth period, the control method further comprises the following steps:
reducing the first voltage source from a first voltage value, making a driving voltage of the normally-on switch boost from a driving voltage threshold value; and
turning off the first voltage source, and controlling the normally-on switch and the normally-off switch by a control signal having a low voltage level.

25. The control method of claim 19, wherein the quasi-cascade power unit is electrically connected to a second normally-on switch in series so as to form a half-bridge circuit, the control unit is electrically connected to the normally-on switch, the normally-off switch of the quasi-cascade power unit and the second normally-on switch, wherein the control method further comprises the following steps:
during the first period, making the second normally-on switch turn on;
during the second period, from a third time point to a sixth time point, making the second normally-on switch turn on, and from the sixth time point to seventh time point, making the second normally-on switch turn off;
during the third period, making the second normally-on switch work in a high-frequency switching state;
during the fourth period, from a ninth time point to a tenth time point, making the second normally-on switch turn off, and from the tenth time point to an eleventh time point, making the second normally-on switch turn on; and
during the fifth period, making the second normally-on switch turn on.

26. A power system, comprising:
a conversion unit, comprising an input end and an output end, wherein the input end of the conversion unit is electrically connected to an input power source of the power system; and
a voltage adjusting unit, comprising an input end and an output end, wherein the input end of the voltage adjusting unit is electrically connected to the output end of the conversion unit, the output end of the voltage adjusting unit is electrically connected to a load;
wherein the conversion unit comprises a first quasi-cascade power unit, the first quasi-cascade power unit comprises:
a first normally-on switch, comprising a first end, a second end, and a control end;
a first normally-off switch, electrically connected to the normally-on switch in series, comprising a first end, a second end, and a control end; and
a control unit, comprising a first end, a second end, a third end, and a fourth end which control the first normally-on switch and the first normally-off switch, respectively, wherein the first end of the control unit is electrically connected to the control end of the normally-off switch, the third end of the control unit is electrically connected to the control end of the normally-on switch.

27. The power system of claim 26, wherein the first quasi-cascade power unit further comprises a capacitor, wherein the capacitor and the normally-off switch are electrically connected in parallel.

28. The power system of claim 26, wherein the first quasi-cascade power unit further comprises a diode, wherein a cathode of the diode is electrically connected to the second end of the first normally-off switch.

29. The power system of claim 28, wherein the voltage adjusting unit comprises a capacitor and an inductor, the capacitor and the load are connected in parallel, the inductor is electrically connected between the capacitor and the second end of the first normally-off switch.

30. The power system of claim 26, wherein the conversion unit further comprises a second quasi-cascade power unit, wherein the first quasi-cascade power unit is electrically connected to the second quasi-cascade power unit in series, the second quasi-cascade power unit comprises a second normally-on switch and a second normally-off switch, the first quasi-cascade power unit comprises a first capacitor, the second quasi-cascade power unit comprises a second capacitor, the first capacitor and the first normally-off switch are electrically connected in parallel, the second capacitor and the second normally-off switch are electrically connected in parallel.

31. The power system of claim 26, wherein the conversion unit further comprises a first capacitor, an input capacitor and a second quasi-cascade power unit, the second quasi-cascade power unit comprises a second normally-on switch and a second normally-off switch, wherein the first quasi-cascade power unit and the second quasi-cascade power unit are electrically connected in series, the second quasi-cascade power unit comprises a second capacitor, the second capacitor and the second normally-off switch are electrically connected in parallel, the first capacitor is electrically connected between the first end of the first normally-off switch and the first end of the second normally-on switch, the input capacitor is electrically connected between the second end of the first normally-off switch and the first end of the second normally-on switch.

32. The power system of claim 26, wherein the conversion unit further comprises a second normally-on switch and a capacitor, the second normally-on switch and the first quasi-cascade power unit are electrically connected in series so as to form a haft-bridge circuit with the first quasi-cascade power unit, the capacitor and the first normally-off switch of the first quasi-cascade power unit are electrically connected in parallel.

33. The power system of claim 26, wherein the conversion unit further comprises a second normally-on switch, an input capacitor, and a capacitor, the second normally-on switch and the first quasi-cascade power unit are electrically connect in series so as to form a half-bridge circuit with the first quasi-cascade power unit, the capacitor is electrically connected between the first end of the first normally-off switch and a first end of the second normally-on switch, the input capacitor is electrically connected between the second end of the first normally-off switch and the first end of the second normally-on switch.

34. The power system of claim 33, wherein the conversion unit further comprises a zener clamp device, the zener clamp device is connected to the first normally-off switch in parallel.

35. The power system of claim 33, wherein the conversion unit further comprises a zener clamp device, the zener clamp device is electrically connected between the control end of the first normally-off switch and the first end of the first normally-off switch.

36. The power system of claim 35, wherein the conversion unit further comprises a second capacitor, the second capacitor is electrically connected to the first end and the second end of the first normally-off switch in parallel.

37. The power system of claim 33, wherein the conversion unit further comprises a switch, the switch is electrically connected between the control end of the second normally-on switch and a voltage source.

38. The power system of claim 33, wherein the conversion unit further comprises a third normally-on switch and a fourth normally-on switch, the third normally-on switch and the fourth normally-on switch are electrically connected in series, a second end of the third normally-on switch is electrically connected to the second end of the first normally-on switch, and a first end of the fourth normally-on switch is electrically connected to the first end of the second normally-on switch.

39. The power system of claim 26, wherein the control unit comprises a first controller and a second controller, the first controller comprises a first end and a second end, the second controller comprises a first end and a second end, the first end and the second end of the first controller are the first end and the fourth end of the control unit, respectively, and the first end and the second end of the second controller are the third end and the second end of the control unit, respectively.

40. The power system of claim 26, wherein the normally-off switch has a first withstand voltage, the normally-on switch has a second withstand voltage, and the first withstand voltage of the normally-off switch is lower than 50% of the second withstand voltage of the normally-on switch.

41. A package structure of a power circuit, comprising:
a first normally-off switch, comprising a first end, a second end, and a control end, wherein the first end of the normally-off switch forms a first pin;
a second normally-off switch, comprising a first end, a second end, and a control end, wherein the second end of the second normally-off switch is electrically connected to the first end of the first normally-off switch, the control end of the second normally-off switch is electrically connected to the control end of the first normally-off switch to form a second pin, and the first end of the second normally-off switch forms a third pin; and
a normally-on switch, comprising a first end, a second end, and a control end, wherein the control end of the normally-on switch is electrically connected to the first end of the second normally-off switch, the second end of the normally-on switch is electrically connected to the second end of the second normally-off switch to form a fourth pin, and the first end of the normally-on switch forms a fifth pin;
wherein the first pin, the second pin and the third pin respectively receives a control signal, and the fourth pin and the fifth pin are connected to an external circuit.

42. The package structure of claim 41, wherein the first normally-off switch and the normally-off switch are integrated into a first chip, and the normally-on switch is integrated into a second chip.

43. The package structure of claim 42, wherein the first chip is stacked on the second chip.

44. The package structure of claim 43, further comprising a capacitor, wherein the capacitor is stacked on the first chip.

45. The package structure of claim 42, further comprising a capacitor, wherein the capacitor is stacked on the first chip.

46. The package structure of claim 41, wherein the first normally-off switch and the second normally-off switch are integrated into a semiconductor structure, and the semiconductor structure and the normally-on switch are integrated into an integrated circuit chip.

47. The package structure of claim 46, wherein the semiconductor structure comprises a SiC transistor, a Si transistor, or a GaN transistor.

48. The package structure of claim 46, further comprising a capacitor, wherein the capacitor is stacked on the semiconductor structure.

49. The package structure of claim 41, wherein the first normally-off switch and the second normally-off switch form a totem pole structure.

50. A package structure of a power circuit, comprising:
an integrated circuit chip;
a first normally-on switch, comprising a first end, a second end, and a control end, wherein the control end of the first normally-on switch forms a first pin;
a second normally-on switch, comprising a first end, a second end, and a control end, wherein the first end of the second normally-on switch is electrically connected to the second end of the first normally-on switch to form a second pin, and the control end of the second normally-on switch forms a third pin; and
a capacitor, comprising a first end and a second end, wherein the first end of the capacitor is electrically connected to the first end of the first normally-on switch to form a fourth pin, and the second end of the capacitor is electrically connected to the second end of the second normally-on switch to form a fifth pin;
wherein the first normally-on switch and the second normally-on switch are adjacent to each other and are integrated into the integrated circuit chip, the first pin and third pin receive a first control signal and a second control signal, respectively, and the second pin, the fourth pin and the fifth pin are connected to an external circuit.

51. The package structure of claim 50, wherein the capacitor is stacked on the integrated circuit chip.

52. The package structure of claim 50, further comprising a third normally-on switch, comprising a first end, a second end, and a control end, wherein the control end of the third normally-on switch forms a sixth pin, and the first end of the third normally-on switch is electrically connected to the fourth pin;
a fourth normally-on switch, comprising a first end, a second end, and a control end, wherein the first end of the fourth normally-on switch is electrically connected to the second end of the third normally-on switch to form a seventh pin, the second end of the fourth normally-on switch is electrically connected to the fifth pin, and the control end of the fourth normally-on switch forms an eighth pin;
wherein the third normally-on switch and the fourth normally-on switch are formed within the integrated circuit chip, and the sixth pin and the eighth pin receive a third control signal and a fourth control signal, respectively.

53. The package structure of claim 52, wherein the third normally-on switch and the fourth normally-on switch are integrated into the integrated circuit chip.

54. The package structure of claim 53, wherein the capacitor is stacked on the integrated circuit chip.

55. The package structure of claim 50, further comprising a first normally-off switch and a second normally-off switch, wherein the first normally-off switch and the second normally-off switch are integrated into a semiconductor structure, and the semiconductor structure is integrated into the integrated circuit chip.

56. The package structure of claim 55, further comprising a capacitor, wherein the capacitor is stacked on the semiconductor structure.

57. The package structure of claim 55, wherein the first normally-off switch and the second normally-off switch form a totem pole structure.

58. The package structure of claim 50, wherein the integrated circuit chip comprises a Si substrate or a SiC substrate.

59. The package structure of claim 58, wherein the Si substrate or the SiC substrate is electrically connected to the fourth pin, the fifth pin, or a ground end.

* * * * *